United States Patent
Nagashima et al.

(10) Patent No.: US 10,879,261 B2
(45) Date of Patent: Dec. 29, 2020

(54) SEMICONDUCTOR MEMORY WITH STACKED MEMORY PILLARS

(71) Applicant: TOSHIBA MEMORY CORPORATION, Tokyo (JP)

(72) Inventors: Satoshi Nagashima, Yokkaichi Mie (JP); Fumitaka Arai, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/297,079

(22) Filed: Mar. 8, 2019

(65) Prior Publication Data
US 2020/0098784 A1   Mar. 26, 2020

(30) Foreign Application Priority Data
Sep. 20, 2018 (JP) ................. 2018-176308

(51) Int. Cl.
*H01L 27/115* (2017.01)
*H01L 29/40* (2006.01)
(Continued)

(52) U.S. Cl.
CPC .. *H01L 27/11582* (2013.01); *H01L 21/31116* (2013.01); *H01L 21/76816* (2013.01); *H01L 21/76877* (2013.01); *H01L 23/5283* (2013.01); *H01L 27/1157* (2013.01); *H01L 27/11524* (2013.01); *H01L 27/11556* (2013.01); *H01L 29/40114* (2019.08); *H01L 29/40117* (2019.08)

(58) Field of Classification Search
CPC ......... H01L 27/11582; H01L 27/11524; H01L 27/11556; H01L 27/1157; H01L 29/40114; H01L 29/40117; H01L 23/5283
See application file for complete search history.

(56) References Cited

U.S. PATENT DOCUMENTS 7,330,367 B2 * 2/2008 Nejad .................... B82Y 10/00
365/63
8,487,365 B2 * 7/2013 Sasaki ............... H01L 27/11578
257/324

(Continued)

FOREIGN PATENT DOCUMENTS

| JP | 2010-027870 A | 2/2010 |
|---|---|---|
| JP | 2014-187191 A | 10/2014 |
| JP | 5752660 B2 | 7/2015 |

*Primary Examiner* — Ida M Soward
(74) *Attorney, Agent, or Firm* — Foley & Lardner LLP

(57) ABSTRACT

According to one embodiment, a semiconductor memory includes: a first member extending in a first direction perpendicular to a surface of a substrate, and including a first semiconductor layer; first and second interconnects extending in a second direction parallel to the surface of the substrate, the second interconnect neighboring the first interconnect in a third direction; a second member extending in the first direction and above the first member, the second member including a second semiconductor layer; third and a fourth interconnects extending in the second direction, the fourth interconnect neighboring the third interconnect in the third direction; and a third semiconductor layer between the first and the second members, the third semiconductor layer being continuous with the first and the second semiconductor layers.

20 Claims, 47 Drawing Sheets

(51) Int. Cl.
  *H01L 23/52*     (2006.01)
  *H01L 27/11582*  (2017.01)
  *H01L 27/11524*  (2017.01)
  *H01L 27/11556*  (2017.01)
  *H01L 27/1157*   (2017.01)
  *H01L 21/768*    (2006.01)
  *H01L 21/311*    (2006.01)
  *H01L 23/528*    (2006.01)
  *H01L 21/28*     (2006.01)

(56) References Cited

U.S. PATENT DOCUMENTS

| | | | |
|---|---|---|---|
| 8,541,768 B2 * | 9/2013 | Shima | H01L 45/1233 |
| | | | 257/4 |
| 8,643,081 B2 * | 2/2014 | Fujiwara | H01L 29/792 |
| | | | 257/321 |
| 8,730,717 B2 * | 5/2014 | Hanzawa | G11C 13/0004 |
| | | | 365/100 |
| 8,824,184 B2 * | 9/2014 | Baek | G11C 7/18 |
| | | | 365/51 |
| 8,848,440 B2 * | 9/2014 | Yasuda | G11C 16/10 |
| | | | 365/185.03 |
| 8,946,809 B2 | 2/2015 | Takamura et al. | |
| 9,070,589 B2 * | 6/2015 | Kawai | H01L 27/1157 |
| 9,236,395 B1 | 1/2016 | Sasaki | |
| 9,318,602 B2 | 4/2016 | Taniguchi | |
| 9,490,262 B1 * | 11/2016 | Pang | H01L 27/11582 |
| 9,496,272 B2 * | 11/2016 | Cernea | H01L 27/11556 |
| 9,773,555 B2 * | 9/2017 | Bushnaq | G11C 16/06 |
| 9,922,717 B1 * | 3/2018 | Maejima | G11C 16/32 |
| 10,134,750 B2 * | 11/2018 | Kato | H01L 27/11556 |
| 10,242,992 B2 * | 3/2019 | Sakamoto | H01L 29/7926 |
| 10,325,656 B2 * | 6/2019 | Bushnaq | H01L 27/11582 |
| 10,431,311 B2 * | 10/2019 | Izumi | G11C 16/08 |
| 2010/0013049 A1 | 1/2010 | Tanaka et al. | |
| 2011/0306195 A1 | 12/2011 | Kim | |
| 2013/0092894 A1 * | 4/2013 | Sills | H01L 45/085 |
| | | | 257/4 |
| 2014/0264525 A1 | 9/2014 | Takahashi | |
| 2017/0309641 A1 * | 10/2017 | Tanzawa | G11C 8/10 |
| 2018/0240527 A1 * | 8/2018 | Zhang | G11C 16/3427 |
| 2019/0043807 A1 * | 2/2019 | Redaelli | H01L 21/32053 |
| 2019/0214399 A1 * | 7/2019 | Simsek-Ege | H01L 27/11524 |
| 2019/0296117 A1 * | 9/2019 | Ishiduki | H01L 29/42344 |

* cited by examiner

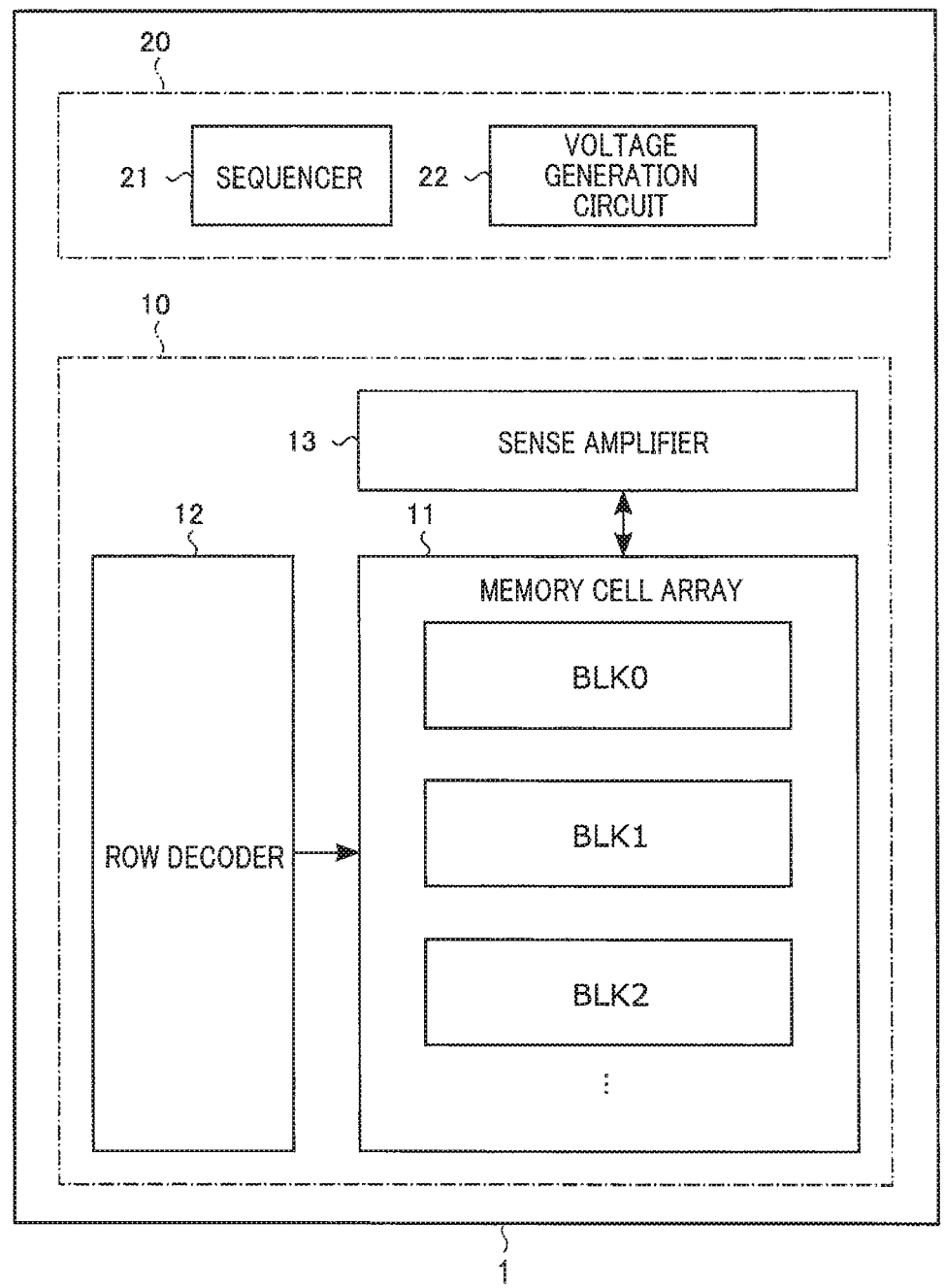
F I G. 1

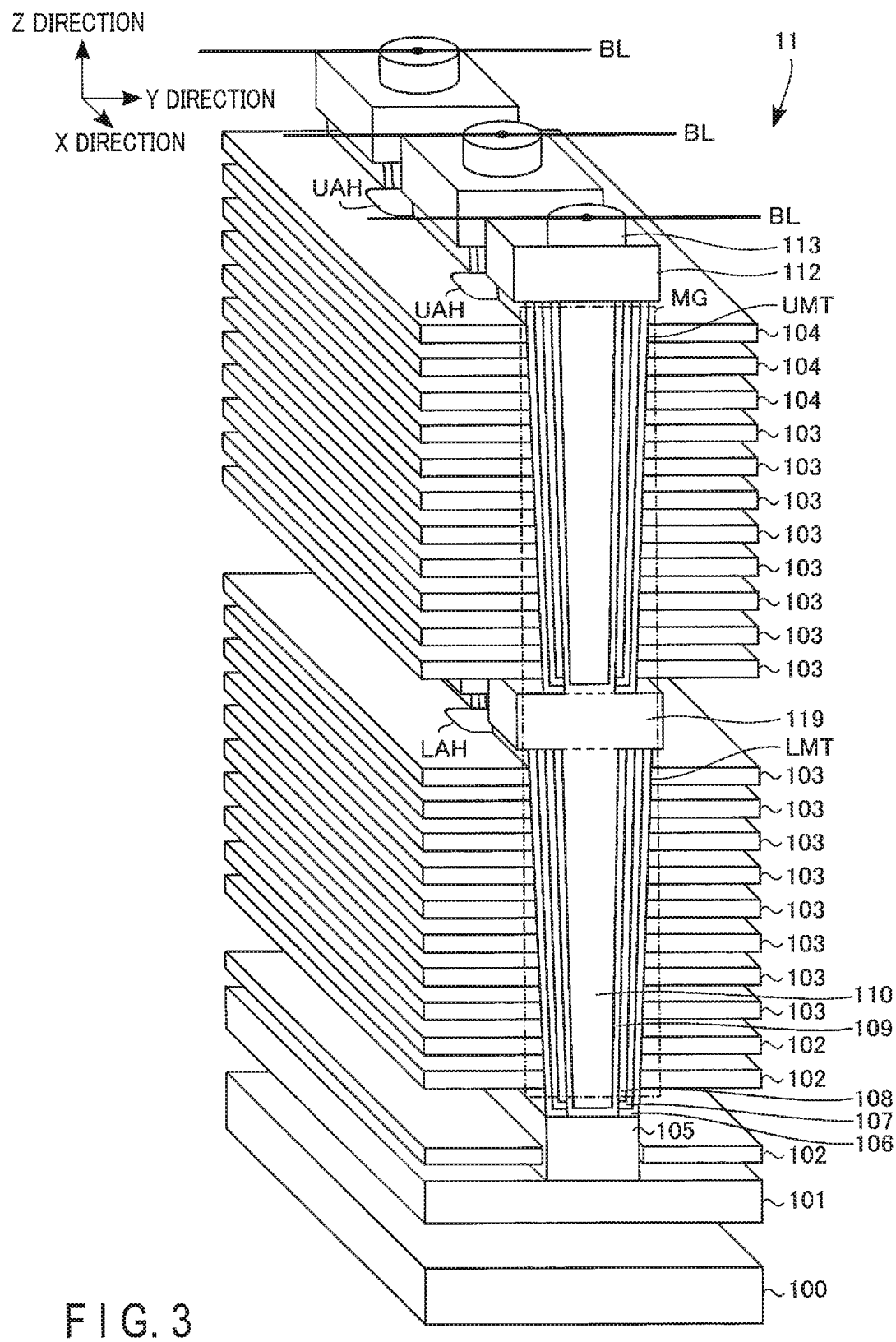
F I G. 3

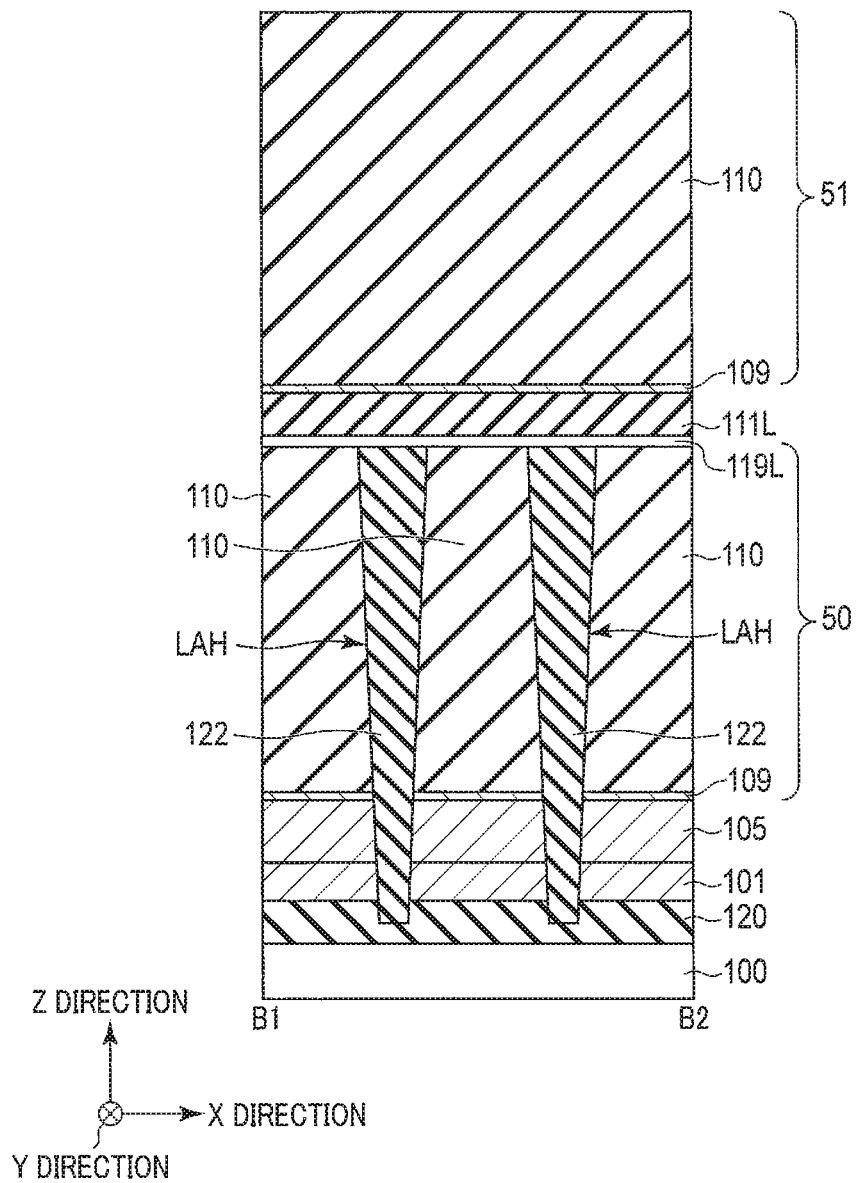
F I G. 25

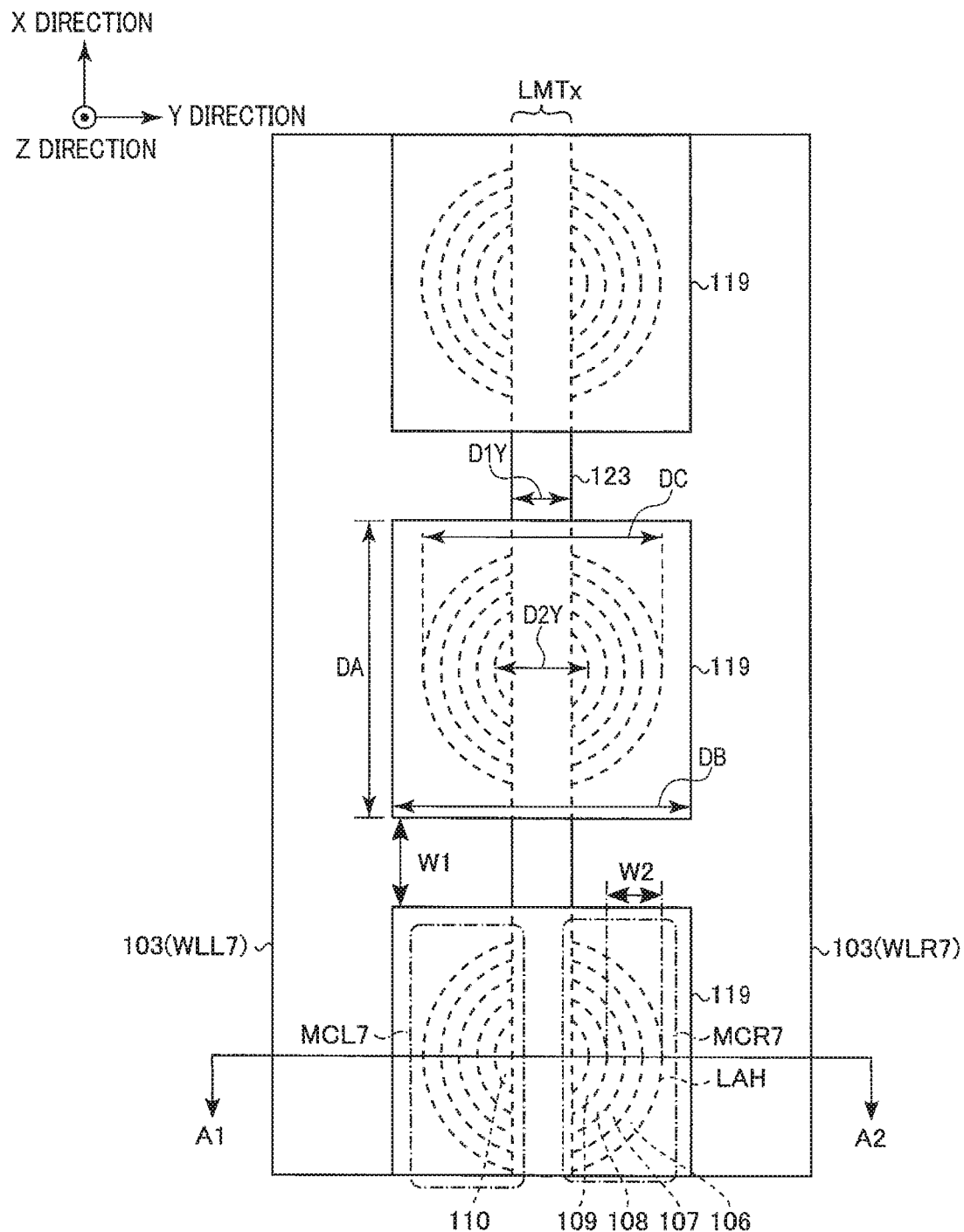
F I G. 31

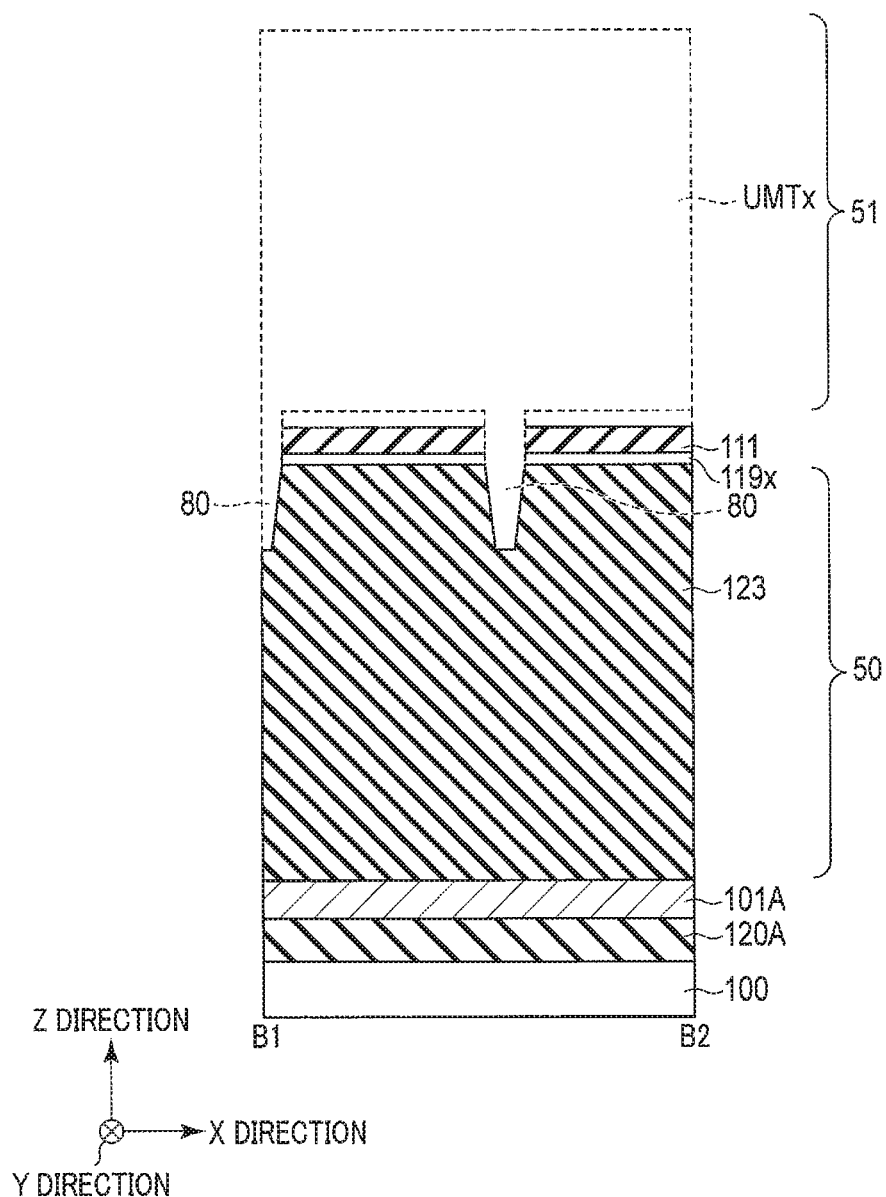
F I G. 39

SEMICONDUCTOR MEMORY WITH STACKED MEMORY PILLARS

CROSS-REFERENCE TO RELATED APPLICATIONS

This application is based upon and claims the benefit of priority from Japanese Patent Application No. 2018-176308, filed Sep. 20, 2018, the entire contents of which are incorporated herein by reference.

FIELD

Embodiments described herein relate generally to a semiconductor memory.

BACKGROUND

Research and development of semiconductor memories having three-dimensional structures have been promoted.

BRIEF DESCRIPTION OF THE DRAWINGS

FIG. 1 is a view illustrating an example of an entire configuration of a semiconductor memory according to a first embodiment.

FIG. 3 is a bird's-eye view illustrating a configuration example of the memory cell array of the semiconductor memory of the first embodiment.

FIG. 23, FIG. 24, FIG. 25, FIG. 26, FIG. 27, FIG. 28, FIG. 29 and FIG. 30 are views illustrating fabrication steps of the semiconductor memory of the second embodiment.

FIG. 31 is a view illustrating a configuration example of a semiconductor memory according to a third embodiment.

FIG. 32, FIG. 33, FIG. 34, FIG. 35, FIG. 6, FIG. 37, FIG. 38, FIG. 39, FIG. 40, FIG. 41, FIG. 42, FIG. 43, FIG. 44, FIG. 45, FIG. 46 and FIG. 47 are views illustrating fabrication steps of the semiconductor memory of the third embodiment.

DETAILED DESCRIPTION

Figure 2:
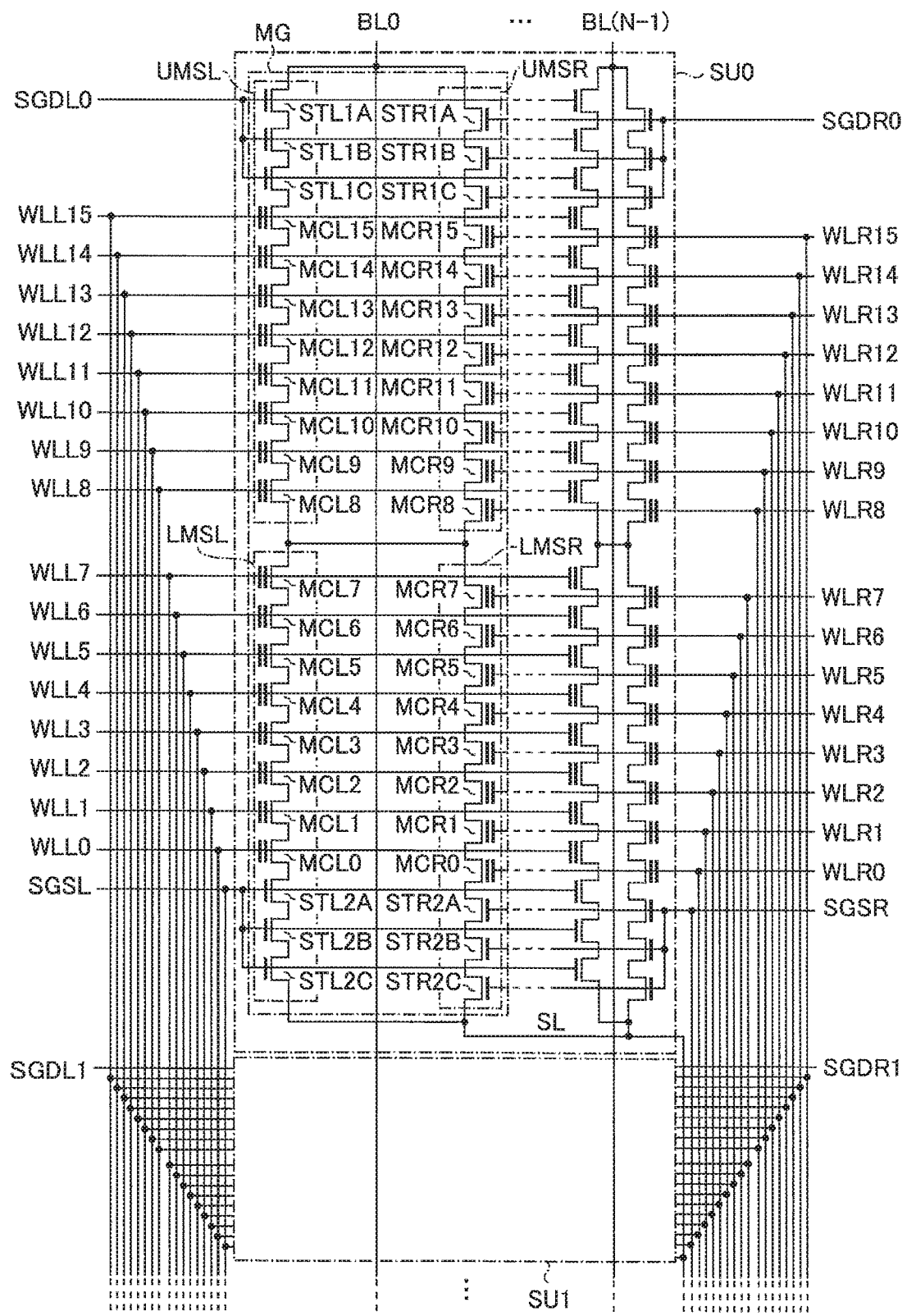
FIG. 2 is a view illustrating a configuration example of a memory cell array of the semiconductor memory of the first embodiment.

Referring to FIG. 1 to FIG. 47, resistance change type memories according to embodiments will be described.

Hereinafter, the embodiments will be described in detail with reference to the accompanying drawings. In the description below, elements having the same function and structure are denoted by the same reference sign.

In addition, in each of the embodiments below, when structural elements (e.g. word lines WL, bit lines BL, various voltages, and signals), which are denoted by reference signs ending with numerals/alphabetical characters for distinction, do not need to be distinguished, expressions (reference signs) without such numerals/alphabetical characters at the ends are used.

In general, according to one embodiment, a semiconductor memory includes: a substrate; a first member extending in a first direction perpendicular to a surface of the substrate, and including a first semiconductor layer; a first interconnect extending in, a second direction parallel to the surface of the substrate; a second interconnect extending in the second direction and neighboring the first interconnect in a third direction which crosses the first direction and the second direction and is parallel to the surface of the substrate; a first memory cell storing information between the first interconnect and the first member; a second memory cell storing information between the second interconnect and the first member; a second member extending in the first direction and being provided above the first member in the first direction, the second member including a second semiconductor layer; a third interconnect provided above the first interconnect in the first direction, the third interconnect extending in the second direction; a fourth interconnect extending in the second direction and neighboring the third interconnect in the third direction; a third memory cell storing information between the third interconnect and the second member; a fourth memory cell storing information between the fourth interconnect and the second member; and a third semiconductor layer provided between the first member and the second member, the third semiconductor layer being continuous with the first semiconductor layer and the second semiconductor layer.

(1) First Embodiment

Referring to FIG. 1 to FIG. 21, a description is given of a semiconductor memory according to a first embodiment and a manufacturing method thereof.

(a) Configuration

Referring to FIG. 1 to FIG. 6, an example of the configuration of the semiconductor memory of the first embodiment is described.

<Entire Configuration>

Referring to FIG. 1, an entire configuration of the semiconductor memory of the present embodiment is described.

FIG. 1 is a block diagram illustrating an example of a basic entire configuration of the semiconductor memory. In FIG. 1, although some of connections between blocks are indicated by arrow lines, the connections between the blocks are not limited to the illustrated connections.

As illustrated in FIG. 1, a semiconductor memory 1 includes a memory core 10 and a peripheral circuit 20.

The memory core 10 includes a memory cell array 11, a row decoder 12 and a sense amplifier 13.

The memory cell array 11 includes a plurality of blocks BLK. In the example of FIG. 1, three blocks BLK0 to BLK2 are illustrated, but the number of blocks in the memory cell array 11 is not limited.

The block BLK includes a plurality of memory cells which are arranged three-dimensionally.

The row decoder 12 decodes a row address which is received from an external controller (not shown). Based on the decoded result, the row decoder 12 selects a row of the memory cell array 11. More specifically, the row decoder 12 applies voltages to various interconnects for selecting a row.

The sense amplifier 13 senses data which is read from a certain block BLK, at a time of data read. At a time of data write, the sense amplifier 13 applies a voltage corresponding to write data to the memory cell array 11.

The peripheral circuit. 20 includes a sequencer 21 and a voltage generation circuit 22.

The sequencer 21 controls the operation of the entirety of the semiconductor memory 1. For example, at times of a write operation, a read operation and an erase operation, the sequencer 21 controls the operations of the voltage generation circuit 22, row decoder 12 and sense amplifier 13.

The voltage generation circuit 22 generates voltages which are used in the write operation, read operation and erase operation. The voltage generation circuit 22 supplies the generated voltages to the row decoder 12 and sense amplifier 13.

For example, the semiconductor memory 1 of the present embodiment is a NAND flash memory.

<Circuit Configuration of the Memory Cell Array>

Referring to FIG. 2, a circuit configuration of the memory cell array 11 in the semiconductor memory of the present embodiment is described.

FIG. 2 is a circuit diagram of one block BLK of the memory cell array 11.

As illustrated in FIG. 2, the block BLK includes a plurality of string units SU (SU0, SU1, . . . ). Each string unit SU includes a plurality of memory groups MG. Each of the memory groups MG includes four memory strings LMSL, LMSR, UMSL and UMSR.

The memory string LMSL and memory string UMSL are connected in series. The memory string LMSR and memory string UMSR are connected in series.

In addition, between a conductive layer 119 and a source line SL, the memory string LMSL and memory string UMSL are connected in parallel. Between the conductive layer 119 and a bit line BL, the memory string LMSR and memory string UMSR are connected in parallel.

In the description below, when the memory string LMSL and memory string LMSR are not distinguished, each of the memory strings LMSL and LMSR is expressed as "memory string LMS". When the memory string UMSL and memory string UMSR are not distinguished, each of the memory strings UMSL and UMSR is expressed as "memory string UMS". When the memory string LMS and memory string UMS are not distinguished, each of the memory strings LMS and UMS is expressed as "memory string MS".

The number of memory strings MS included in one memory group MG is not limited to four. The memory group MG may include 2 m (m=an integer of 3 or more) or more memory strings MS.

The memory string LMSL includes, for example, eight memory cells MCL0 to MCL7, and three select transistors STL2A, STL2B and STL2C.

The memory string LMSR includes, for example, eight memory cells MCR0 to MCR7, and three select transistors STR2A, STR2B and STR2C.

The memory string UMSL includes, for example, eight memory cells MCL8 to MCL15, and three select transistors STL1A, STL1B and STL1C.

The memory string UMSR includes, for example, eight memory cells MCR8 to MCR15, and three select transistors STR1A, STR1B and STR1C.

Hereinafter, when the memory cells MCL0 to MCL15 are not distinguished, each of these memory cells is expressed as "memory cell MCL". When the memory cells MCR0 to MCR15 are not distinguished, each of these memory cells is expressed as "memory cell MCR".

When the memory cell MCL and memory cell MCR are not distinguished, each of these memory cells is expressed as "memory cell MC".

In addition, when the select transistors STL1A to STL1C and the select transistors STR1A to STR1C are not distinguished, each of the select transistors is expressed as "select transistor ST1". When the select transistors STL2A to STL2C and the select transistors STR2A to STR2C are not distinguished, each of the select transistors is expressed as "select transistor ST2".

The memory cell MC includes a control gate and a charge storage layer. The memory cell MC can store data substantially nonvolatilely. The memory cell MC may be a MONOS type which uses an insulation layer as the charge storage layer, or may be a floating-gate type which uses a conductive layer (e.g. a polysilicon layer) as the charge storage layer.

Hereinafter, in the present embodiment, an example is described in which the MONOS-type memory cells are used in the NAND flash memory.

In addition, the number of memory cells MC included in each memory string MS may be 16, 32, 48, 64, 96, 128, etc., and the number of memory cells MC in the memory string is not limited. The number of select transistors ST2 included in each memory string LMS and the number of select transistors ST1 included in each memory string UMS may be one or more.

In the memory string LMSL, the memory cells MC and select transistors ST2 are connected in series. More specifically, a current path of the select transistors STL2C, STL2B and STL2A and a current path of the memory cells MCL0 to MCL7 are connected in series.

In the memory string LMSR, a current path of the select transistors STR2C, STR2B and STR2A and a current path of the memory cells MCR0 to MCR7 are connected in series.

In the memory string UMSL, a current path of the memory cells MCL8 to MCL15 and a current path of the select transistors STL1C, STL1B and STL1A are connected in series.

In the memory string UMSR, a current path of the memory cells MCR8 to MCR15 and a current path of the select transistors STR1C, STR1B and STR1A are connected in series.

The source of the memory cell MCL8 is connected to the drain of the memory cell MCL7. The source of the memory cell MCR8 is connected to the drain of the memory cell MCR7.

The drain of the select transistor STL1A and the drain of the select transistor STR1A are commonly connected to any one of a plurality of hit lines BL (BL0, . . . , BL (N-1); (N-1) is an integer of 2 or more).

The source of the select transistor STL2C and the source of the select transistor STR2C are commonly connected to the source line SL.

Select gate lines SGDL (SGDL0, SGDL1, . . . ) and select gate lines SGDR (SGDR0, SGDR1, . . . ) are provided in association with the string units SU (SU0, SU1, . . . ).

The gates of the select transistors STL1A, STL1B and STL1C in the string unit SU are commonly connected to the corresponding select gate line SGDL. Similarly, the gates of the select transistors STR1A, STR1B and STR1C in the string unit SU are commonly connected to the corresponding select gate line SGDR. In the description below, when the select gate lines SGDL and SGDR are not distinguished, each of these select gate lines is expressed as "select gate line SGD".

Each select gate line SGD is independently controlled by the row decoder 12.

Select gate lines SGSL and SGSR are provided in association with the blocks BLK. The gates of the select transistors STL2A, STL2B and STL2C in the same block BLK are commonly connected to the corresponding select gate line SGSL, and the gates of the select transistors STR2A, STR2B and STR2C are commonly connected to the corresponding select gate line SGSR. In the description below, when the select gate lines SGSL and SGSR are not distinguished, each of these select gate lines is expressed as "select gate line SGS".

The select gate lines SGSL and SGSR, for example, may be commonly controlled by the row decoder 12, or may be independently controlled by the row decoder 12.

The control gates of the memory cells MCL0 to MCL15, and MCR0 to MCR15 in the same block BLK are commonly connected to word lines WLL0 to WLL15, and WLR0 to WLR15 provided for each block BLK. The word lines WLL0 to WLL15, and WLR0 to WLR15 are independently controlled by the row decoder 12. In the description below, when the word lines WLL and WLR are not distinguished, each of these word lines is expressed as "word line WL".

The block BLK is, for example, an erase unit of data, and the data stored in the memory cells MC in the same block is erased collectively.

A write operation and a read operation are performed collectively for the memory cells MC which are commonly connected to one word line WL of one string unit SU.

In the memory cell array 11, the drains of the select transistors STL1A and the drains of the select transistors STR1A of the memory groups MG belonging to the same column are commonly connected to any one of the bit lines BL. The bit line BL commonly connects the memory groups MG among the string units SU.

The string unit SU includes a plurality of memory groups. The memory groups in one string unit SU are connected to different bit lines BL, and are connected to the same select gate lines SGDL and SGDR.

The block BLK includes a plurality of groups of a plurality of string units SU having common word lines WL.

The memory cell array 11 includes a plurality of blocks BLK connected to a common bit line BL. In the memory cell array 11, the select gate lines SGS, word lines WL and select gate lines SGD are stacked in a direction (Z direction) perpendicular to the surface of a semiconductor substrate. Thereby, the memory cells MC are arranged three-dimensionally in the memory cell array 11.

<Configuration of the Memory Cell Array>

Referring to FIG. 3, the configuration of the memory cell array 11 is described.

FIG. 3 is a perspective view corresponding to one block BLK of the memory cell array 11. In the example of FIG. 3, depiction of some of insulation layers is omitted.

As illustrated in FIG. 3, an interconnect 101 extending in an X-Y plane, which is parallel to a surface of a semiconductor substrate 100, is provided above the semiconductor substrate 100. The interconnect 101 functions as a source line SL.

Three layers of interconnects 102 extending in a X direction are provided above the interconnect 101. The three layers of interconnects 102 are spaced apart in a Z direction perpendicular to the surface of the semiconductor substrate 100. The interconnects 102 are stacked, with insulation layers (not shown) interposed therebetween. The interconnects 102 function as select gate lines SGS, or as gate electrodes for erase current generation at a time of an erase operation.

A semiconductor layer 105 is provided on a top surface of the interconnect 101 such that the semiconductor layer 105 is put in contact with a part of the top surface of the interconnect 101. The semiconductor layer 105 extends in an X direction. Side surfaces in the Y direction of the semiconductor layer 105 are opposed to the lowermost interconnect 102. In the Z direction, a top surface of the semiconductor layer 105 is located higher than a top surface of the lowermost interconnect 102 and lower than a bottom surface of the second-layer interconnect 102 among three layers of interconnects 102.

Eight layers of interconnects 103 extending in, the X direction are provided above the three layers of interconnects 102. The eight interconnects 103 are spaced apart and stacked in the Z direction. The eight interconnects 103 function as word lines WL0 to WL7.

The interconnects 103 (and interconnects 102) form a multilayer body 50.

A memory trench LMT is provided above the semiconductor layer 105 in a manner to separate the eight layers of interconnects 103 and two layers of interconnects (second-layer and third-layer interconnects) 102 at an upper side (a side of interconnect 103) into two parts in the Y direction. The memory trench LMT is provided in the multilayer body 50. For example, a bottom portion of the memory trench LMT reaches the semiconductor layer 105.

A block insulation film 106, a charge storage layer 107 and a tunnel insulation layer 108 are successively stacked on a side surface of the memory trench LMT from a side-surface side (i.e. from the interconnects 102 and 103 side) of the memory trench LMT.

A semiconductor layer 109 is provided in the memory trench LMT. Surfaces in the Y direction of the semiconductor layer 109 are in contact with surfaces in the Y direction of the tunnel insulation layers 108. A bottom surface (a surface on the substrate 100 side in the direction) of the semiconductor layer 109 is in contact with the semiconductor layer 105. A core layer 110 is buried in an inside region of the semiconductor layer 109 in the memory trench LMT. The semiconductor layer 109 is interposed between the core layer 110 and tunnel insulation layer 108 in the Y direction.

In the description below, the set of layers in the memory trench LMT is also referred to as "memory pillar LMP". One memory pillar LMP functions as the memory string LMSL, LMSR of one memory group MG.

A plurality of holes LAH are provided in the multilayer body 50 in a manner to isolate the memory trenches LMT which are arranged in the X direction. The holes LAH are arranged along the X direction. One hole LAH is interposed between two memory trenches LMT in the X direction. A bottom surface of the hole LAH reaches the semiconductor layer 105.

A conductive layer 119 is provided on each of the memory pillars LMP arranged along the Y direction.

Eight layers of interconnects 103 and three layers of interconnects 104 are spaced apart and stacked in the Z direction above the conductive layer 119. The eight layers of interconnects 103 function as word lines WL8 to WL15 extending in the X direction. The three layers of interconnects 104 function as select gate lines SGD extending in the X direction.

The interconnects 103 and interconnects 104 above the conductive layer 119 form a multilayer body 51.

A memory trench UMT is provided above the conductive layer 119 in a manner to separate the eight layers of interconnects 103 and three layers of interconnects 104 into two parts in the X direction. The memory trench UMT is provided in the multilayer body 51. For example, a part of the bottom surface of the memory trench UMT reaches the conductive layer 119.

Like the memory trench LMT and the layers in the memory trench LMT, a block insulation film 106, a charge storage layer 107, a tunnel insulation layer 108, a semiconductor layer 109 and a core layer 110 are provided in the memory trench UMT.

The set of layers in the memory trench UMT is also referred to as "memory pillar UMP". One memory pillar UMP functions as the memory string UMSL, UMSR of one memory group MG. In the description below, when the memory pillars LMP and UMP are not distinguished, each of these memory pillars is expressed as "memory pillar MP".

A plurality of holes UAH are provided in the multilayer body 51 in a manner to isolate the memory trenches UMT which are arranged in the X direction. The holes UAH are arranged in the X direction. One hole UAH is interposed between two memory trenches UMT in the X direction. A bottom surface of the hole UAH reaches the hole LAH or conductive layer 119.

The memory group MG includes the memory pillars LMP and UMP and the conductive layer 119 which electrically connects the memory pillars LMP and UMP.

Conductive layers 112 are provided on the memory pillars UMP, respectively, which are arranged along the X direction. A contact plug 113 is provided on each conductive layer 112. A top surface of the contact plug 113 is connected to, for example, the bit line BL extending in the Y direction.

<Structure Example of the Memory Cell Array>

Figure 4:
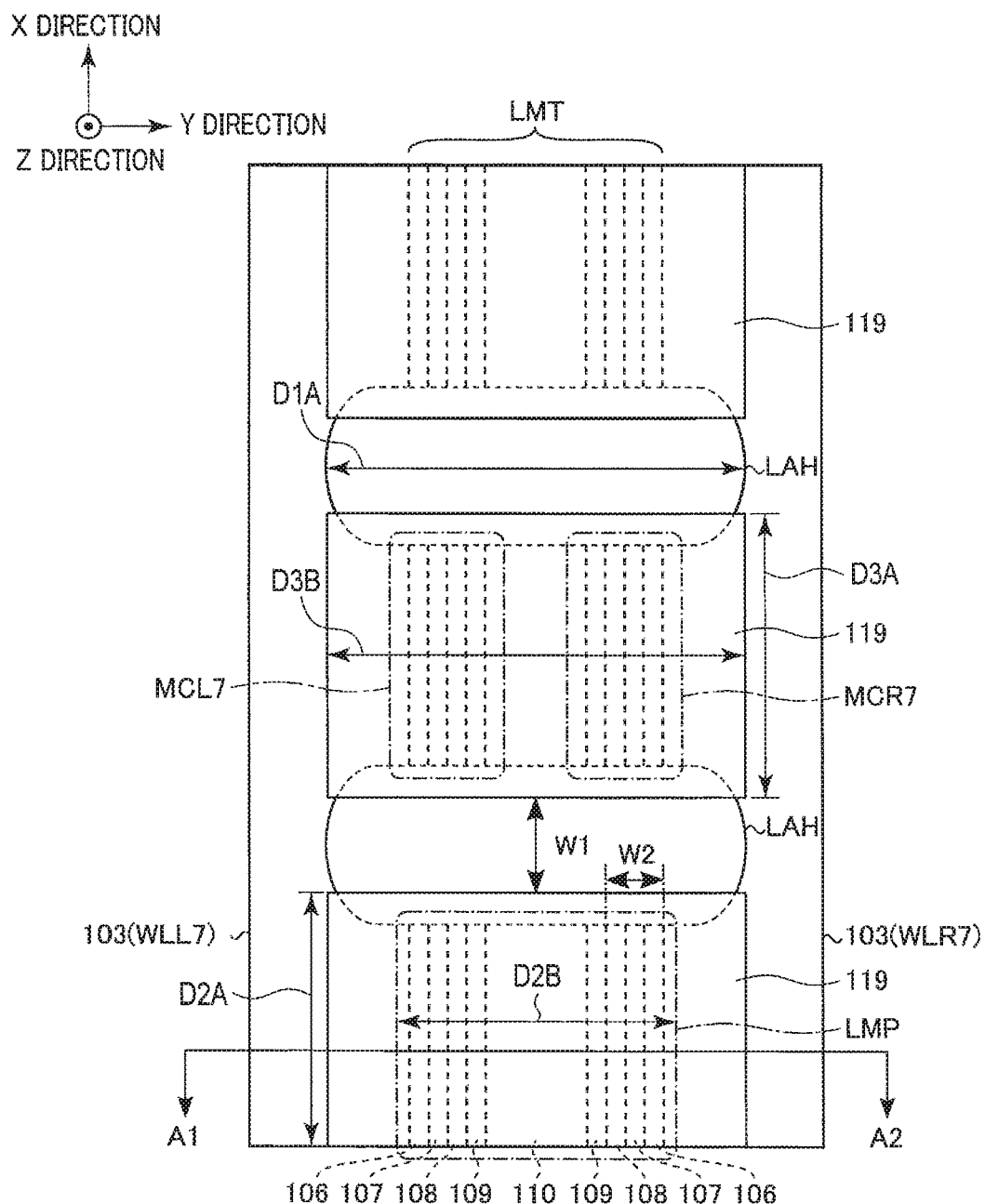
FIG. 4 is a top view illustrating a configuration example of the memory cell array of the semiconductor memory of the first embodiment.
Figure 5:
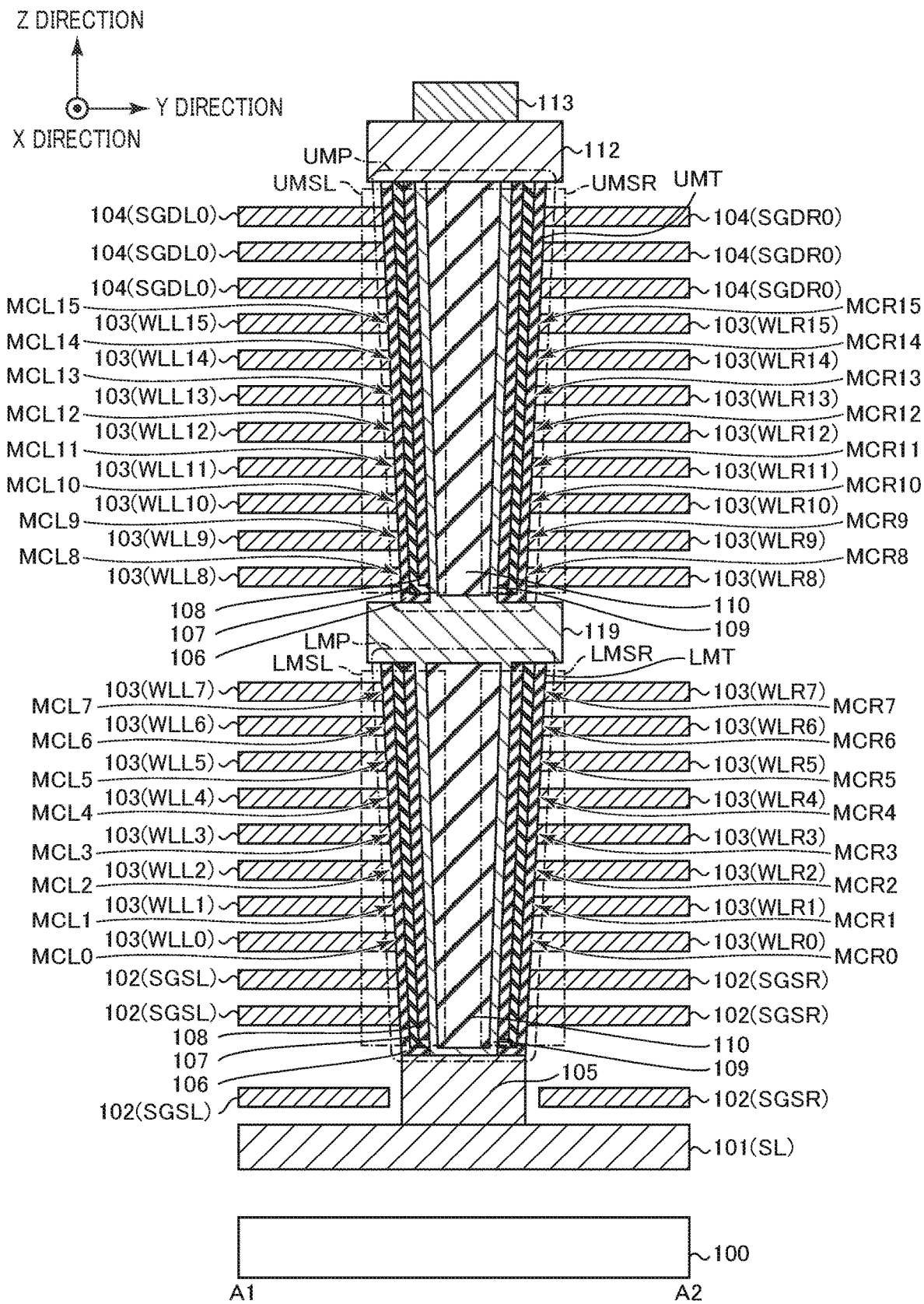
FIG. 5 is cross-sectional view illustrating a configuration example of the memory cell array of the semiconductor memory of the first embodiment.

Referring to FIG. 4 and FIG. 5, a structure example of the memory cell array of the NAND flash memory of the present embodiment is described.

FIG. 4 illustrates a plan-view structure of the memory cell array 11 in an X-Y plane which is parallel to the surface of the semiconductor substrate 100. In the example of FIG. 4, depiction of interlayer insulation films is omitted.

As illustrated in FIG. 4, a word line WLL7 (interconnect 103) and a word line WLR7 (interconnect 103), which extend in the X direction, are disposed to neighbor each other in the Y direction. The memory pillars LMP and holes LAH are alternately arranged along the X direction between the word line WLL7 and word line WLR7.

The block insulation film 106, charge storage layer 107, tunnel insulation layer 108 and semiconductor layer 109 are successively stacked on each of two side surfaces (end portions in the Y direction) of the memory pillar LMP in the Y direction, from the side surfaces of trench LMT toward the center of the trench LMT. The core layer 110 is buried in the inside of the memory pillar LMP.

In one memory pillar LMP, end portions in the X direction of the block insulation film 106, charge storage layer 107, tunnel insulation layer 108, conductor layer 109 and core layer 110 are in contact with insulation layers in the memory hole LAH.

In one memory pillar LMP, the block insulation film 106, charge storage layer 107 and tunnel insulation layer 108 are mutually isolated in the Y direction.

In memory pillars MP neighboring in the X direction, the block insulation films 106, charge storage layers 107, tunnel insulation layers 108 and semiconductor layers 109 are mutually isolated in the X direction.

In the example of FIG. 4, the memory cell MCL7 is formed by a region (part) including the word line WLL7, and the block insulation film 106, charge storage layer 107, tunnel insulation layer 108 and semiconductor layer 109 on the left side-surface side of the memory pillar LMP. The memory cell MCR7 is formed by a region including the word line WLR7, and the block insulation film 106, charge storage layer 107, tunnel insulation layer 108 and semiconductor layer 109 on the right side-surface side of the memory pillar LMP.

The hole LAH isolates the memory trenches LMT in the X direction.

A dimension (length/width) D1A of the hole LAH in the Y direction is greater than a dimension (length/width) D2B of the memory trench LMT in the Y direction. Thus, the dimension (e.g. a minimum dimension of the hole LAH in the Y direction) D1A of the hole LAH in the Y direction is greater than the dimension (a maximum dimension of the memory pillar LMP in the Y direction) D2B of the memory pillar LMP in the Y direction.

The conductive layer 119 is provided on the memory pillar LMP in a manner to cover the top surface of the memory pillar LMP. The conductive layer 119 is provided in a space from which an etching stopper layer (sacrifice layer) on the top surface of the memory pillar LMP at a time of processing the memory trench UMT was removed.

The conductive layer 119 has a plan-view shape of a rectangular shape, a race track shape, an elliptic shape, or a circular shape. In the example of FIG. 4, the conductive layer 119 has a rectangular plan-view shape.

A dimension D3A in the X direction of the conductive layer 119 is greater than a dimension D2A in the X direction of the memory pillar LMP. A dimension D3B in the Y direction of the conductive layer 119 is greater than the dimension D2B in the Y direction of the memory pillar LMP.

For example, the conductive layer 119 covers end portions in the X direction of the insulation layers in the hole LAH.

A dimension (distance) between two conductive layers (stopper layer/sacrifice layer) 119 arranged along the X direction is expressed as "W1", and a total dimension of the block insulation film 106, charge storage layer 107 and tunnel insulation layer 108 in the Y direction in the memory trench UMT (not shown) is expressed as "W2". As regards the dimensions W1 and W2, it is preferable that the dimension W1 is equal to or less than double the dimension W2, i.e. the dimensions W1 and W2 have a relationship of $W1 \leq 2 \times W2$.

In the case in which the above relationship between the dimensions W1 and W2 is established, even if the hole LAH (insulation layer 122) between the conductive layers 119 is processed at a time of processing the upper-layer memory trench UMT, an unnecessarily processed region of the hole LAH is buried by the upper-layer block insulation film 106, charge storage layer 107 and tunnel insulation layer 108 when the respective layers are formed in the upper-layer memory trench UMT.

Thereby, when the upper-layer semiconductor layer 109 is formed, it is possible to suppress the upper-layer semiconductor layer 109 from entering the lower-layer hole LAH.

FIG. 5 is a cross-sectional view of the memory cell array 11, taken along line A1-A2 in FIG. 4, in the NAND flash memory of the present embodiment. In FIG. 5, depiction of interlayer insulation films is omitted.

As illustrated in FIG. 5, the interconnect (conductive layer) 101 is provided above the semiconductor substrate 100 via an insulation layer (not shown). The interconnect 101 is a source line.

For example, polycrystalline silicon, which is doped with phosphorus (P) or the like, is used for the interconnect 101. A circuit, such as the row decoder 12 or sense amplifier 13, may be provided in a region between the semiconductor substrate 100 and interconnect 101.

Three layers of interconnects (conductive layers) 102 and eight layers of interconnects (conductive layers) 103 are successively stacked above the interconnect 101, with insulation layers (not shown) being interposed therebetween. The three layers of interconnects 102 are select gate lines SGSL and SGSR. The eight layers of interconnects 103 are word lines WL0 to WL7.

The interconnects 102 and interconnects 103 are formed of an electrically conductive material. For example, as the material of the interconnect 102, 103, an impurity-doped semiconductor (n-type semiconductor material or p-type semiconductor material), a conductive compound, or a metal is used. A description is given of a case in which tungsten (W) and titanium nitride (TiN) are used for the interconnects 102 and 103 in the present embodiment. The interconnect 102, 103 has a multilayer structure of W and TiN. TiN functions as a barrier metal and adhesion layer when W is formed.

The semiconductor layer 105 is provided on the interconnect 101. The semiconductor layer 105 neighbors the lowermost interconnect 102 in the Y direction. The interconnect 102 is opposed to the side surfaces in the Y direction of the semiconductor layer 105. In the Y direction, the semiconductor layer 105 is provided between the two interconnects 102. A silicon layer is used for the semiconductor layer 105.

The memory trench LMT is provided on the semiconductor layer 105. The memory pillar LMP is provided in the memory trench LMT. The memory pillar LMP includes the block insulation film 106, charge storage layer 107, tunnel insulation layer 108, semiconductor layer 109 and core layer 110.

For example, silicon oxide layers ($SiO_2$) are used for the block insulation film 106, tunnel insulation layer 108 and core layer 110. A silicon nitride layer (SiN) or a hafnium oxide layer (HfO), etc., for example, is used for the charge storage layer 107. The semiconductor layer 109 is a region (hereinafter referred to as "channel region") in which a channel of the memory cell MC is formed.

The semiconductor layer 109 functions as an interconnect (signal line) for connecting current paths of memory cells MC. For example, polycrystalline silicon is used for the semiconductor layer 109.

In the example of FIG. 5, the interconnects 102, which are disposed on the left side on the drawing sheet of FIG. 5 with respect to the semiconductor layer 105 and memory pillar LMP, function as the select gate lines SGSL, and the eight layers of interconnects 103 function as the word lines WLL0 to WLL7 in the named order from the lower-layer side.

For example, the memory cell MCL0 is formed by a region (part) including the interconnect 103 functioning as the word line WLL0, and parts of the block insulation film 106, charge storage layer 107, tunnel insulation layer 108 and semiconductor layer 109 provided on the left side surface of the memory pillar LMP. The other memory cells MCL1 to MCL7 and select transistors STL2A to STL2C also have the same structure.

The interconnects 102 disposed on the right side on the drawing sheet function as the select gate lines SGSR, and the eight layers of interconnects 103 function as the word lines WLR0 to WLR7 in the named order from the lower-layer side (semiconductor substrate side).

For example, the memory cell MCR0 is formed by a region (part) including the interconnect 103 functioning as the word line WLR0, and parts of the block insulation film 106, charge storage layer 107, tunnel insulation layer 108 and semiconductor layer 109 provided on the right side surface of the memory pillar LMP. The other memory cells MCR1 to MCR7 and select transistors STR2A to STR2C also have substantially the same structure as the memory cell MCR0.

The memory cell MCL0 and memory cell MCR0 are provided in the same layer (in the X-Y plane at the same height in the Z direction). The interconnects 103, charge storage layers 107 and semiconductor layers 109 corresponding to the memory cell MCL0 and memory cell MCR0 are mutually isolated in the same layer (X-Y plane). The channel regions of the memory cell MCL0 and memory cell MCR0 are mutually isolated.

However, the semiconductor layer 109 is continuous between the memory cell MCL0 side and the memory cell MCR0 side in the layer of the bottom surface of the memory trench LMT. The semiconductor layer 109 is provided between the core layer 110 and semiconductor layer 105.

The other memory cells MCL and memory cells MCR have the same relationship as the relationship between the memory cell MCL0 and memory cell MCR0.

The select transistors STL2A to STL2C and select transistors STR2A to STR2C have the same relationship as the relationship between the memory cells MCL and MCR. For example, the select transistor STL2A is provided in the same layer (X-Y plane) as the select transistor STR2A.

The conductive layer 119 is provided on the memory pillar LMP. The conductive layer 119 is formed of an electrically conductive material. For example, an n-type semiconductor layer using polycrystalline silicon is used for the conductive layer 119.

Eight layers of interconnects 103 and three layers of interconnects 104 are successively stacked above the conductive layer 119, with interlayer insulation films (not shown) being interposed therebetween. The eight interconnects 103 function as word lines WL8 to WL15. The three layers of interconnects 104 function as select gate lines SGD.

The interconnects 104, like the interconnects 102 and interconnects 103, are formed of an electrically conductive material. For example, as the material of the interconnect 104, use is made of an impurity-doped semiconductor (n-type semiconductor or p-type semiconductor), a conductive compound, or a metal. In the present embodiment, for example, like the interconnects 102 and 103, W and TiN are used for the interconnects 104.

The memory trench UMT is provided above the conductive layer 119. The memory pillar UMP is provided in the memory trench UMT. The memory pillar UMP includes the block insulation film 106, charge storage layer 107, tunnel insulation layer 108, semiconductor layer 109 and core layer 110.

The conductive layer 119 is in contact with the semiconductor layer 109 of the memory pillar LMP, UMP. For example, the conductive layer 119 is a layer which is continuous with the semiconductor layer 109. The channel regions of the memory strings LMSL, LMSR, UMSL and UMSR are electrically connected via the conductive layer 119.

In the example of FIG. 5, the eight layers of interconnects 103, which are disposed on the left side on the drawing sheet with respect to the memory pillar UMP, function as the word lines WLL8 to WLL15 in the named order from the lower-layer side (semiconductor substrate side), and the interconnects 104 function as select gate lines SGDL.

For example, the memory cell MCL8 is formed by a region including the interconnect 103 functioning as the word line WLL8, and parts of the block insulation film 106, charge storage layer 107, tunnel insulation layer 108 and semiconductor layer 109 provided on the left side surface of the memory pillar UMP. The other memory cells MCL9 to MCL15 and select transistors STL1A to STL1C also have the same structure as the structure of the memory cell MCL8.

The eight layers of interconnects 103 disposed on the right side on the drawing sheet function as word lines WLR8 to WLR15 in the named order from the lower-layer side, and the interconnects 104 function as select gate lines SGDR.

For example, the memory cell MCR8 formed by a region including the interconnect 103 functioning as the word line WLR8, and parts of the block insulation film 106, charge storage layer 107, tunnel insulation layer 108 and semiconductor layer 109 provided on the right side surface of the memory pillar UMP. The other memory cells MCR9 to MCR15 and select transistors STR1A to STR1C also have the same structure as the structure of the memory cell MCR8.

The conductive layer 112 is provided on the memory pillar UMP. The conductive layer 112 is formed of an electrically conductive material. For example, polycrystalline silicon layer is used for the conductive layer 112. The contact plug 113 is provided on the conductive layer 112. The contact plug 113 connects the memory pillar UMP and the bit line BL. The contact plug 113 is formed of an electrically conductive material. For example, a multilayer film including W and TiN is used for the contact plug 113. A bit line BL (not shown) is provided on the contact plug 113.

More than three stages of the multilayer bodies and memory pillars MP may be stacked in the Z direction. In this case, conductive layers 119 are provided between the respective memory pillars MP.

Figure 6:
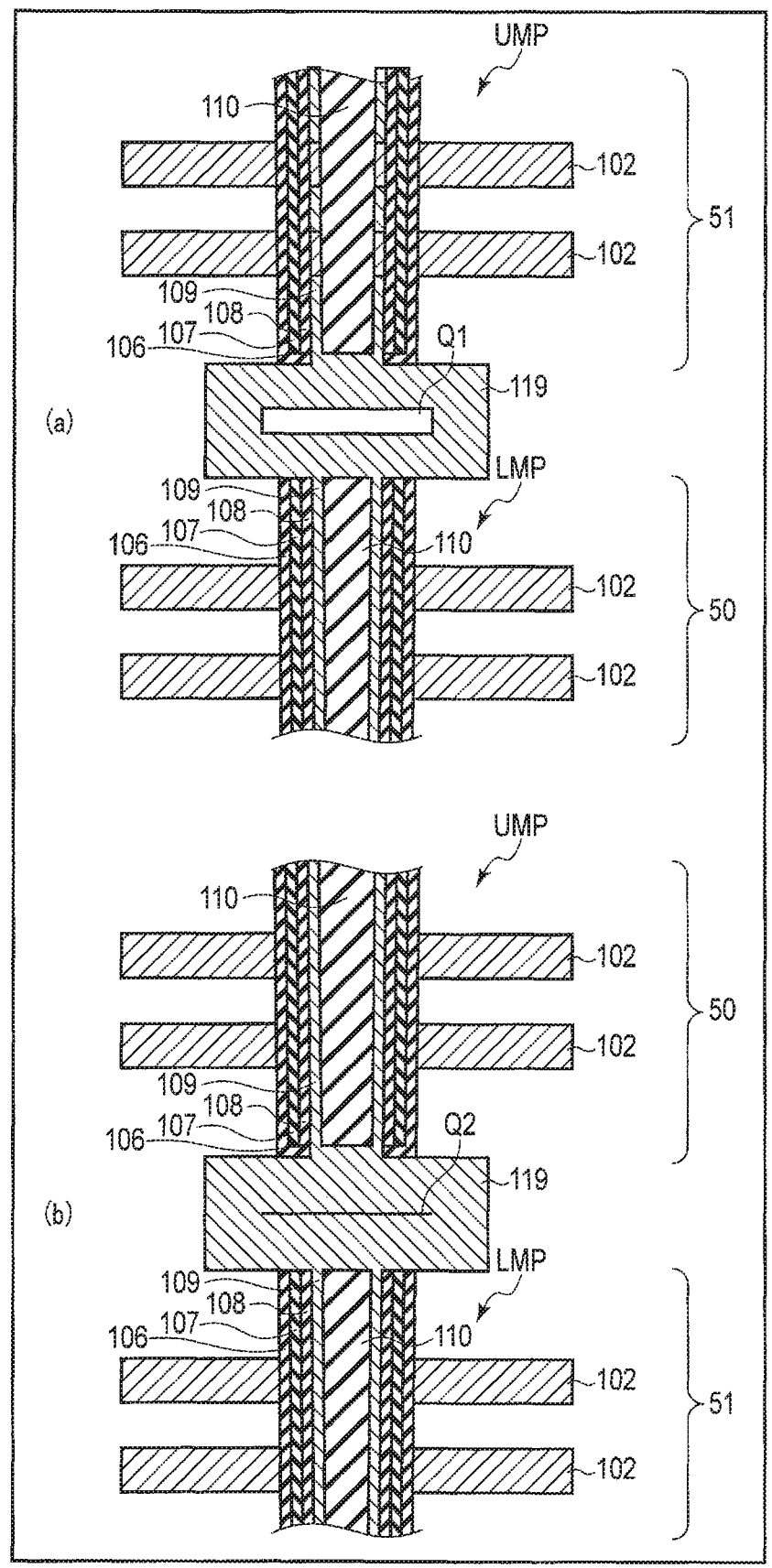
FIG. 6 is a view illustrating a configuration example of the memory array of the semiconductor memory of the first embodiment.

Parts (a) and (b) of FIG. 6 are enlarged views of connection portions of two memory pillars (portions near the conductive layer 119) in the NAND flash memory of the present embodiment.

As illustrated in part (a) of FIG. 6, the conductive layer 119 connects the memory pillar LMP in the lower-layer multilayer body 50 to the memory pillar UMP of the upper-layer multilayer body 51.

The conductive layer 119 is continuous with, for example, the semiconductor layer 109 in the memory pillar LMP and the semiconductor layer 109 in the memory pillar UMP. For example, the conductive layer 119 and the semiconductor layer 109 are a seamless layer. The conductive layer 109 is seamlessly connected to the semiconductor layer 109.

The conductive layer 119 has a rectangular cross-sectional shape. For example, an air gap Q1 is provided in the inside of the conductive layer 119 (e.g. in a central part of the conductive layer).

The conductive layer 119 is, for example, an n-type or p-type polysilicon layer.

As illustrated in part (b) of FIG. 6, there is a case in which a seam Q2 is provided in the inside of the conductive layer 119 (e.g. in a central part of the conductive layer). The seam is a contact surface (a discontinuous surface, a joining part) of a plurality of parts occurring in a layer due to growth (formation) from a plurality of directions of the layer in a certain space.

In addition, the cross-sectional shape of the conducive layer 119 may be a rectangular shape with corners missing. In this case, the corner portions of the conductive layer 119 are provided with members of a material (e.g. a material of a sacrifice layer) which is different from the material of the conductive layer 119.

Three or more stages of memory pillars MP may be stacked. In this case, conductive layers 119 are provided between the respective memory pillars MP.

By a manufacturing method to be described below, the NAND flash memory of the present embodiment is formed.

(b) Manufacturing Method

Referring to FIG. 7 to FIG. 21, the manufacturing method of the semiconductor memory of the present embodiment will be described.

Hereinafter, a manufacturing method of the memory cell array 11 of the semiconductor memory (e.g. NAND flash memory) of the present embodiment is described.

FIG. 7 to FIG. 12, FIG. 14, FIG. 16, FIG. 18 and FIG. 20 illustrate top surfaces (array top surfaces) of the memory cell array and cross sections (A1-A2 cross sections) along lines A1-A2 in the respective fabrication steps of the manufacturing method of the semiconductor memory of the embodiment. FIG. 13, FIG. 15, FIG. 17, FIG. 19 and FIG. 21 illustrate cross sections along lines B1-B2 of the memory cell array in the respective fabrication steps.

In the present embodiment, when interconnects (word lines and select gate lines) 102, 103 and 104 are formed, the following process (forming method) is performed.

A structure (part) corresponding to the interconnect 102, 103 and 104 is formed by a sacrifice layer 121, and thereafter the sacrifice layer 121 is removed. A conductive material is buried in the space (gap) from which the sacrifice layer 121 was removed. Thereby, the interconnect 102, 103 and 104 is formed. In the description below, the burying of the conductive material in the space, from which the sacrifice layer was removed, is called "backfill".

In the fabrication steps below, the case is described in which a silicon nitride layer (SiN) is used as the sacrifice layer 121, and W and TiN are used as the conductive material of the interconnect 102, 103 and 104. The interconnect 102, 103 and 104 includes a multilayer structure including TiN and W. When a film of W is formed, TiN functions as, for example, a barrier layer for preventing a reaction between W and underlying Si, or as an adhesion layer for improving the adhesively of W.

The sacrifice layer 121 is not limited to SiN. The material of the sacrifice layer 121 may be a material by which a sufficient selectivity ratio of wet etching between the sacrifice layer and an interlayer insulation film can be obtained. For example, the sacrifice layer 121 may be a silicon oxynitride layer (SION).

Figure 7:
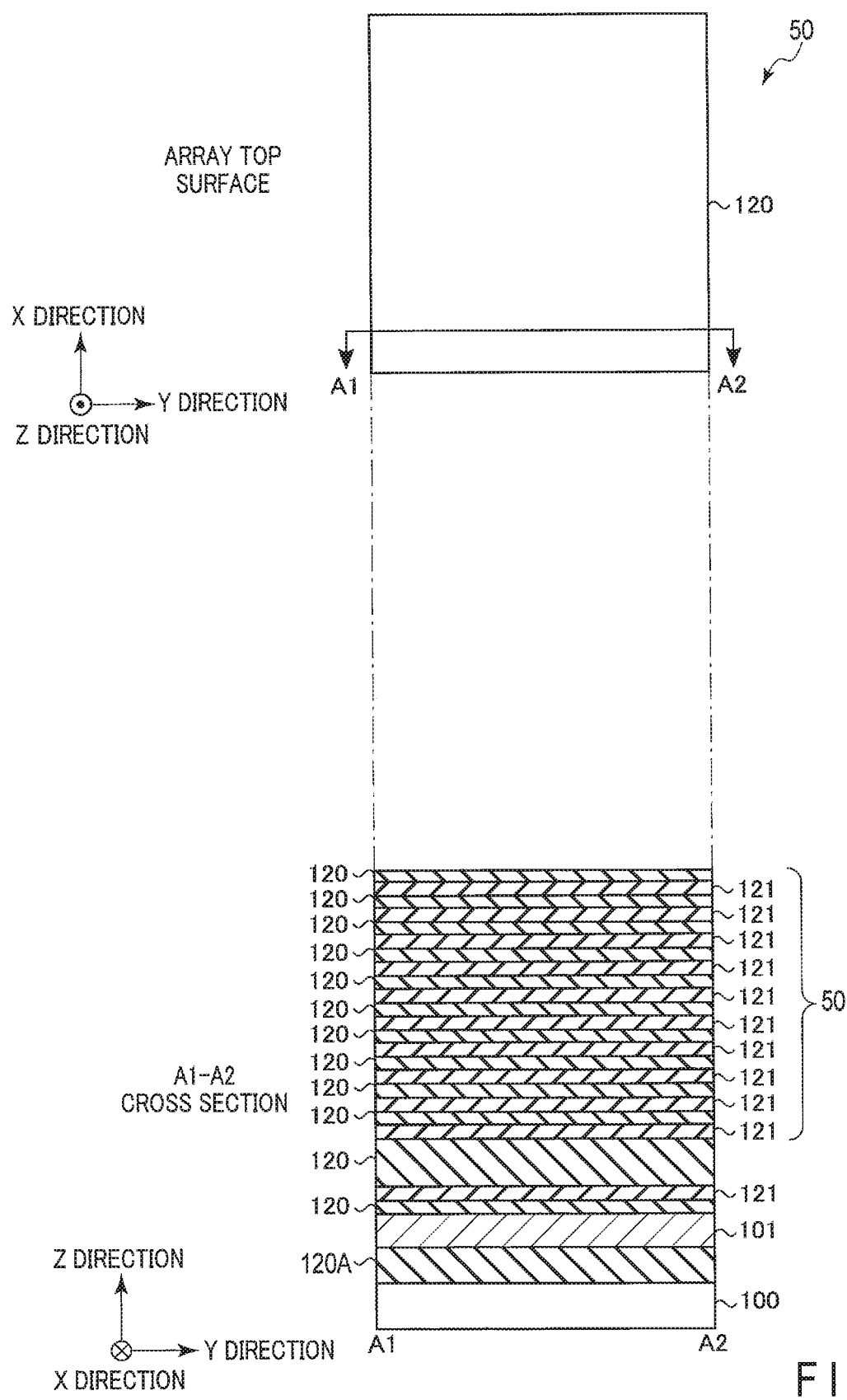
FIG. 7, FIG. 8, FIG. 9, FIG. 10, FIG. 11, FIG. 12, FIG. 13, FIG. 14, FIG. 15, FIG. 16, FIG. 17, FIG. 18, FIG. 19, FIG. 20 and FIG. 21 are views illustrating fabrication steps of the semiconductor memory of the first embodiment.

As illustrated in FIG. 7, an insulation layer 120A is formed above a semiconductor substrate 100. An interconnect (conductive silicon layer) 101 is formed on the insulation layer 120A. For example, the insulation layer 120A is a silicon oxide layer functioning as an interlayer insulation film, or an aluminum oxide layer on a silicon oxide layer (interlayer insulation film).

After an insulation layer 120 (e.g. $SiO_2$) is formed on the interconnect 101, sacrifice layers 121 and insulation layers are alternately stacked in the Z direction. Thereby, a multilayer body 50 is formed.

For example, eleven sacrifice layers 121 and eleven insulation layers 120 are formed in the multilayer body 50. Of the eleven sacrifice layers 121, three sacrifice layers 121 correspond to interconnects 102, and eight sacrifice layers 121 correspond to interconnects 103.

Figure 8:
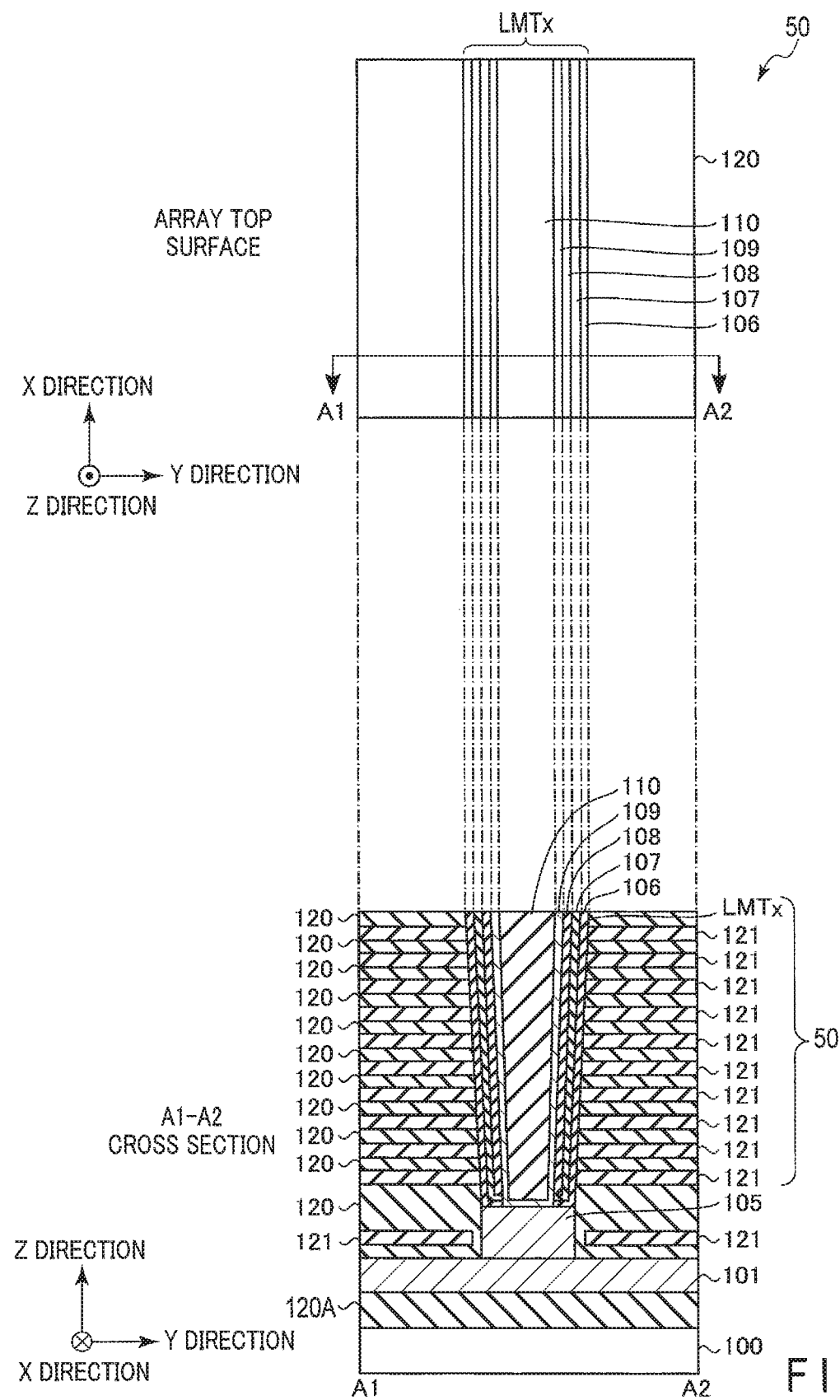

As illustrated in FIG. 8, a trench LMTx extending along the X direction is formed in the multilayer body 50. A bottom surface of the trench LMTx reaches the interconnect 101. Insulation films, which are parts of the insulation layer 120, are formed on side surfaces of the sacrifice layer 121 so as to cover the side surfaces of the lowermost sacrifice layer 121. Thereby, the side surfaces of the lowermost sacrifice layer 121 are not exposed into the inside of the trench LMTx.

By selective CVD (e.g. selective epitaxial growth of silicon) of a semiconductor layer, a semiconductor layer 105 is formed on the exposed interconnect 101.

A block insulation film 106, a charge storage layer 107, a tunnel insulation layer 108, a semiconductor layer 109 and a core layer 110 are formed in the trench LMTx so as to fill the inside of the trench LMTx.

More specifically, each layer (each film) is formed in the trench LMTx as described below.

The block insulation film 106, charge storage layer 107 and tunnel insulation layer 108 are formed in the trench LMTx in the named order from the side-wall side of the multilayer body 50. By dry etching (e.g. RIE), the block insulation film 106, charge storage layer 107 and tunnel insulation layer 108 are removed from the top surface of the uppermost insulation layer 120 of the multilayer body 50 and from the bottom portion (the top surface of the semiconductor layer 105) of the trench LMTx. Thereby, a part of the top surface of the semiconductor layer 105 is exposed.

The inside of the trench LMTx is buried by the formation of the semiconductor layer 109 and core layer 110. Then, excess portions of the semiconductor layer 109 and core layer 110 on the uppermost insulation layer 120 are removed.

Figure 9:
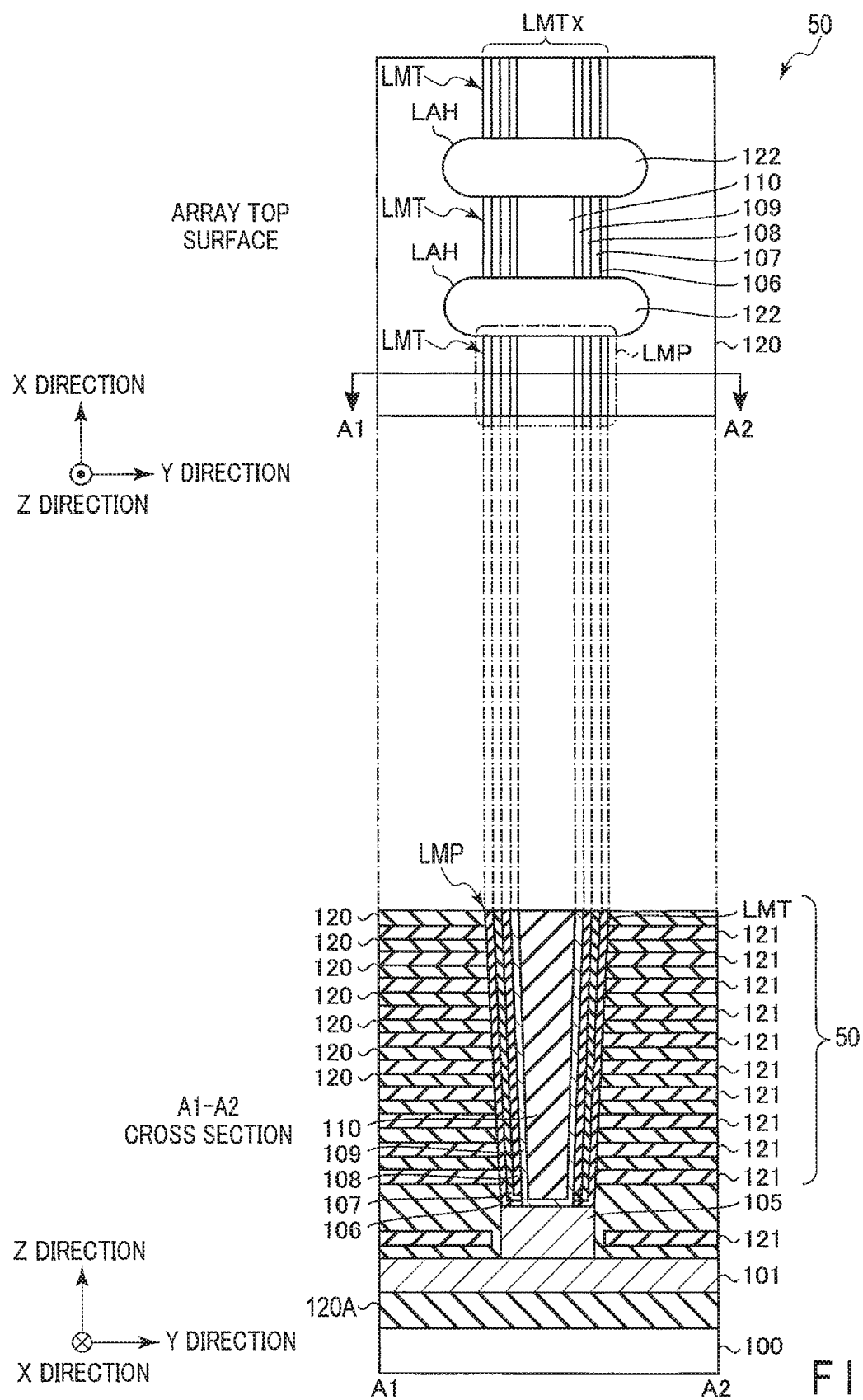

As illustrated in FIG. 9, holes LAH are formed in the multilayer body 50 (in the trench LMT) such that parts of the bottom surfaces of the holes LAH reach the semiconductor layer 105. Thereafter, insulation layers 122 (e.g. SiO$_2$) are buried in the holes LAH.

After the insulation layer 122 is buried in the hole LAH, the surface of the insulation layer 122 is planarized by, for example, dry etching or CMP (chemical mechanical polishing). Thereby, the trench LMTx is divided into a plurality of memory trenches LMT in the X direction. Each layer in the trench LMTx is separated in the Y direction for each memory trench.

As a result, a memory pillar LMP is formed in the memory trench LMT.

Figure 10:
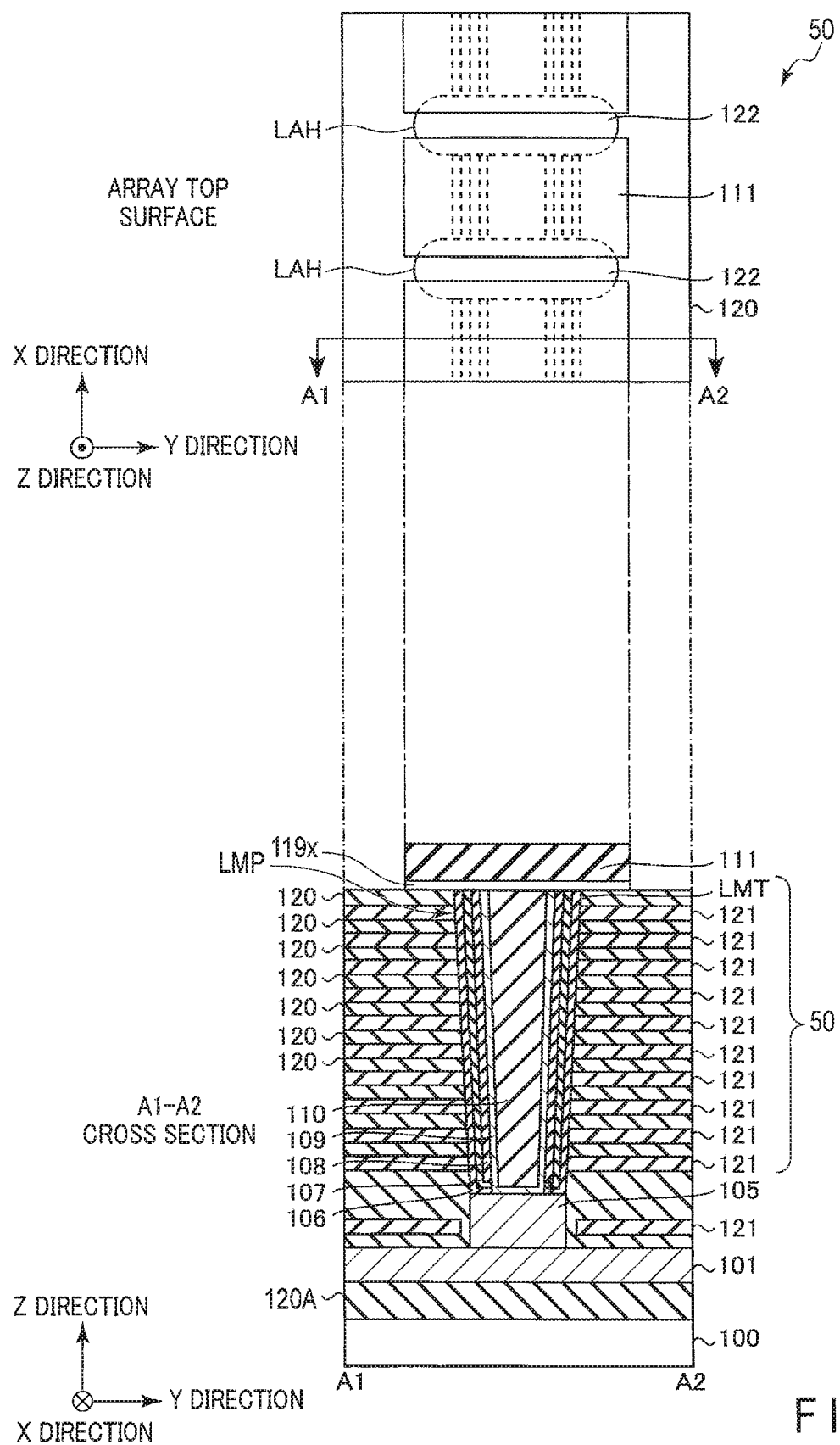

As illustrated in FIG. 10, in the present embodiment, a sacrifice layer 111 is formed on the memory pillar LMP. The sacrifice layer 111 functions as an etching stopper at a time of processing an upper-layer memory trench UMT. The sacrifice layer 111 is, for example, an aluminum oxide layer (AlO layer).

Thus, the film thickness of the sacrifice layer 111 in the Z direction is set to a such a thickness that the upper part of the memory pillar LMP is not exposed by the etching on the sacrifice layer 111 when a trench is formed (and/or a hole is formed) in the upper-layer multilayer body.

The position of formation and the dimensions of the sacrifice layer 111 are set such that the memory pillar LMP is not exposed to the hole when the hole is formed in the upper-layer multilayer body. For example, the dimension in the X direction of the sacrifice layer 111 is greater than the dimension in the X direction of the memory pillar LMP (memory trench LMT). For example, the dimension in the Y direction of the sacrifice layer 111 is greater than the dimension in the Y direction of the memory pillar LMP.

For example, a semiconductor layer 119x is formed between the sacrifice layer 111 and memory pillar LMP. The semiconductor layer 119x functions as an underlying layer for forming a conductive layer which connects memory pillars stacked in the Z direction. The semiconductor layer 119x is, for example, an amorphous silicon layer.

A HfO layer, a HfSiO layer, a ZrO layer or a W layer may be used for the sacrifice layer 111.

Figure 11:
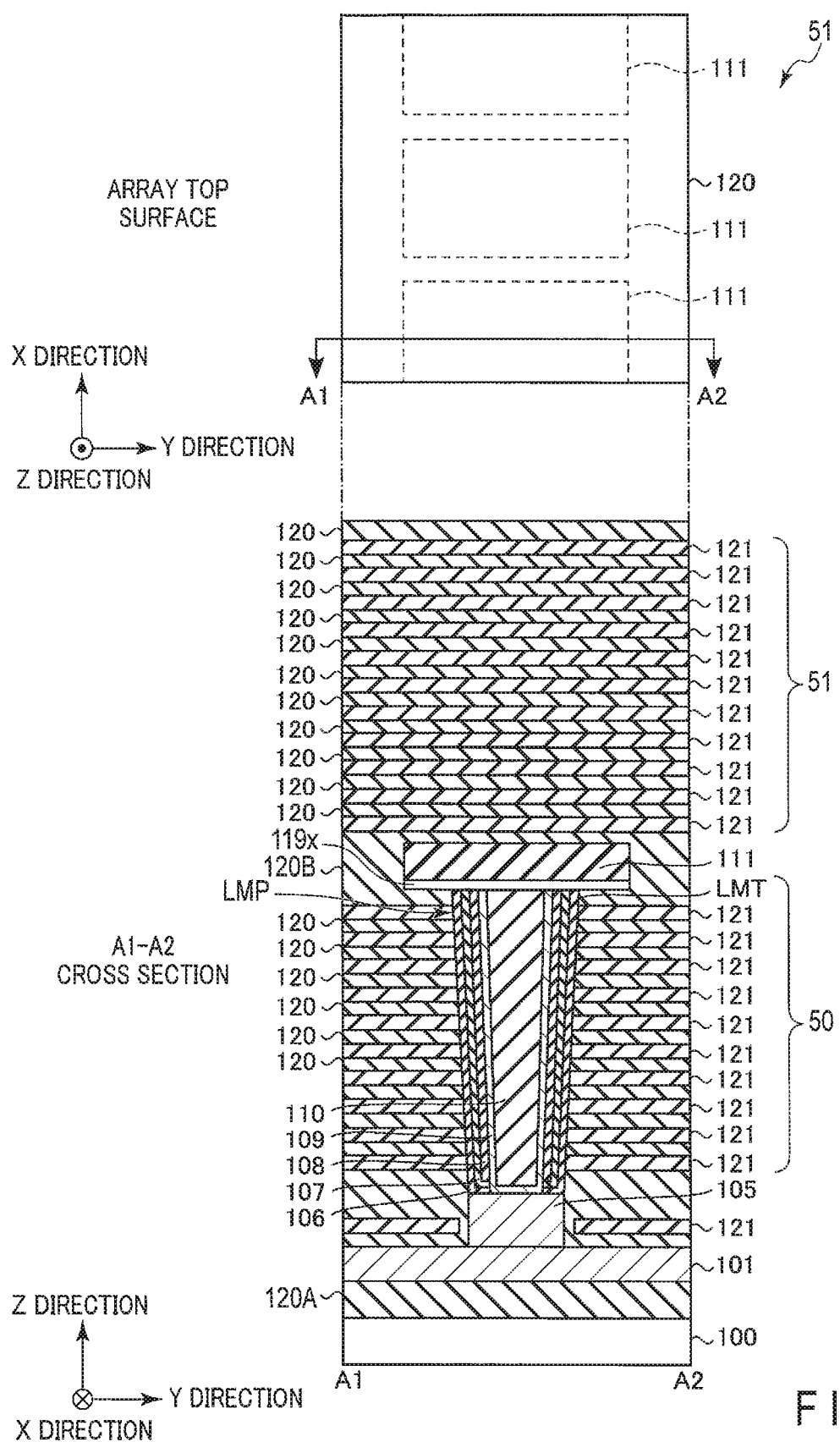

As illustrated in FIG. 11, an insulation layer 120B is formed on the sacrifice layer 111 and on the multilayer body 50 so as to cover the sacrifice layer 111. Then, a plurality of sacrifice layers 121 and a plurality of insulation layers 120 are alternately stacked on the insulation layer 120B. Thereby, a multilayer body 51 is formed on the multilayer body 50. For example, the multilayer body 51 includes eleven insulation layers and eleven sacrifice layers 121. Of the eleven sacrifice layers of the multilayer body 51, eight sacrifice layers 121 correspond to interconnects 103, and three sacrifice layers correspond to interconnects 104.

Figure 12:
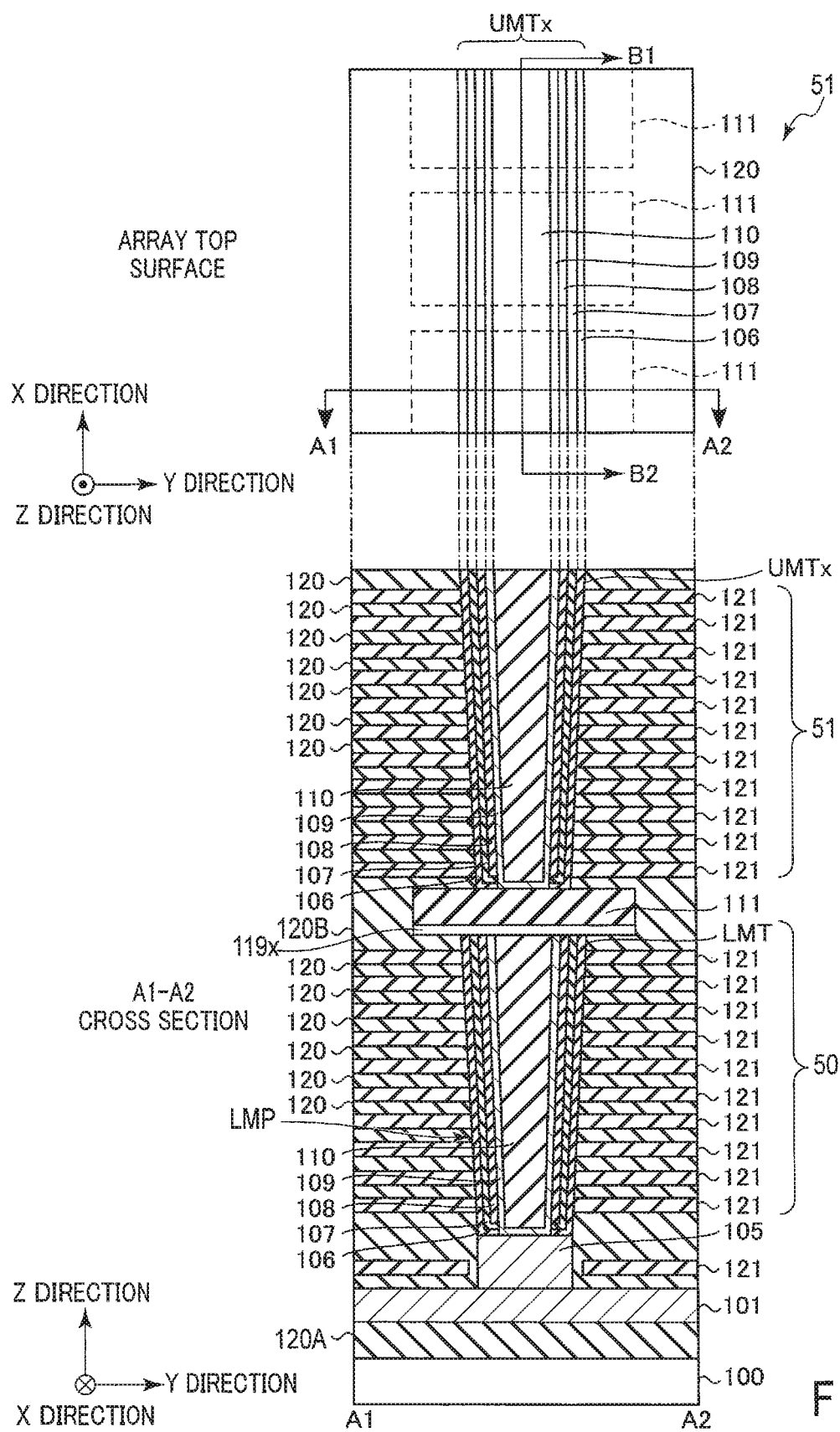
Figure 13:
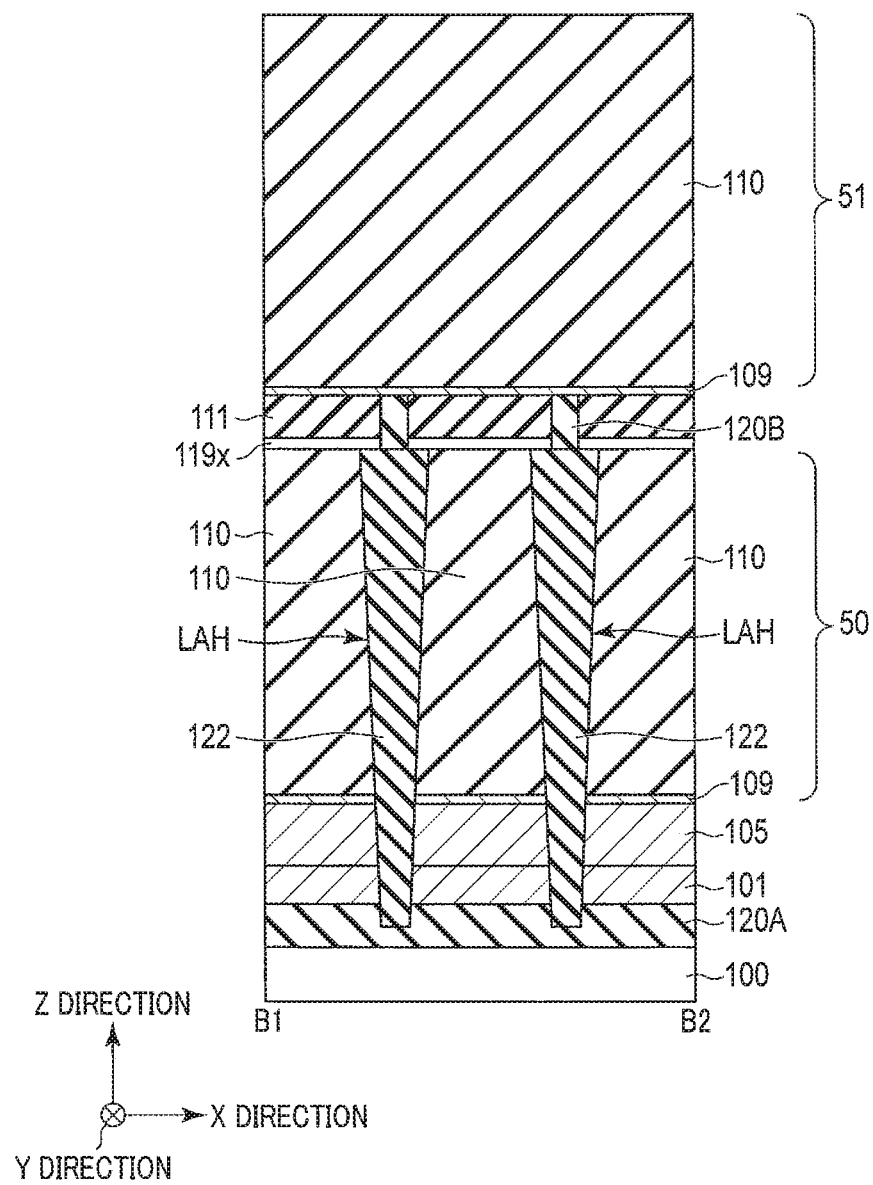

As illustrated in FIG. 12 and FIG. 13, a trench UMTx is formed in the multilayer body 51. A bottom surface of the trench UMTx reaches the sacrifice layer 111. A top surface of the sacrifice layer 111 is exposed via the trench UMTx.

Like the respective layers of the memory pillar P, block insulation film 106, a charge storage layer 107, a tunnel insulation layer 108, a semiconductor layer 109 and a core layer 110 are formed in the trench UMTx in the named order from the side-surface side toward the central part side of the trench UMTx.

For example, after the block insulation film 106, charge storage layer 107 and tunnel insulation layer 106 are formed, the block insulation film 106, charge storage layer 107 and tunnel insulation layer 108 lying on the sacrifice layer 111 are removed. Then, the semiconductor layer 109 and core layer 110 are formed in the trench UMTx.

Thus, the semiconductor layer 109 is put in contact with the top surface of the sacrifice layer 111. At this time, the sacrifice layer 111 partly covers the top surface of the insulation layer 122 in the hole LAH.

Figure 14:
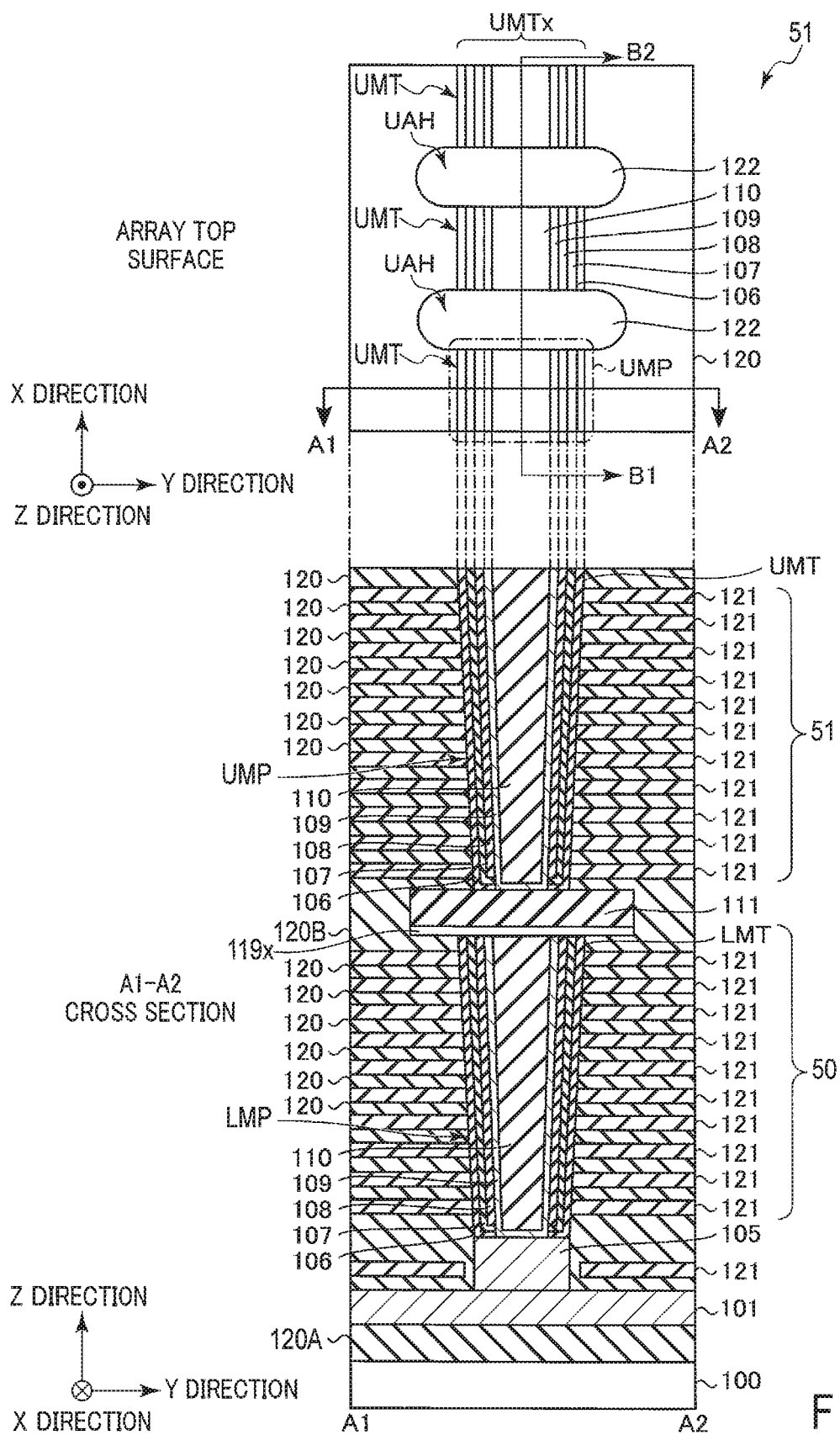
Figure 15:
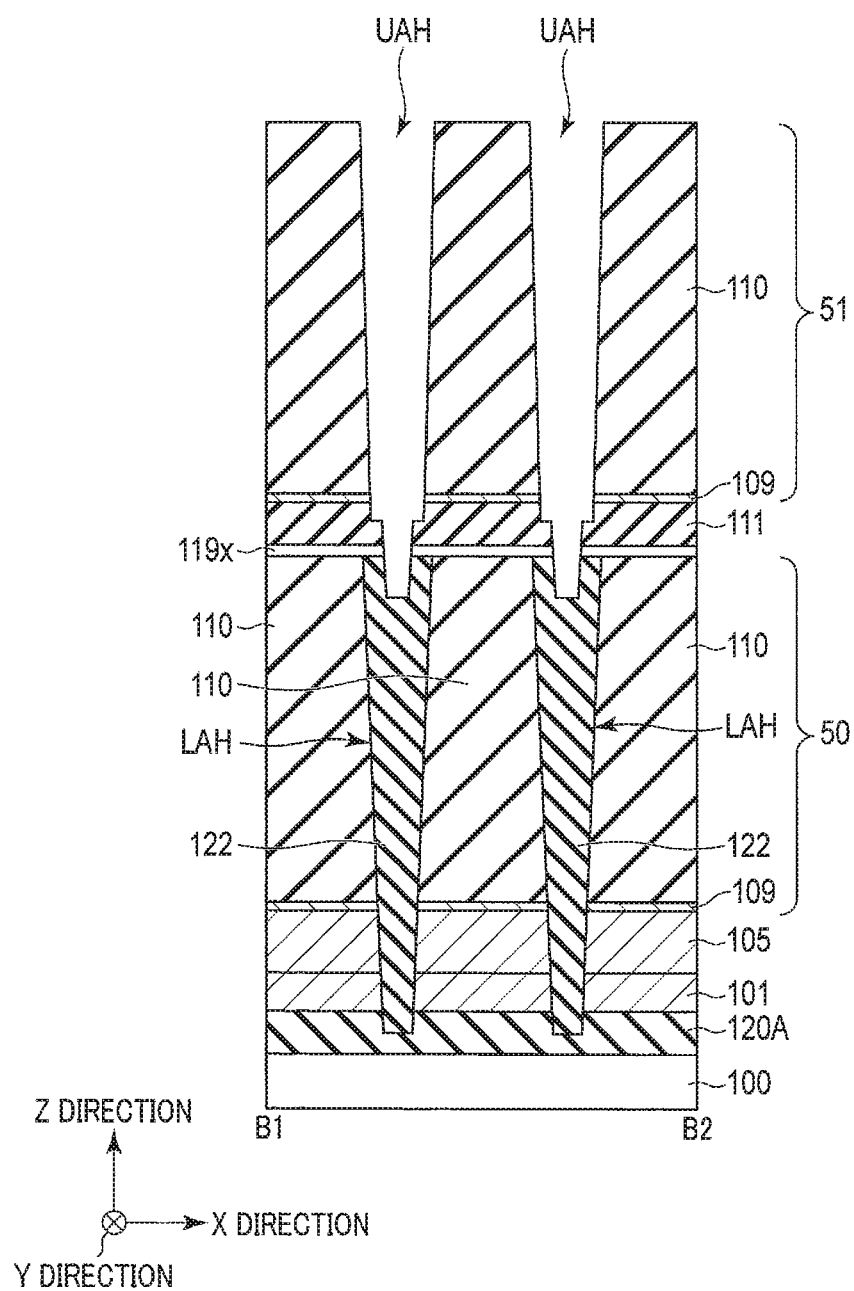

As illustrated in FIG. 14 and FIG. 15, holes UAH are formed in the multilayer body 51. Parts of the bottom surfaces of the holes UAH reach the sacrifice layer (AlO layer) 111.

The trench UMTx extending in the X direction is divided into a plurality of memory trenches UMT. Thereby, a plurality of memory pillars UMP are formed.

The condition for etching (e.g. RIE) for forming the holes UAH is set so as to etch SiO$_2$ (core layer 110 and tunnel insulation layer 108), SiN (charge storage layer 107) and Si (semiconductor layer 109).

Therefore, the sacrifice layer 111 is left on the multilayer body 50.

For example, in regions between the sacrifice layers 111 arranged in the X direction, upper portions of the insulation layers 122 in the lower-layer multilayer body 50 are etched by etching for forming the holes UAH.

At this time, end portions in the X direction of the top surfaces of the sacrifice layers 111 are also etched. Thus, stepped portions are formed on the top surfaces of the sacrifice layers 111.

As will be described below, in the present embodiment, a step of removing the sacrifice layer 111 is performed before insulation layers are formed in the holes UAH.

Figure 16:
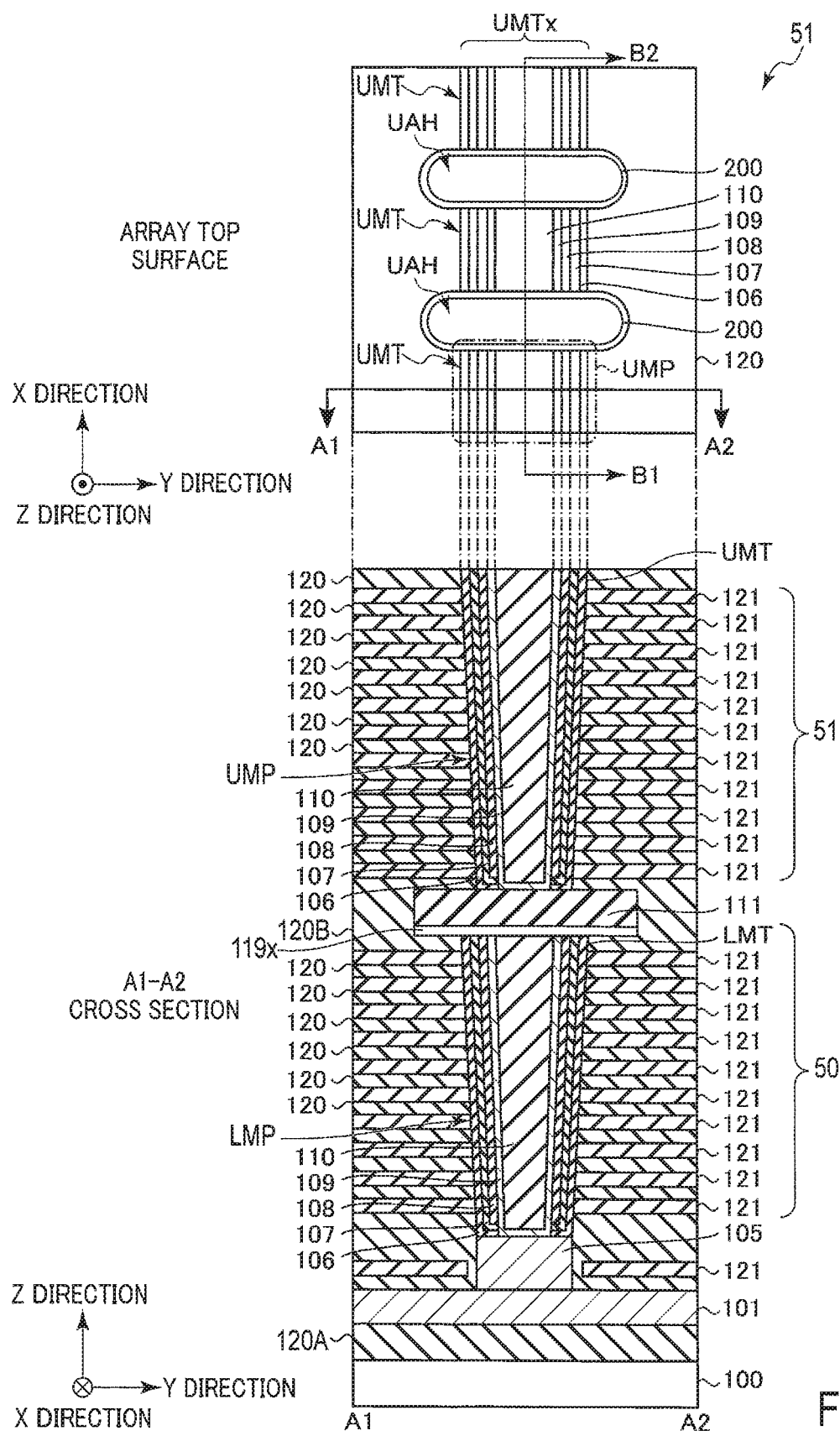
Figure 17:
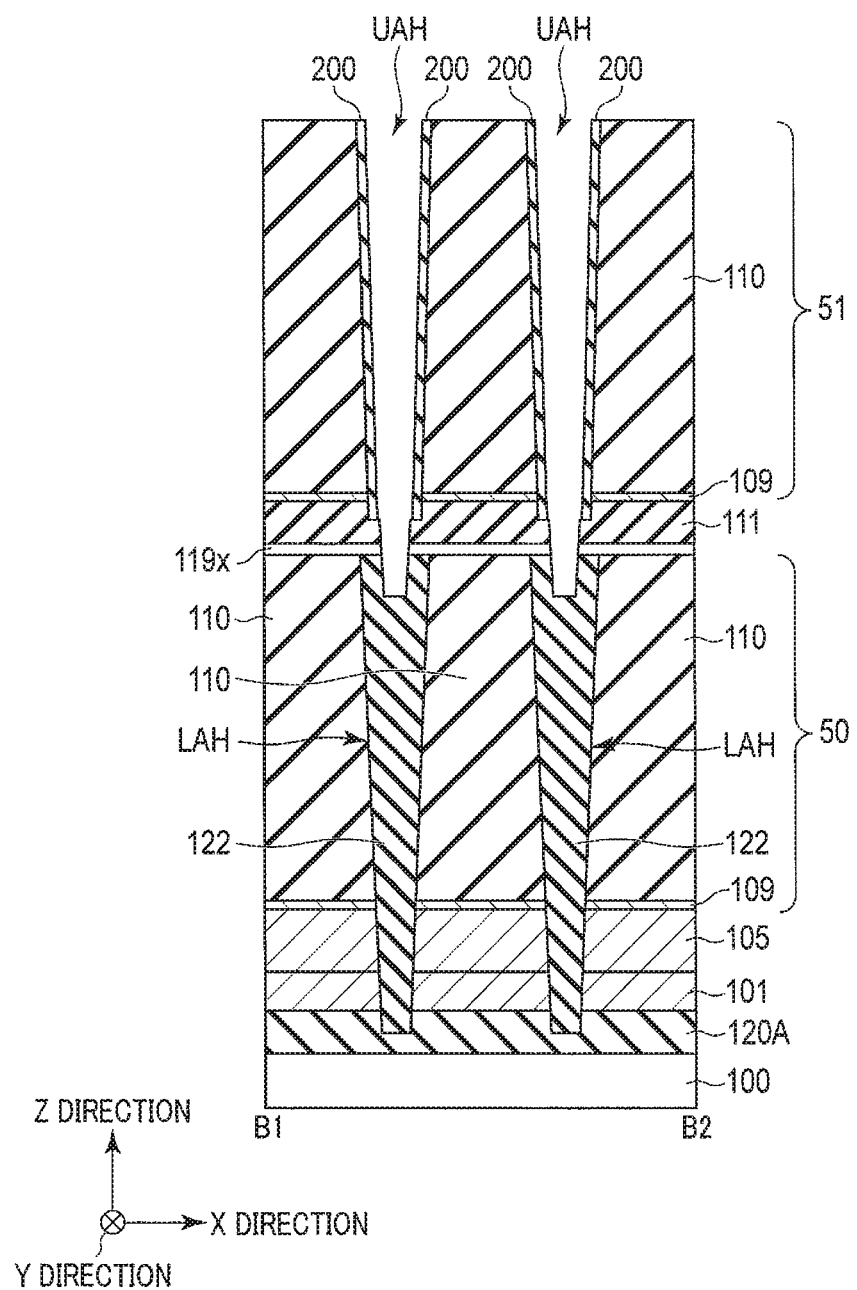

As illustrated in FIG. 16 and FIG. 17, a spacer layer (insulation layer) 200 is formed on the side surface of the multilayer body 50 in the hold UAH. The spacer layer 200 is, for example, SiO$_2$.

Etch-back is performed on the formed spacer layer 200. By this etch-back, the spacer layer 200 is removed from the bottom portion of the hole UAH and from the top surface of the multilayer body 51.

Thereby, side surfaces of the sacrifice layer 111 are exposed in the hole UAH (the region between the memory pillars neighboring in the X direction).

The spacer layer 200 is left on the side surface of the multilayer body 51 along the shape of the hole UAH. Thus, in the hole UAH, the side surfaces in the X direction of the memory pillar UMP (the respective layers of the memory pillar), insulation layers 120 and sacrifice layers 121 are covered with the spacer layer 200.

Figure 18:
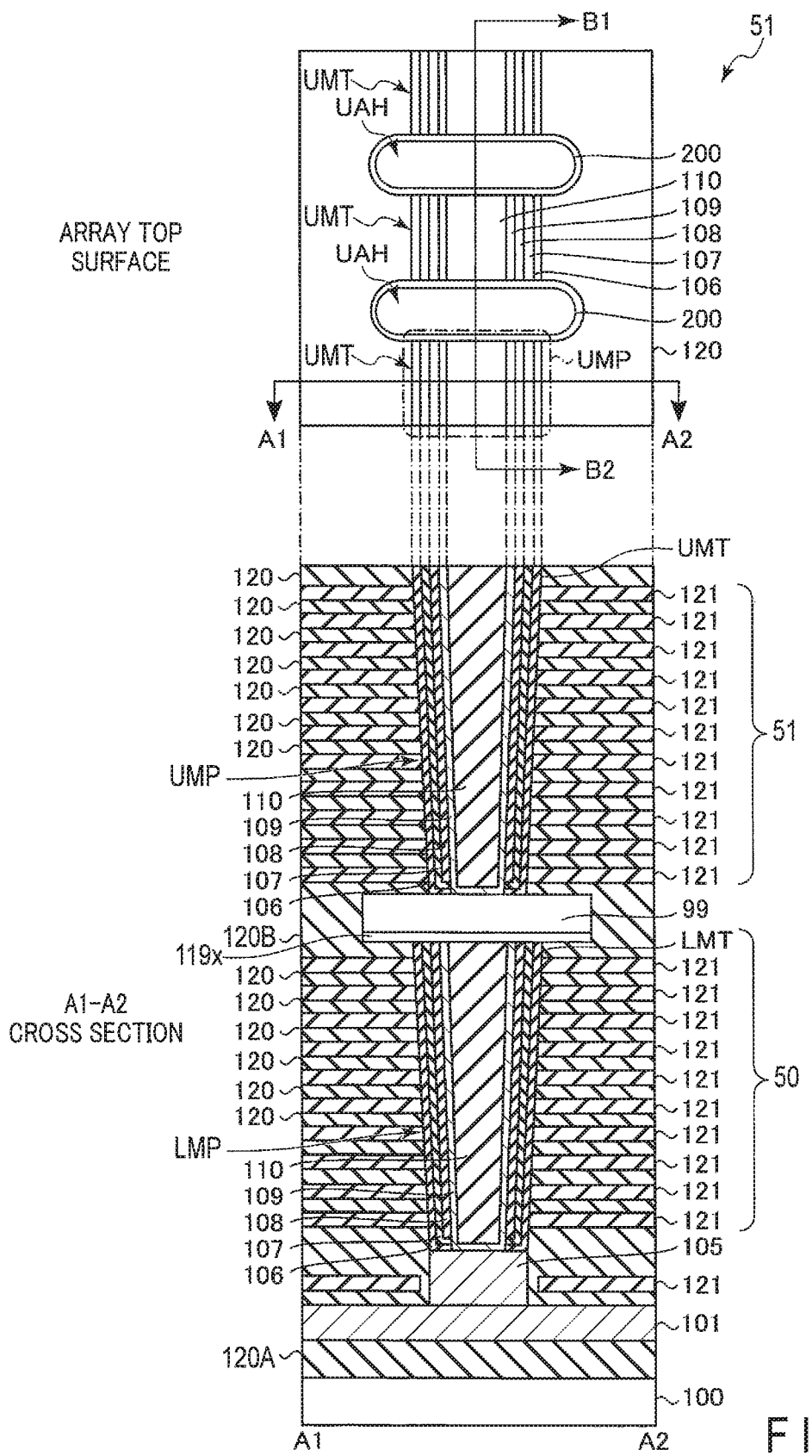
Figure 19:
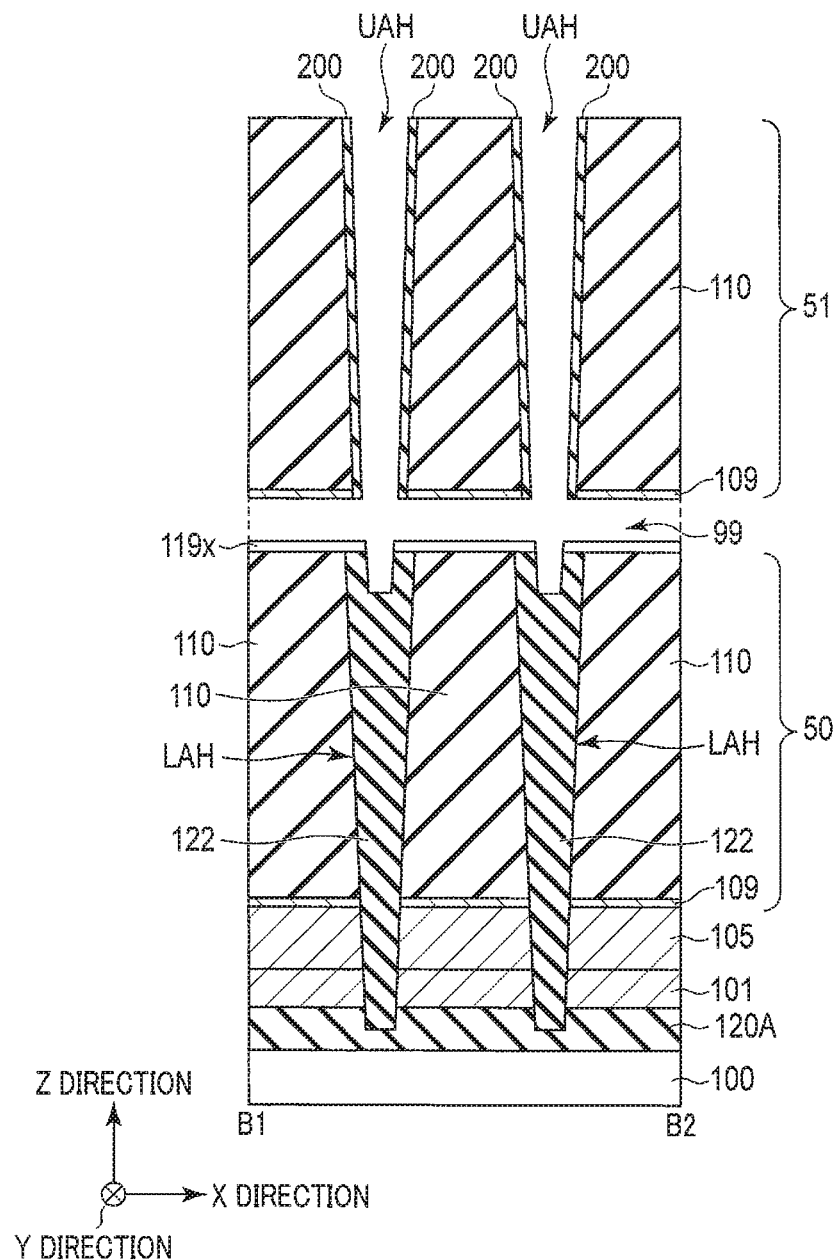

As illustrated in FIG. 18 and FIG. 19, the etching on the sacrifice layer between the stacked memory pillars is performed.

An etchant for etching the sacrifice layer 111 is supplied between the memory pillars LMP and UMP from the side-surface side of the sacrifice layer 111 via the hole UAH. When the sacrifice layer is an aluminum oxide layer, hot phosphoric acid ($H_3PO_4$) solution is used for etching.

Thereby, the sacrifice layer is selectively removed. Note that, by the spacer layer 200, the sacrifice layers 121 are not removed.

As a result, an air gap 99 is formed in the space corresponding to the sacrifice layer (i.e. the region between the memory pillars UMP and LMP in the Z direction).

Under the etching condition for the sacrifice layer, the semiconductor layer (amorphous silicon layer) 119x remains on the memory pillar UMP. The silicon layers 109 are left in the memory pillars UMP and LMP.

When a HfSiO layer is used for the sacrifice layer 111, the HfSiO layer is selectively removed, by hot phosphoric acid. When a W layer is used for the sacrifice layer 111, the W layer is selectively removed by SPM cleaning.

Figure 20:
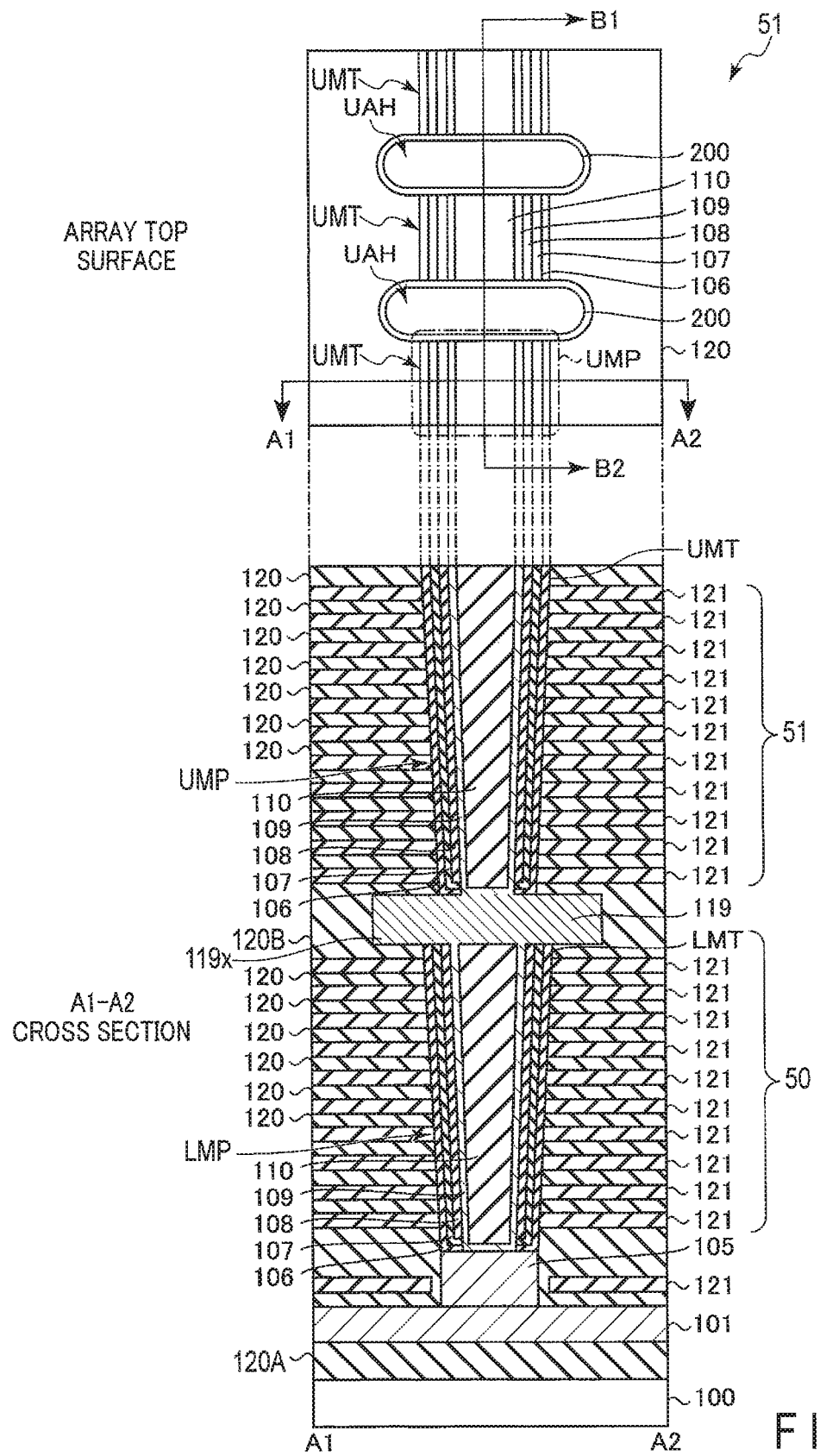
Figure 21:
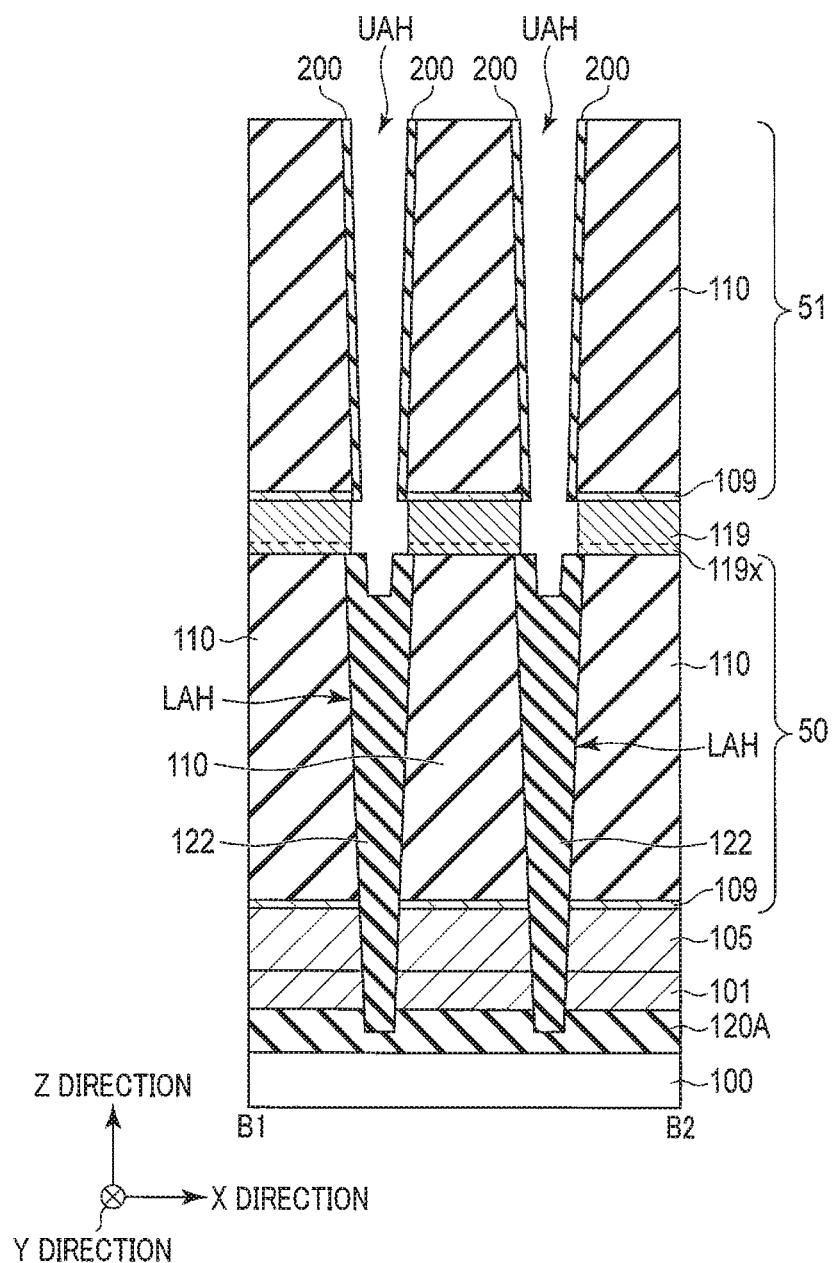

As illustrated in FIG. 20 and FIG. 21, a semiconductor layer (e.g. a silicon layer) is formed in the region (air gap) 99 by selective CVD.

For example, the semiconductor layer 119 grows from the semiconductor layer 119x and the semiconductor layer 109 of the memory pillar UMP as starting points.

Thereby, as illustrated in the above-described FIG. 6, the semiconductor layer 119 is formed in a manner to connect the memory pillar UMP and memory pillar LMP which are arranged in the Z direction. For example, the semiconductor layer 119 includes therein the air gap (void) Q1 or seam Q2. Note that the void is a gap occurring in the layer due to growth from a plurality of directions of the layer in a certain space.

For example, the semiconductor layer 119 is a layer which is continuous with the semiconductor layer 109. No seam is formed at a boundary between the semiconductor layer 119 and the semiconductor layer 109.

As a result, the contact resistance (interface resistance) between the semiconductor layer 119 and semiconductor layer 109 is reduced.

When the semiconductor layer 119x is not formed on the multilayer body 50, the semiconductor layer 119 selectively grows from the upper part of the semiconductor layer 109 of the memory pillar LMP as a starting point.

In the step of removing the sacrifice layer 111, there is a case in which the sacrifice layer 111 is not completely removed by wet etching. For example, the sacrifice layer remains at corners of the air gap 99. In this case, the conductive layer 119 has a rectangular cross-sectional shape with corners missing. At the corner portions of the conductive layer 119, the material of the sacrifice layer 111 is provided.

Thereafter, for example, etching may be performed in order to remove the parts of the semiconductor layer 119, which are formed under the contact hole UAH. Thereby, the semiconductor layer 119 is divided for each memory pillar UMP.

In this manner, the memory pillars LMP and UMP, which are stacked in the Z direction, are electrically connected by the semiconductor layer 119.

The insulation layer 122 is buried in the hole UAH.

Then, as illustrated in FIG. 5, the conductive layer 112 is formed on the memory pillar UMP. An insulation layer (not shown) is formed on the conductive layer 112 and insulation layer 122 so as to cover the conductive layer 112.

By the above-described backfill, the interconnects 102, 103 and 104 are formed.

More specifically, a slit (or hole), which is not shown, is formed in the multilayer body 50, 51 (e.g. in the regions of end portions of the multilayer body 50, 51), such that the side surfaces of the sacrifice layers 121 are exposed.

For example, wet etching using phosphoric acid ($H_3PO_4$) is performed. Thereby, the sacrifice layers 121 are etched via the slit, and the sacrifice layers 121 are removed. Thereby, the air gap is formed in the space between the insulation layers 120 of the multilayer body 50, 51.

Next, TiN and W are successively formed, and the air gaps between the insulation layers 120 are buried. The excess W and TiN on the insulation layers 120 on side faces and surfaces of the slits are removed.

In this manner, the interconnects 102, 103 and 104 functioning as word lines and select gate lines are formed by backfill.

Thereafter, an insulation layer is buried in the slit (not shown).

After the interconnects 102, 103 and 104 are formed, the conductive layer 112, bit lines BL, and contact plugs connected to the interconnects 102, 103 and 104 are successively formed.

By the above steps, the NAND flash memory of the present embodiment is completed.

(c) Conclusion

In the semiconductor memory of the present embodiment, the memory cell array has such a structure that a plurality of memory pillars are stacked in a direction perpendicular to the surface of the substrate.

A connection portion between the stacked memory pillars is formed by a replacement process from a sacrifice layer to a conductive layer.

In the fabrication steps of the semiconductor memory of the present embodiment, the sacrifice layer is formed between the stacked memory pillars. The conductive layer is formed in the region from which the sacrifice layer was removed.

By the formed conductive layer, the upper-layer memory pillar is connected to the lower-layer memory pillar.

When the conductive layer, which connects the two memory pillars, is formed as in the present embodiment, the resistance value (contact resistance/interface resistance) between the conductive layer and the memory pillar can be reduced. The semiconductor memory of the present embodiment can increase a current flowing between a bit line and a source line via connected memory pillars.

Thereby, in the semiconductor memory of the present embodiment, the characteristics of the semiconductor memory can be improved.

In addition, in the fabrication steps of the semiconductor memory of the present embodiment, when the upper-layer memory pillar is formed, the sacrifice layer (e.g. aluminum oxide layer) is provided between the lower-layer memory pillar and upper-layer memory pillar.

Thereby, in the fabrication steps of the semiconductor memory of the present embodiment, it is possible to prevent the members of the lower-layer memory pillar from being destroyed by the etching for forming the upper-layer memory pillar.

Therefore, according to the manufacturing method of the semiconductor memory of the present embodiment, the manufacturing yield of semiconductor memories can be improved.

(2) Second Embodiment

Referring to FIG. 22 to FIG. 30, a semiconductor memory according to a second embodiment and a manufacturing method thereof will be described.

Hereinafter, only different points from the first embodiment are described.

(a) Configuration

Figure 22:
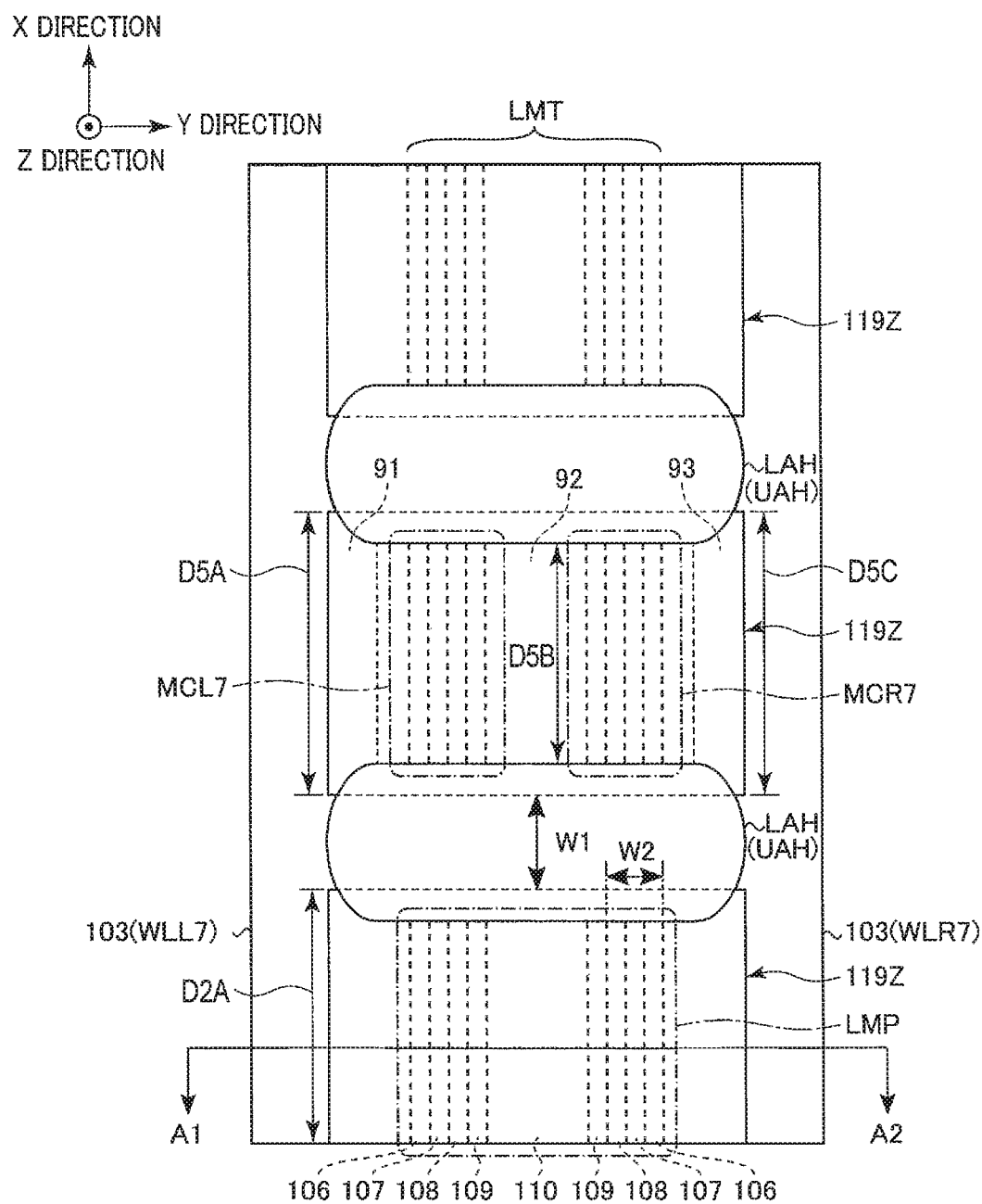
FIG. 22 is a view illustrating a configuration example of a semiconductor memory according to a second embodiment.

Referring to FIG. 22, a configuration example of the semiconductor memory of the present embodiment is described.

FIG. 22 is a schematic view for describing a plan-view structure of the semiconductor memory (e.g. NAND flash memory) of this embodiment.

FIG. 22 illustrates a plan-view structure of a conductive layer which connects two memory pillars.

As illustrated in FIG. 22, in the present embodiment, in the dew shape of a conductive layer 119z, the dimension in the X direction of the conductive layer 119z varies from an end portion toward a central portion in the Y direction of the conductive layer 119z.

In the plan-view shape of the conductive layer 119z, the conductive layer 119z has an arcuate shape in its sides (end portions) in the X direction. For example, the arcuate sides of the conductive layer 119z match with the plan-view shape of the hole UAH.

The conductive layer 119z includes a first portion 91, a second portion 92 and a third portion 93. The first to third portions 91, 92 and 93 are arranged in the Y direction. The second portion 92 is provided between the first portion 91 and third portion 93.

A maximum dimension D5B of the second portion 92 in the X direction is less than a maximum dimension D5A of the first portion 91 in the X direction and a maximum dimension D5C of the third portion 93 in the X direction.

The conductive layer 119z has a shape similar to the alphabetical character "H" in the view from Z direction (a direction perpendicular to a surface of the substrate). In the present embodiment, the conductive layer 119z is also referred to as "H-shaped conductive layer 119z".

The plan-view shape of the conductive layer 119z is formed by a manufacturing method of the semiconductor memory, which is based on FIG. 23 to FIG. 30 below.

(b) Manufacturing Method.

Referring to FIG. 23 to FIG. 30, the manufacturing method of the semiconductor memory of the present embodiment is described.

Figure 23:
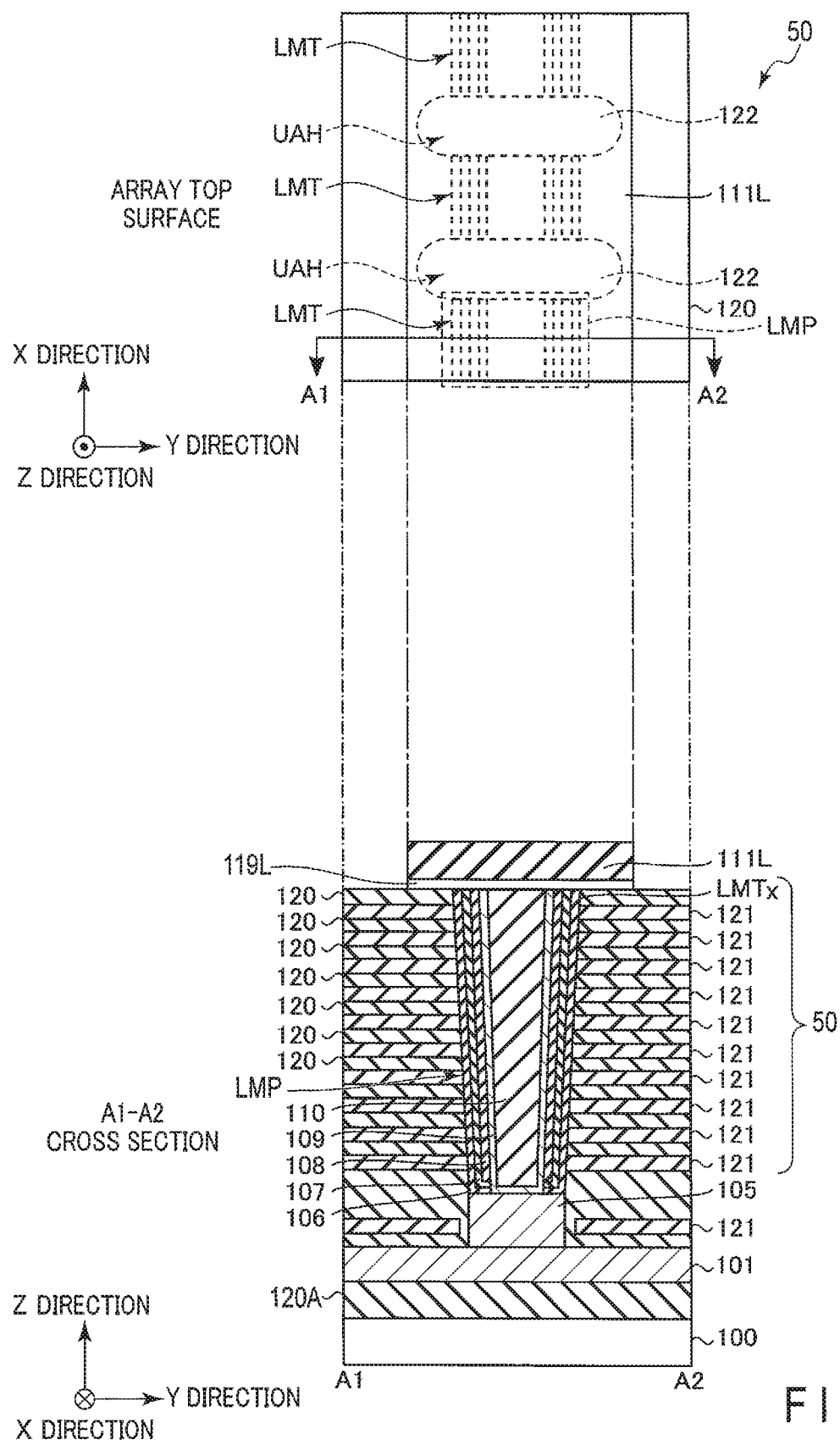
Figure 24:
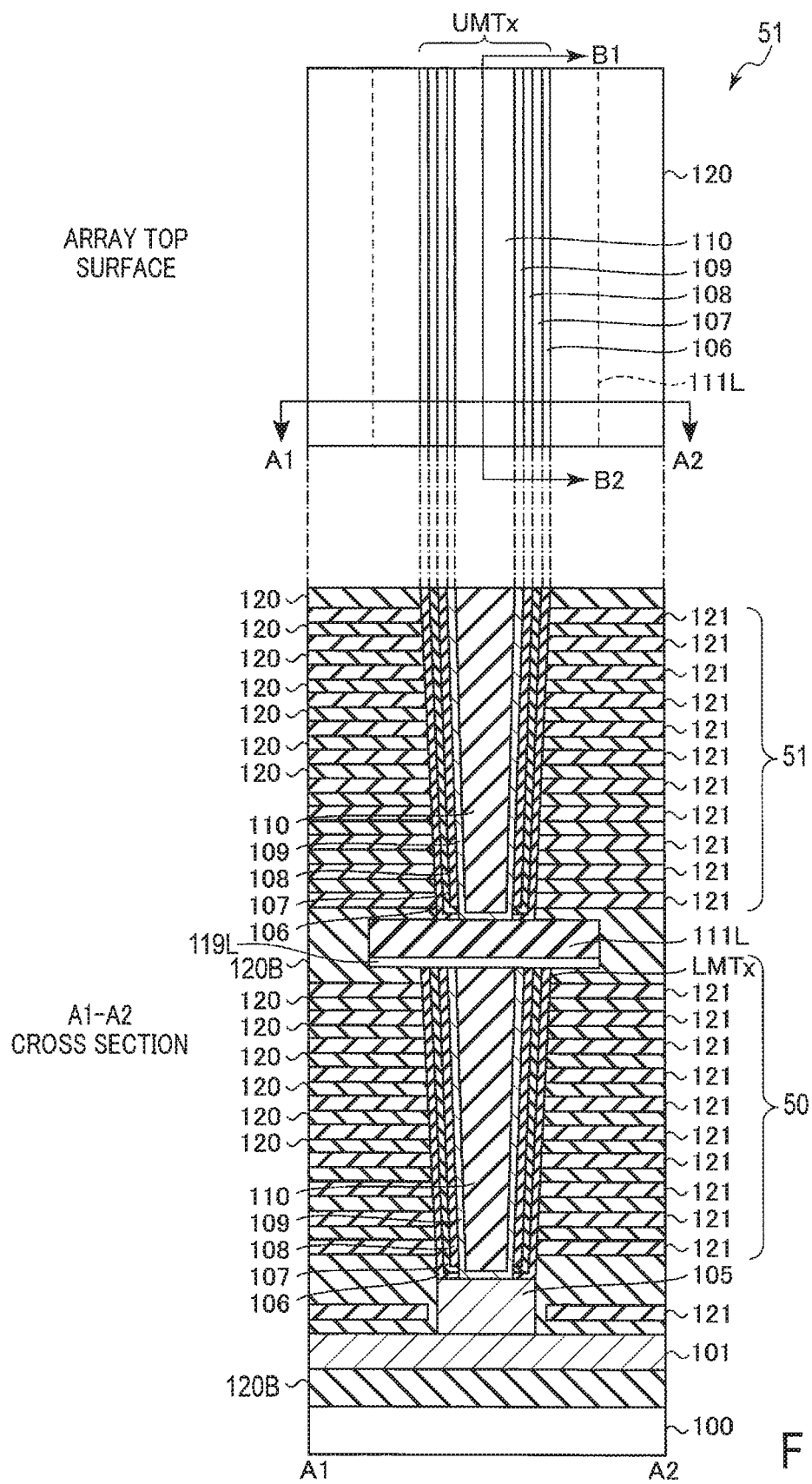
Figure 27:
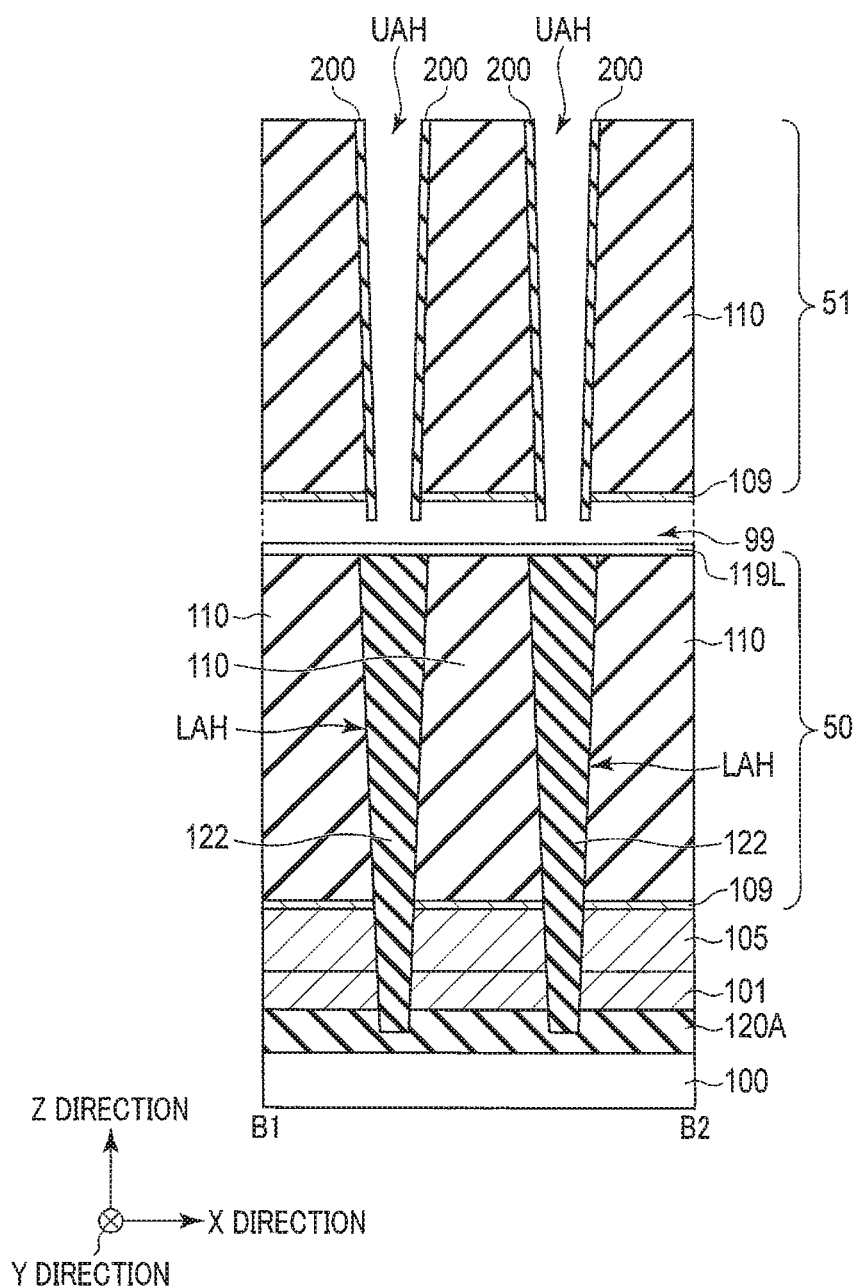
Figure 28:
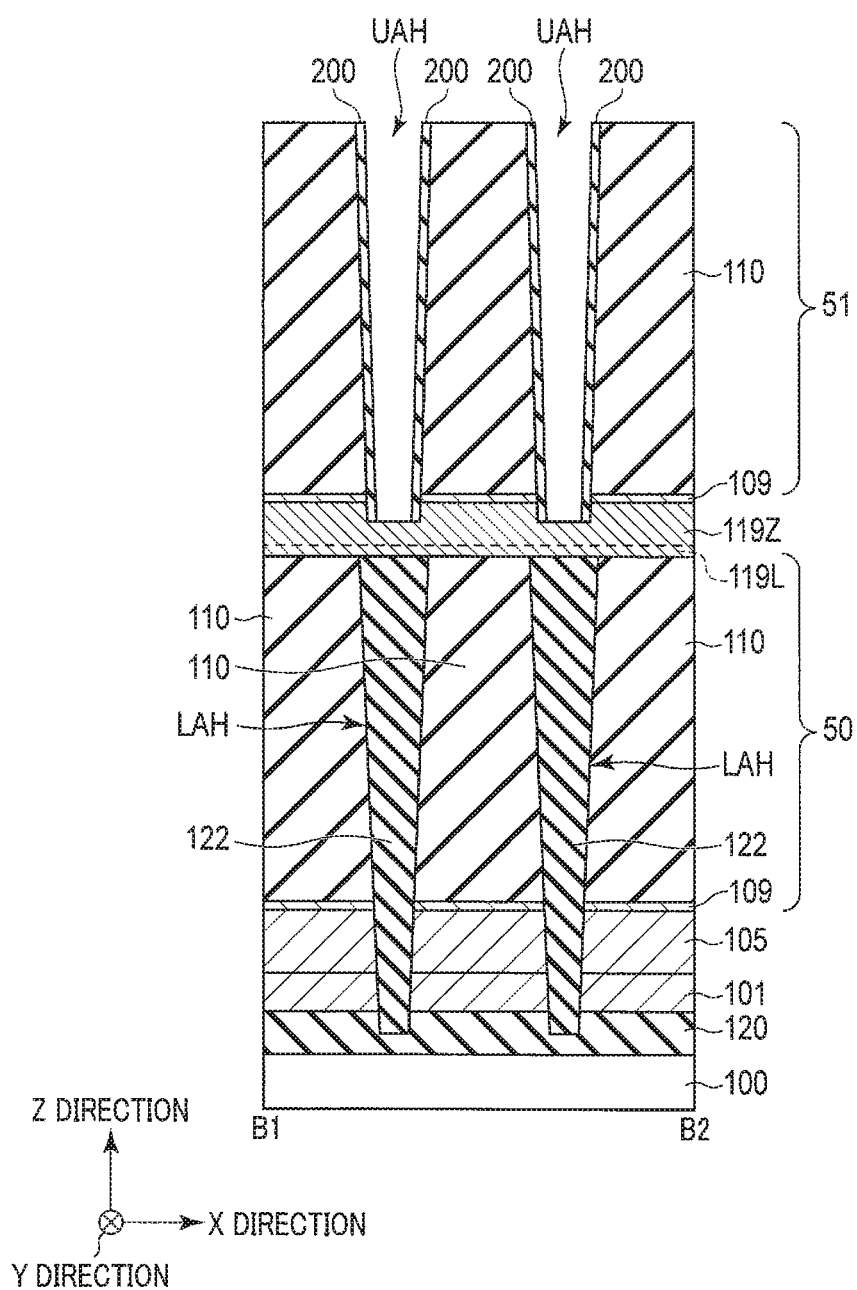
Figure 29:
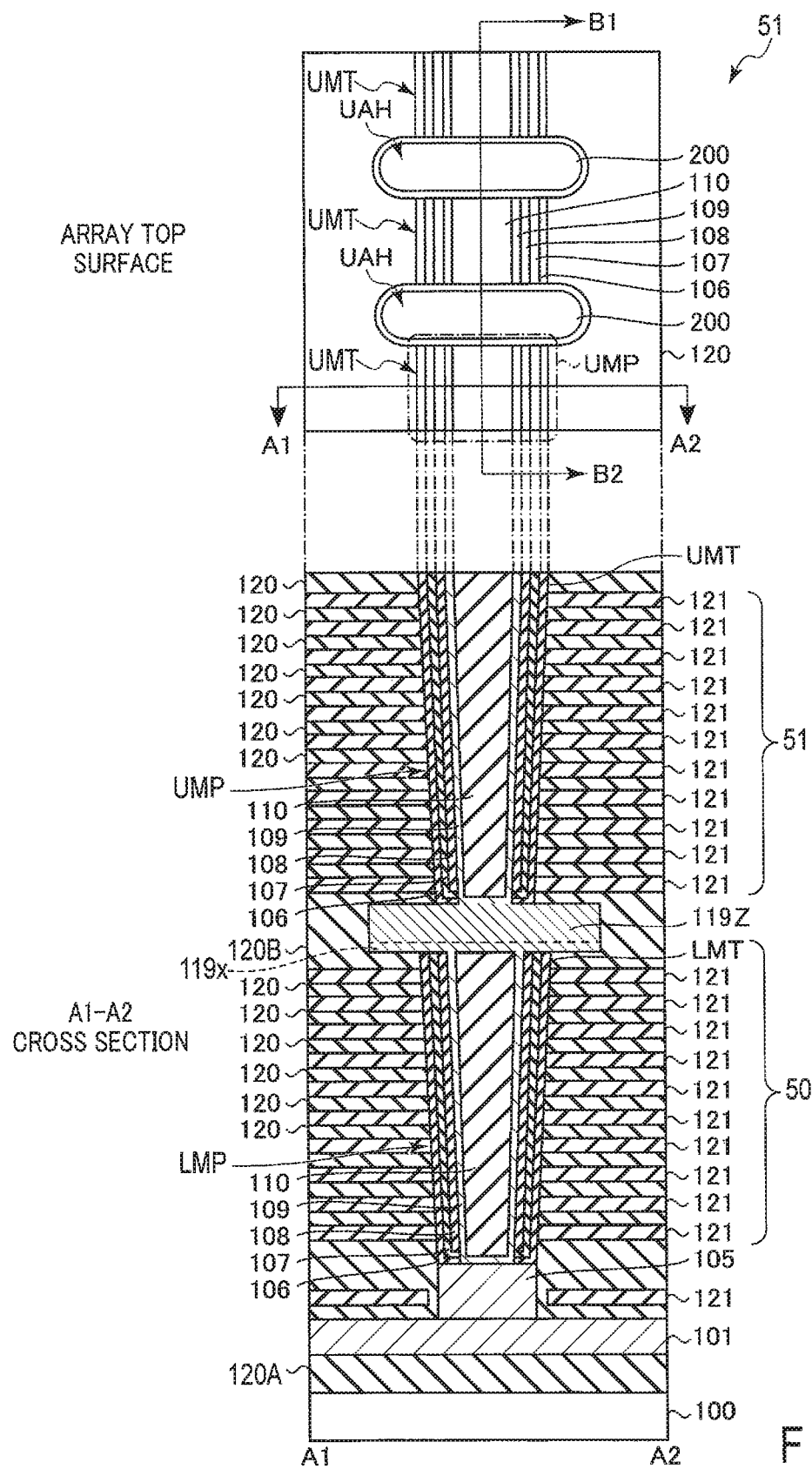

FIG. 23 to FIG. 30 are views for describing the fabrication steps of the memory cell array by the manufacturing method of the semiconductor memory of the present embodiment. FIG. 23, FIG. 24 and FIG. 29 illustrate top surfaces of the memory cell array and A1-A2 cross sections of the memory cell array in the respective fabrication steps of the manufacturing method of the semiconductor memory of the present embodiment. FIG. 25, FIG. 26, FIG. 27, FIG. 28 and FIG. 30 illustrate cross sections along lines B1-B2 of the memory cell array.

As illustrated in FIG. 23, like the fabrication steps of FIG. 7 to FIG. 10 of the first embodiment, the respective layers of the memory pillar LMP are formed in the multilayer body 50. Insulation layers 122 are formed in the multilayer body 50 in regions between the memory pillars LMP which are arranged in the X direction. Thereby, the memory pillars LMP are formed.

A sacrifice layer (e.g. an aluminum oxide layer) 111L is formed on the multilayer body 50. In the present embodiment, the sacrifice layer 111L extends in the X direction in a manner to extend over the plural memory pillars LMP (and plural insulation layers 122).

For example, a semiconductor layer (silicon layer) 119L is formed between the sacrifice layer 111L and the multilayer body 50. Like the sacrifice layer 111L, the semiconductor layer 119L extends in the X direction.

As illustrated in FIG. 24 and FIG. 25, like the fabrication steps of FIG. 12 and FIG. 13 of the first embodiment, an insulation layer 120B is formed on the sacrifice layer 119L and multilayer body 50.

A multilayer body 51 is formed on the insulation layer 120B. A trench UMTx extending in the X direction is formed in the multilayer body 51.

A block insulation film 106, a charge storage layer 107, a tunnel insulation layer 108, a semiconductor layer 109 and a core layer 110 are successively formed in the trench UMTx. The semiconductor layer 109 is interposed between the core layer 110 and sacrifice layer 111L. The semiconductor layer 109 is put in contact with the top surface of the sacrifice layer 111L.

Figure 26:
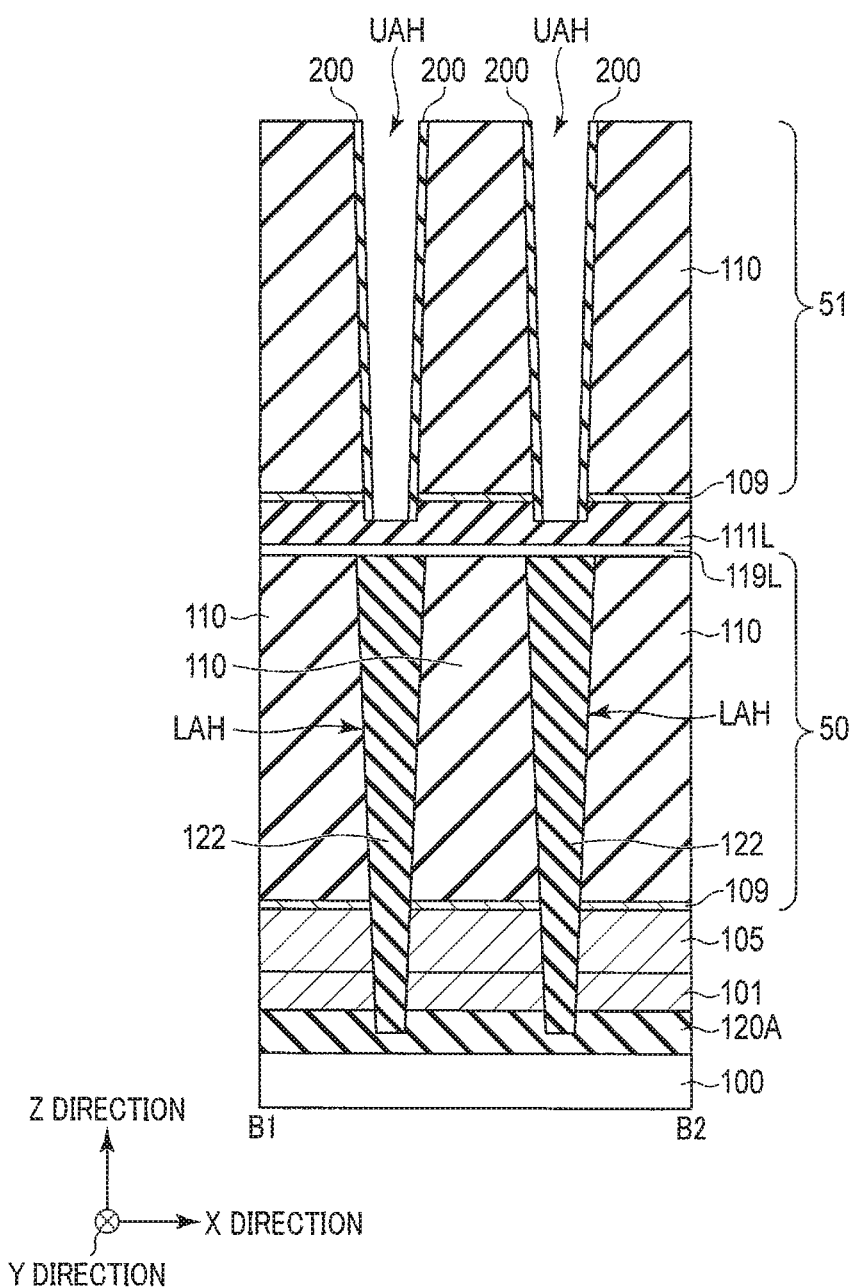

As illustrated in FIG. 26, like the fabrication steps of FIG. 14 and FIG. 15 of the first embodiment, the holes UAH are formed in the multilayer body 51. Thereby, the trench UMTx extending in the X direction is divided into a plurality of memory trenches LMT (see FIG. 14). The memory pillar UMP is formed in each memory trench UMT.

When the holes UAH are formed, the top surface of the sacrifice layer 111L is partly etched. Thereby, stepped portions are formed on the top surface of the sacrifice layer 111L in parts corresponding to the formation regions of the holes UAH.

Like the fabrication steps of FIG. 16 and FIG. 17 of the first embodiment, after an insulation layer is formed on the multilayer body 51, etch-back is performed on this insulation layer. Thereby, in the hole UAH, the spacer layer 200 is formed on the side surface of the multilayer body 51 (see FIG. 16). The spacer layer 200 covers the side surfaces of the memory pillar UMP in the X direction.

By etch-back, the insulation layer (protection film 200) at the bottom part of the hole UAH is removed. Thus, in the hole UAH, the top surface of the sacrifice layer 111L is exposed.

In the step of FIG. 26, the top surface of the insulation layer 122 in the multilayer body 50 is covered with the sacrifice layer (linear sacrifice layer) 111L extending in the X direction.

Note that the top surface of the memory cell array and the cross section along A1-A2 in the step of FIG. 26 are substantially the same as in the steps illustrated in FIG. 14 and FIG. 15.

As illustrated in FIG. 27, like the fabrication steps of FIG. 18 and FIG. 19 of the first embodiment, the sacrifice layer is selectively removed by etching via the holes UAH.

Thereby, an air gap 99 is formed in the region between the memory pillars UMP and LMP which are stacked in the Z direction (see FIG. 18).

The semiconductor layer 119L remains on the multilayer body 50.

In the multilayer body 51, the semiconductor layer 109 remains on the bottom part of the core layer 110.

As illustrated in FIG. 28, like the steps of FIG. 20 and FIG. 21 of the first embodiment, a semiconductor layer 119Z is formed by selective CVD (e.g. selective epitaxial growth) (see FIG. 20). The semiconductor layer 119Z is formed from the semiconductor layer 119L and semiconductor layer 109 as starting points.

In the present embodiment, since the semiconductor layer 119L, which is the starting point of formation of the layer, extends in the X direction, the semiconductor layer 119Z is also formed to extend in the X direction. A semiconductor layer 119Z extends over the plural memory pillars UMP and plural holes UAH which are arranged in the X direction.

Figure 30:
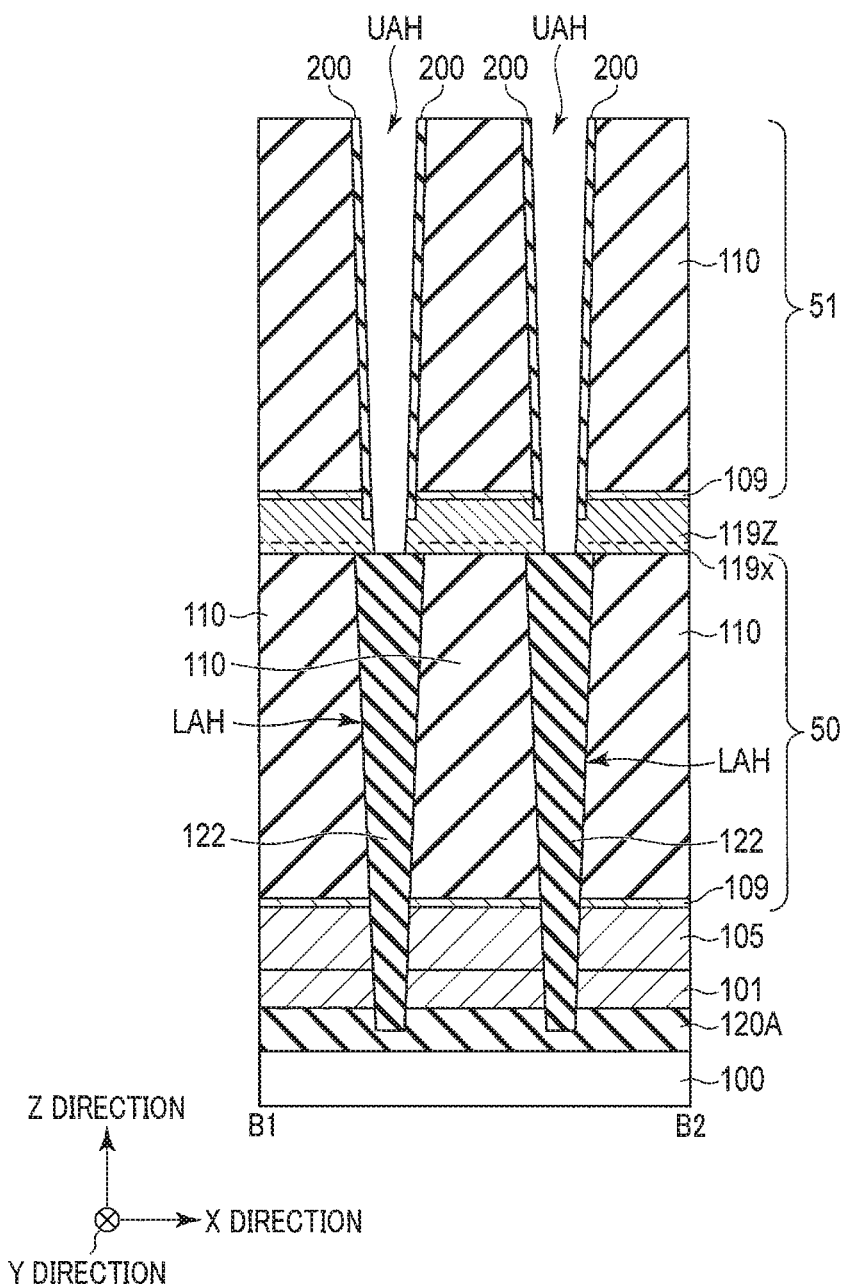

As illustrated in FIG. 29 and FIG. 30, a part of the semiconductor layer 119Z at the bottom portion of the hole UAH is removed by etching (e.g. RIE: Reactive Ion Etching) via the hole UAH.

Thereby, the semiconductor layer 119Z is isolated for each memory pillar UMP.

By the etching via the hole UAH, the plan-view shape of the semiconductor layer 119Z matches with the plan-view shape of the hole UAH.

Therefore, in the present embodiment, the shape of the end portions in the X direction of the semiconductor layer 119Z becomes arcuate. The X-directional dimension of the end portions (first and third portions) in the Y direction of the semiconductor layer 119Z is greater than the X-directional dimension of the central portion (second portion) of the semiconductor layer 119Z. For example, the semiconductor layer 119Z has an H-shaped plan-view shape.

Thereafter, like the first embodiment, an insulation layer is buried in the hole UAH. The formation of the conductive layer 112, the backfill of the interconnects 102, 103 and 104, and the formation of the contact 113 and bit lines are successively performed.

By the above fabrication steps, the NAND flash memory of the present embodiment is completed.

The semiconductor memory of the present embodiment has substantially the same advantageous effects as in the first embodiment.

(3) Third Embodiment

Referring to FIG. 31 to FIG. 47, a semiconductor memory according to a third embodiment and a manufacturing method thereof will be described.

In the third embodiment, a case in which a memory pillar is formed in a hole is described.

Hereinafter, only different points from the first and second embodiments are described.

(a) Configuration Example

Referring to FIG. 31, a configuration example of the semiconductor memory of the present embodiment is be described.

FIG. 31 is a view for describing a plan-view structure of the memory cell array 11 of the semiconductor memory of the present embodiment. FIG. 31 illustrates a plan-view shape of a conductive layer 119 in an X-Y plane which is parallel to the surface of the semiconductor substrate 100. In the example of FIG. 31, depiction of interlayer insulation films is omitted.

As illustrated in FIG. 31, a word line WLL7 (interconnect 103) and a word line WLR7 (interconnect 103) extending in the X direction are disposed so as to neighbor in the Y direction. A plurality of holes LAH are provided along the X direction between the word line WLL7 and word line WLR7. Memory pillars LMP are provided in the holes LAH. The memory pillar LMP includes a block insulation film 106, a charge storage layer 107, a tunnel insulation layer 108, a semiconductor layer 109 and a core layer 110.

The word line WLL7 and word line WLR7 are isolated in the Y direction by a trench LMTx extending in the X direction.

In the present embodiment, an insulation layer 123 is provided in the trench LMTx. The insulation layer 123 extends in the X direction.

The memory pillar LMP is isolated by the trench LMTx into a part of a left region and a part of a right region in the X direction. In the example of FIG. 31, a memory cell MCL7 is formed by a region (part) including the word line WLL7 and the left region of the memory pillar LMP, and a memory cell MCR7 is formed by a region (part) including the word line WLR7 and the right region of the memory pillar LMP. The insulation layer 123 is provided between two core layers 110 in the Y direction. In the description below, when two regions (parts) of the memory pillar, which are divided by the insulation layer, are distinguished, one of the regions is referred to as "left-side pillar", and the other region is referred to as "right-side pillar".

A dimension D1Y of the trench LMTx in the Y direction is less than an inside diameter D2Y in the Y direction of the semiconductor layer 109 before the division of the semiconductor layer 109 (or a dimension in the Y direction of the core layer 110 before the division of the core layer 110), so that the semiconductor layer 109 of the channel region of the memory cells MC may not be removed.

The dimension of the trench LMTx in the Y direction is less than the dimension between the semiconductor layers 109 which are disposed in the Y direction with the insulation layer 123 being interposed.

The conductive layer 119 is provided on the memory pillar LMP so as to cover the top surface of the memory pillar LMP. The conductive layer 119 has a plan-view shape of a rectangular shape (a race track shape, a circular shape, or an elliptic shape).

Dimensions DA and DB in the X direction and Y direction of the conductive layer 119 are greater than a dimension (dimension in the X direction of the memory pillar) DC in the X direction of the memory hole LAH.

As in FIG. 4 of the first embodiment, it is preferable that the distance W1 between two conductive layers 119 arranged in the X direction and the total dimension (film thickness) W2 of the block insulation film 106, charge storage layer 107 and tunnel insulation layer 108 in the Y direction have the relationship of $W1 \leq 2 \times W2$.

Figure 32:
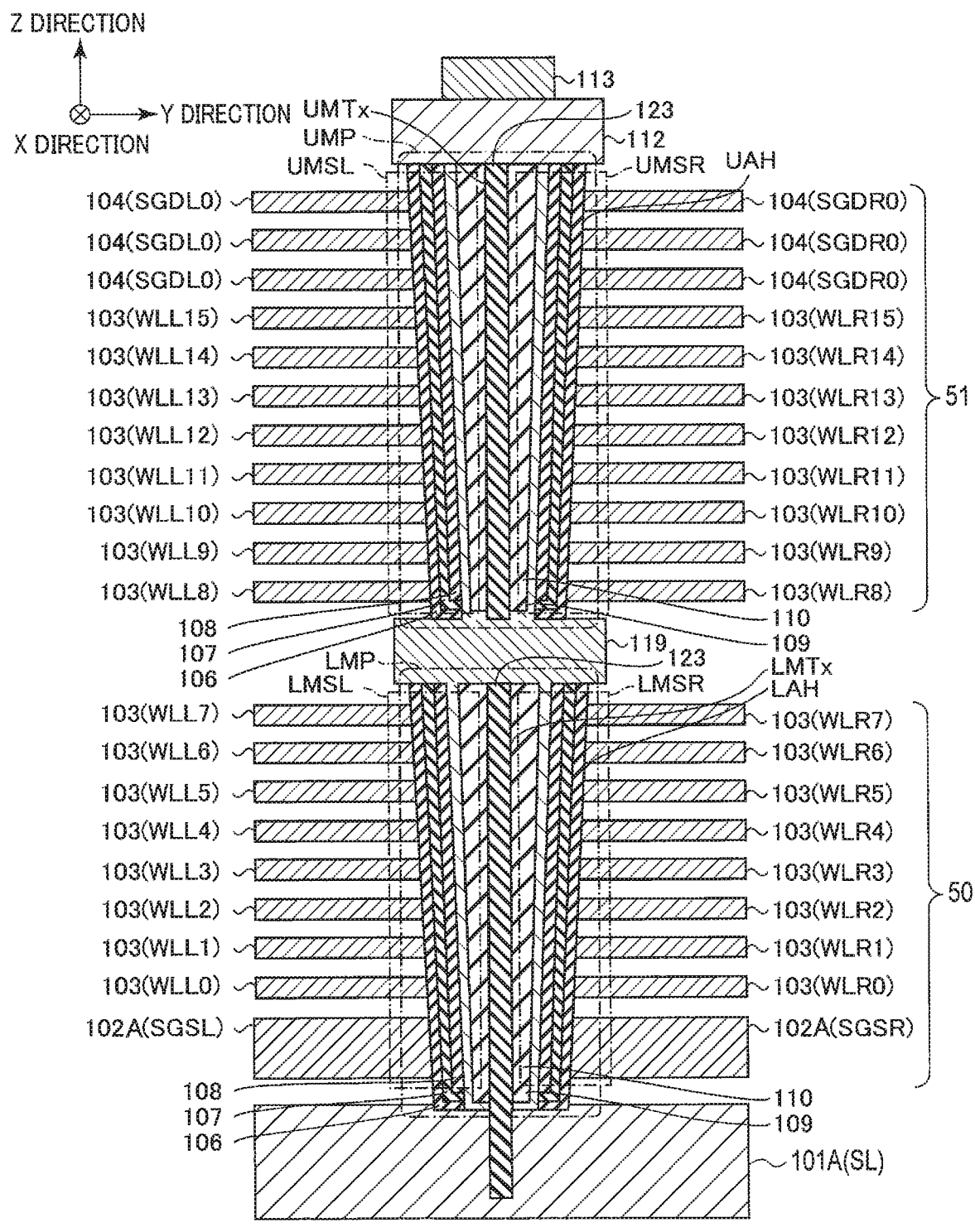

FIG. 32 is a view for describing a cross-sectional structure of the memory cell array 11 of the semiconductor memory of the present embodiment. In FIG. 32, depiction of interlayer insulation films is omitted.

As illustrated in FIG. 32, the hole LAH is provided on the semiconductor layer 105. In the hole LAH, the block insulation film 106, charge storage layer 107, tunnel insulation layer 108, semiconductor layer 109 and core layer 110 are provided. Thereby, the memory pillar LMP is formed. The trench LMTx is provided in a manner to separate the memory pillar LMP into two parts in the X direction. The bottom surface of the memory trench LMTx reaches the semiconductor layer 105.

The insulation layer 123 is provided in the trench LMTx. SiO$_2$, for instance, is used for the insulation layer 123. The insulation layer 123 is provided between the core layers 110 in the Y direction. The insulation layer 123 is provided between the semiconductor layer 109 of the right-side pillar and the semiconductor layer 109 of the left-side pillar.

The conductor layer 119 is provided on the memory pillar LMP.

Holes UAH are provided on the conductor layer 119. Memory pillars UMP are provided in the holes UA. The memory pillar UMP includes the block insulation film 106, charge storage layer 107, tunnel insulation layer 108, semiconductor layer 109 and core layer 110.

The trench UMTx is provided in a manner to separate the memory pillar UMP into two parts in the X direction. The bottom surface of the memory trench UMTx reaches the conductive layer 119. The insulation layer 123 is provided in the trench UMT.

Like the memory pillar LMP, the memory pillar UMP includes a right-side pillar and a left-side pillar. The insulation layer 123 is provided between the semiconductor layer 109 of the right-side pillar and the semiconductor layer 109 of the left-side pillar in the memory pillar UMP. In the multilayer body 51, the bottom surface of the insulation layer 123 is put in direct contact with the conductive layer 119.

The plane shape of the memory pillar UMP, LMP includes an arcuate (curved) portion. For example, in each memory pillar UMP, LMP, the right-side/left-side pillar includes a semicircular plan-view shape (arcuate plan-view shape).

As illustrated in FIG. 32, the source lines SL and select gate lines SGS may have a structure (e.g. a buried source line structure) which is different from the structure of the source lines and select gate lines of the first and second embodiments.

For example, the conductive layer 119 has the structure illustrated in FIG. 6.

Three or more stages of memory pillars MP may be stacked. In this case, conductive layers 119 are provided between the respective memory pillars MP.

(b) Manufacturing Method

Referring to FIG. 33 to FIG. 46, the manufacturing method of the semiconductor memory of the present embodiment is described.

FIG. 33 to FIG. 46 are cross-sectional views of fabrication steps for describing the fabrication steps of the memory cell array by the manufacturing method of the semiconductor memory of the present embodiment.

FIG. 33 to FIG. 38, FIG. 40, FIG. 42, FIG. 44 and FIG. 46 illustrate top surfaces of the memory cell array and A1-A2 cross sections of the memory cell array in the respective fabrication steps of the manufacturing method of the semiconductor memory of the present embodiment. FIG. 39, FIG. 41, FIG. 43, FIG. 45 and FIG. 47 illustrate cross sections along lines A1-B2 of the memory cell array.

Figure 33:
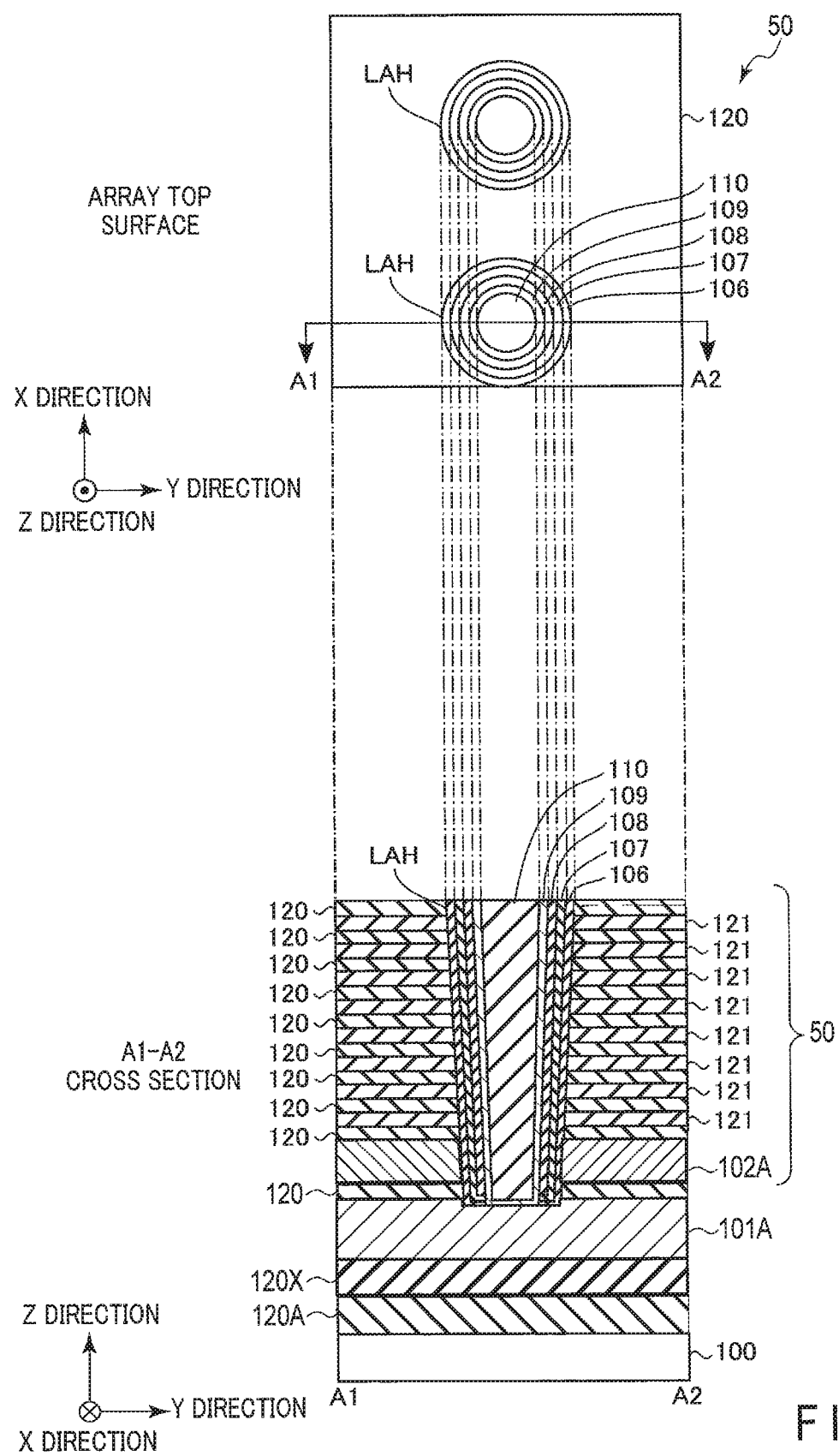

As illustrated in FIG. 33, a sacrifice layer (stopper layer) 120X is formed on the insulation layer 120A. The sacrifice layer 120X is, for example, an aluminum oxide layer.

A conductive layer (e.g. a polysilicon layer) 101A, which functions as a source line, is formed on the sacrifice layer 120X.

An insulation layer 120 is formed on the conductive layer 101A. A conductive layer 102A is formed on the insulation layer 120.

Like the fabrication step of FIG. 7 of the first embodiment, the multilayer body 50 including a plurality of sacrifice layers 121 and a plurality of insulation layers 120 is formed.

Holes LAH are formed in the multilayer body 50 such that the bottom surfaces of the holes LAH reach the interconnect 101A.

The block insulation film 106, charge storage layer 107 and tunnel insulation layer 108 are formed in the hole LAH in the named order from the side-surface side of the multilayer body 50. After the layers 106, 107 and 108 on the interconnect 101A are removed, the semiconductor layer 109 and core layer 110 are formed in the hole LAH. Thereby, the memory pillar LMP is formed in the hole LAH. The excess layers on the insulation layer 120 are removed.

Figure 34:
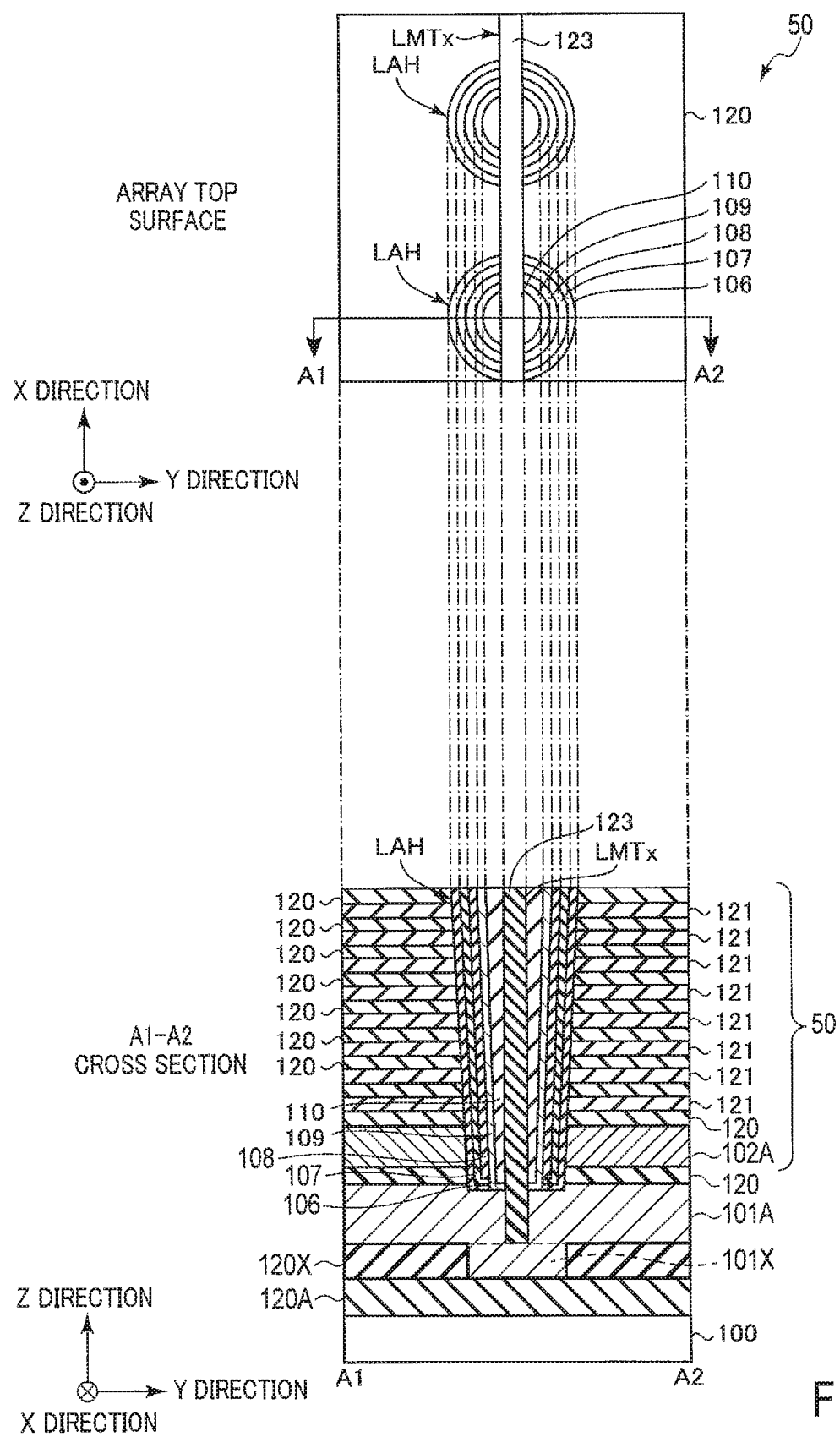

As illustrated in FIG. 34, a trench LMTx extending in the X direction is formed in the multilayer body 50 by etching. For example, the bottom portion of the trench LMTx reaches the stopper layer 120X.

Thereafter, a spacer layer (not shown) is formed on that part of the conductive layer (source line) 101A, which is exposed to the trench LMTx.

The stopper layer 120X is retreated in the Y direction by selective etching (e.g. wet etching) via the trench LMTx. Thereby, a space (air gap) is formed between the bottom portion of the conductive layer 101A and the top surface of the insulation layer 120A.

By selective CVD (Chemical Vapor Deposition) (e.g. selective epitaxial growth), a conductive layer 101X is formed in the space between the conductive layer 101A and insulation layer 120A. Thereby, the conductive layers 101A and 101X become a continuous layer extending across the bottom portion of the trench LMTx.

An insulation layer 123 is buried in the trench LMTx. Thereby, the memory pillar LMP is separated into two parts (left-side pillar and right-side pillar) in the X direction.

Figure 35:
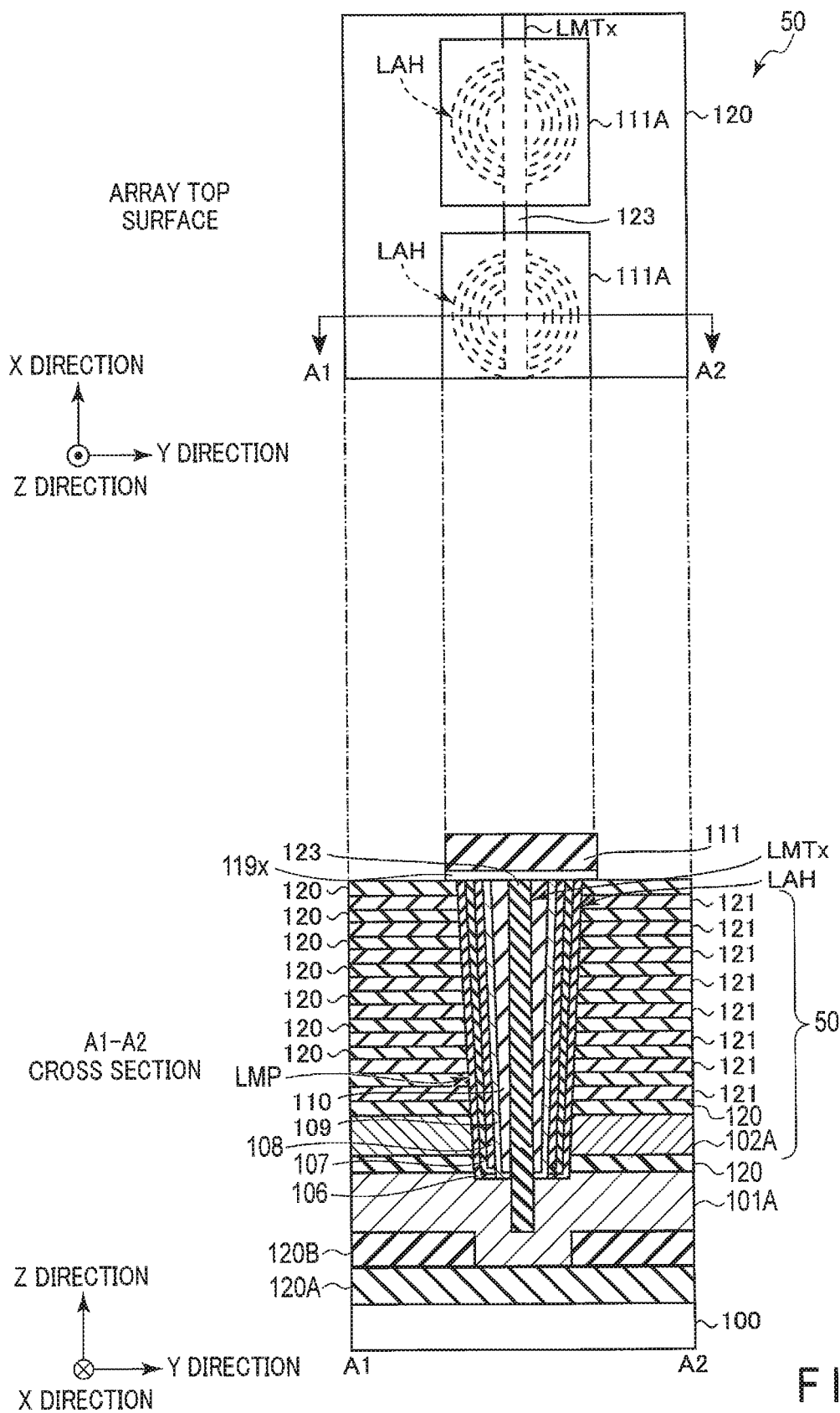

As illustrated in FIG. 35, like the fabrication step of FIG. 9 of the first embodiment, a sacrifice layer 111 is formed on the memory pillar LMP. The sacrifice layer 111 has a rectangular plan-view shape.

For example, like the first and second embodiments, a semiconductor layer 119x is formed between the sacrifice layer 111 and multilayer body 50.

Figure 36:
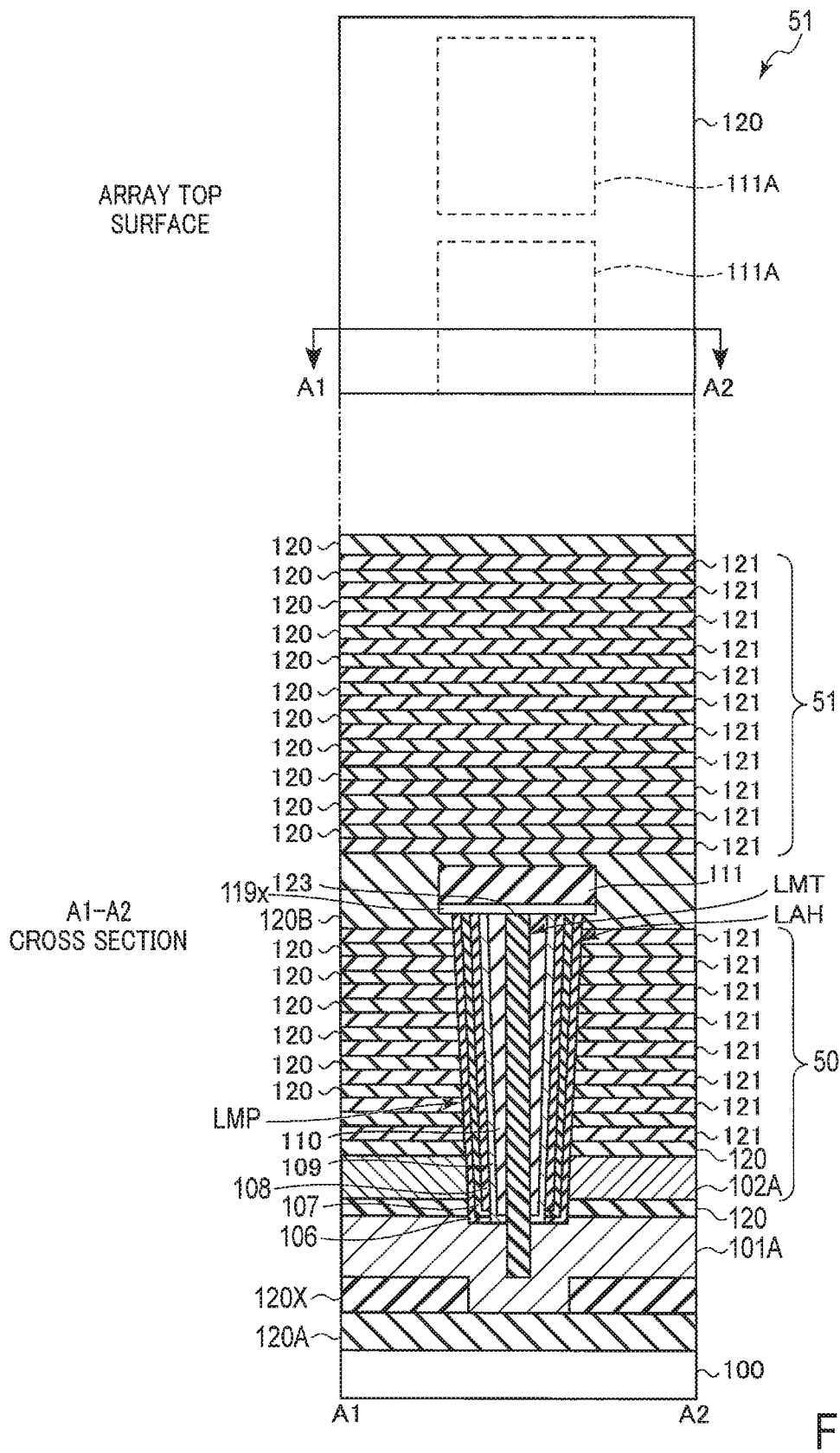

As illustrated in FIG. 36, like the example of FIG. 11, an insulation layer 120B is formed on the sacrifice layer 111 and on the multilayer body 50 so as to cover the sacrifice layer 111. Eleven sacrifice layers 121 and eleven insulation layers 120 are alternately stacked on the insulation layer 120B. Thereby, a multilayer body 51 is formed. The eleven sacrifice layers 121 correspond to eight interconnects 103 and three interconnects 104.

Figure 37:
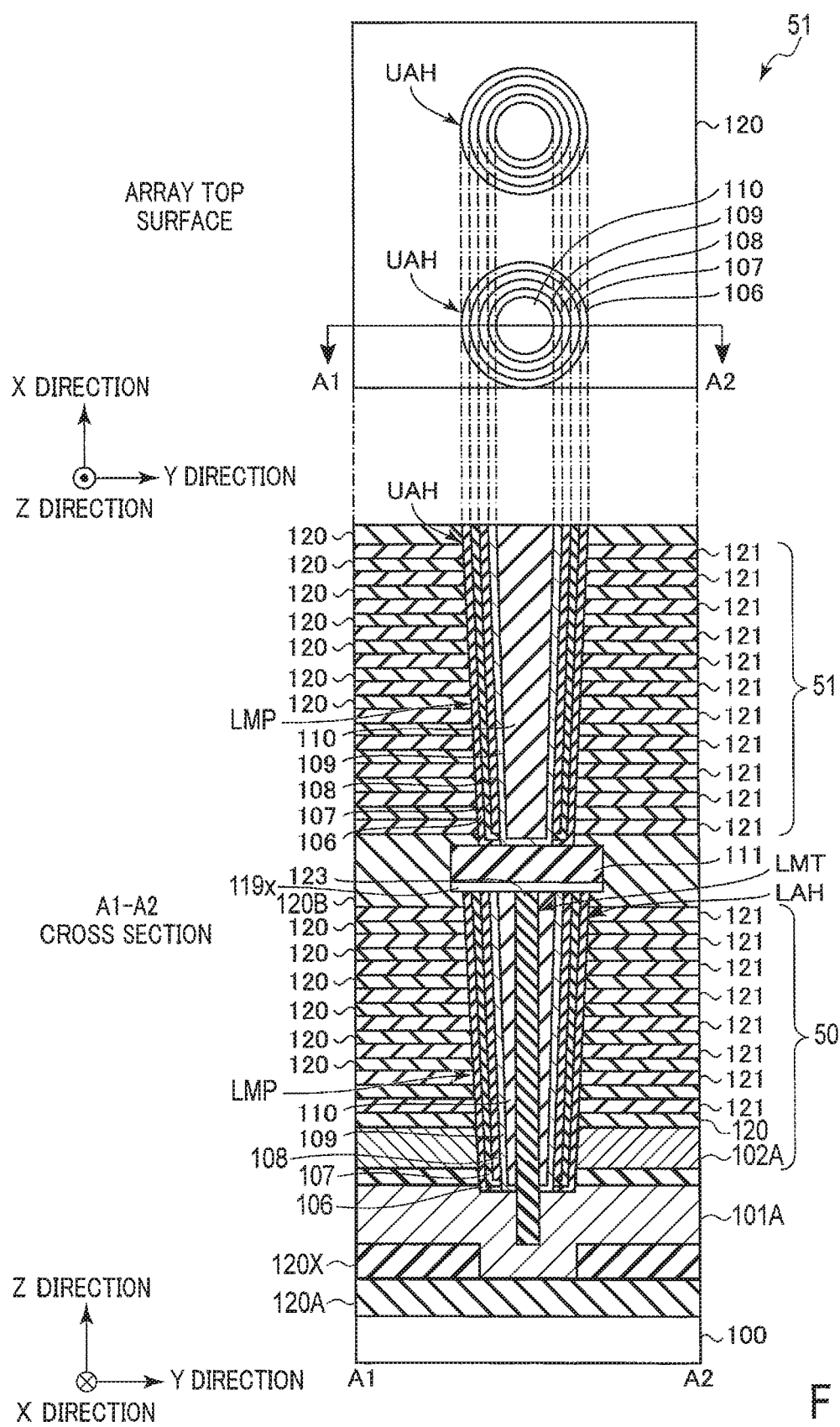

As illustrated in FIG. 37, holes UAH are formed in the multilayer body 51 such that the bottom surfaces of the holes UAH reach the sacrifice layer 111.

Thereafter, like the fabrication step of FIG. 33, the block insulation film 106, charge storage layer 107, tunnel insulation layer 108, semiconductor layer 109 and core layer 110 are formed in the hole UAH in the named order from the side-surface side of the multilayer body 51.

Figure 38:
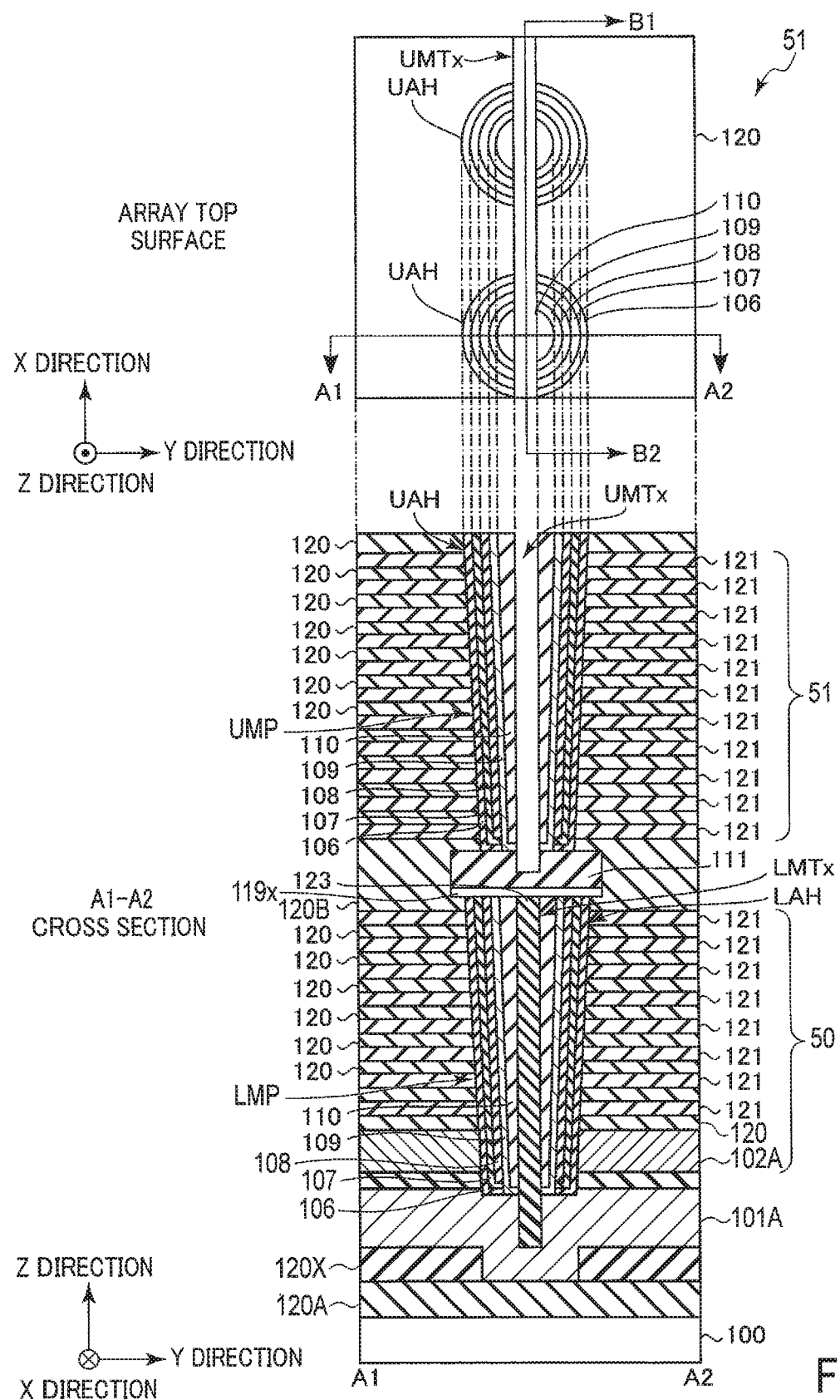

As illustrated in FIG. 38 and FIG. 39, the trench UMTx is formed such that the bottom surface of the memory trench UMT reaches the sacrifice layer 111. The sacrifice layer 111 functions as a stopper layer at a time of forming the trench UMTx.

At this time, by the etching for forming the trench UMTx, the top portion of the insulation layer 123 in the multilayer body 50 is partly etched in the region between the sacrifice layers 111 neighboring in the X direction. Therefore, a recess 80 is formed in an upper portion of the insulation layer 123 of the multilayer body 50.

Figure 40:
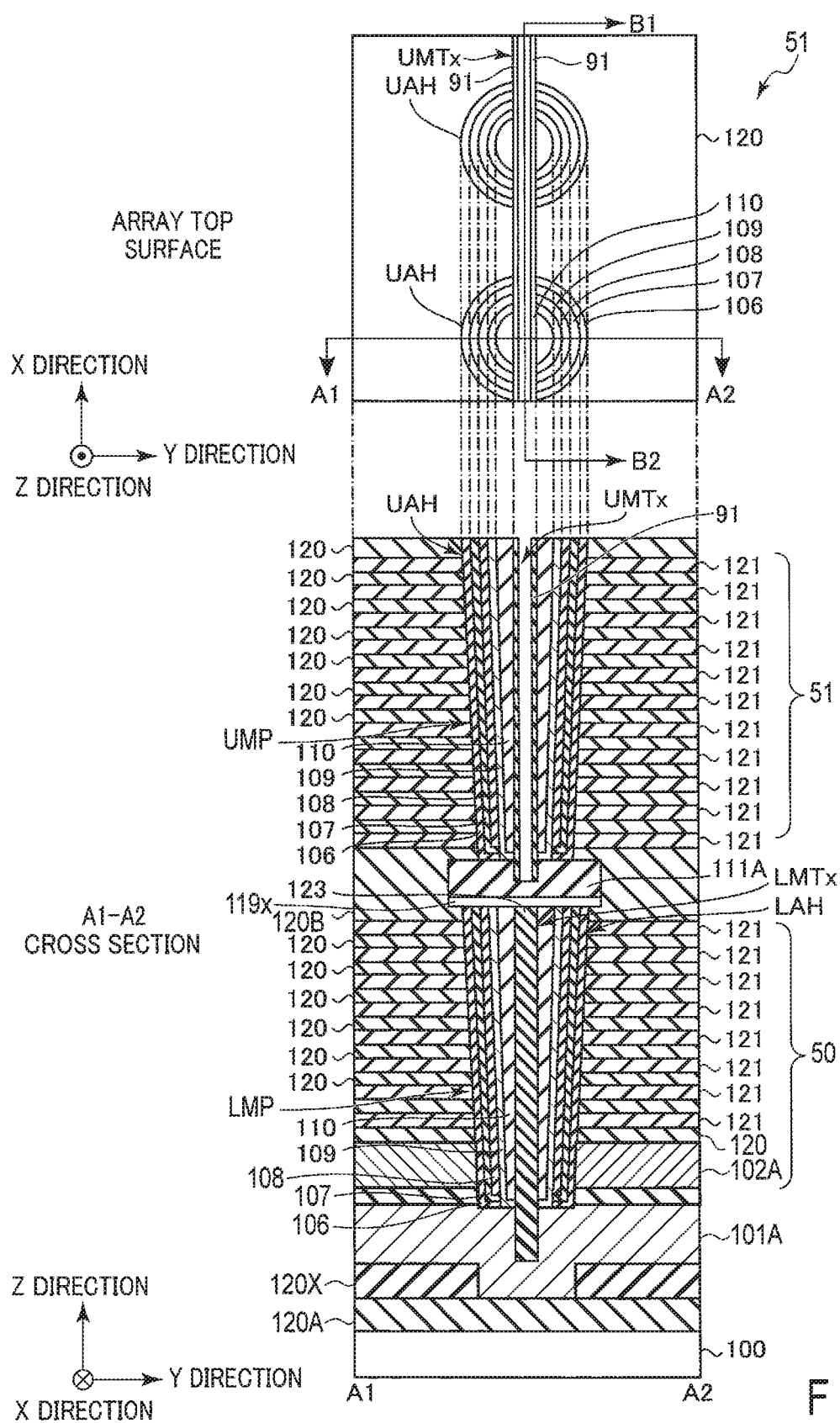
Figure 41:
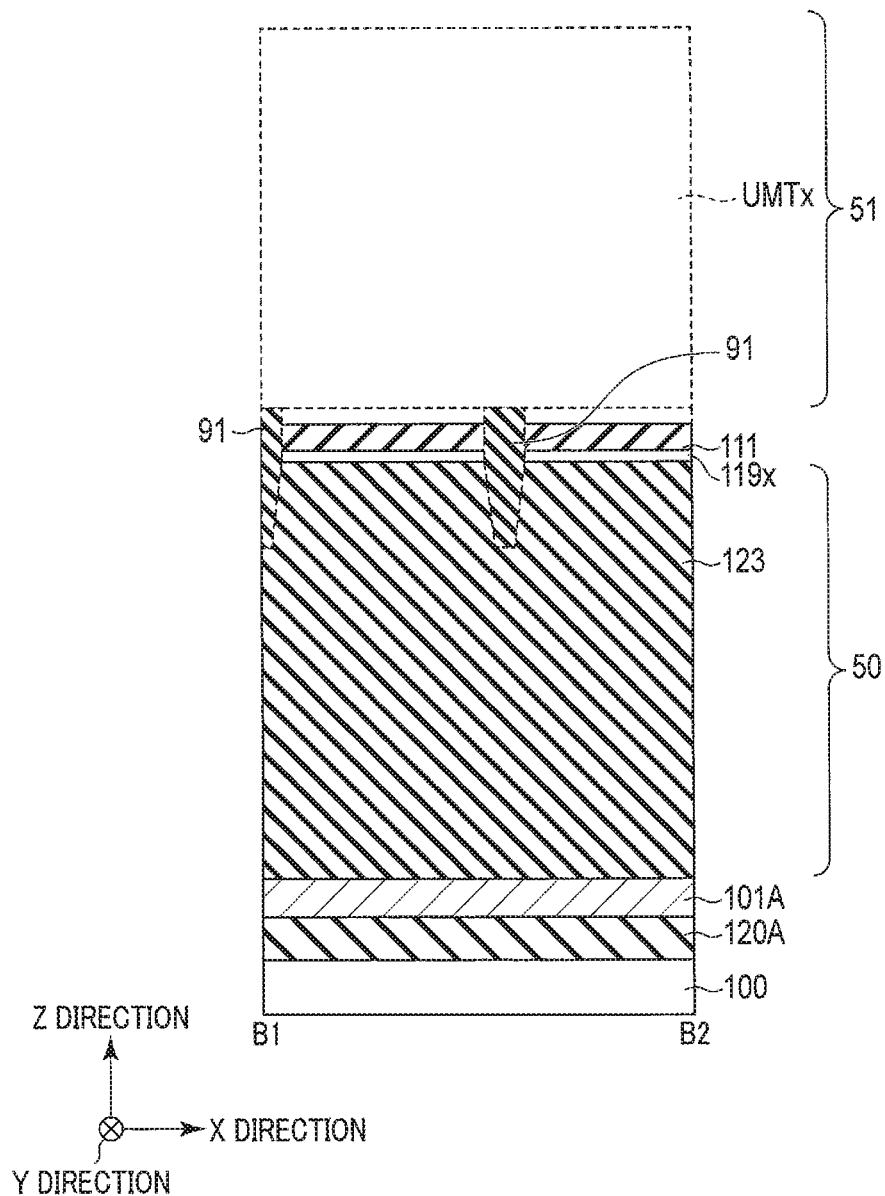

As illustrated in FIG. 40 and FIG. 41, after the trench UMTx is formed, a spacer layer (e.g. an insulation layer) 91 is formed in the trench UMT. The spacer layer 91 covers the respective layers of the memory pillar UMP, which are exposed to the trench UMTx.

At this time, the recess of the multilayer body 50 is buried by the spacer layer 91.

Etch-back on the protection film 91 performed such that the top surface of the sacrifice layer 111 is exposed. Thereby, the protection film 91 is removed from the top surface of the sacrifice layer 111.

Figure 42:
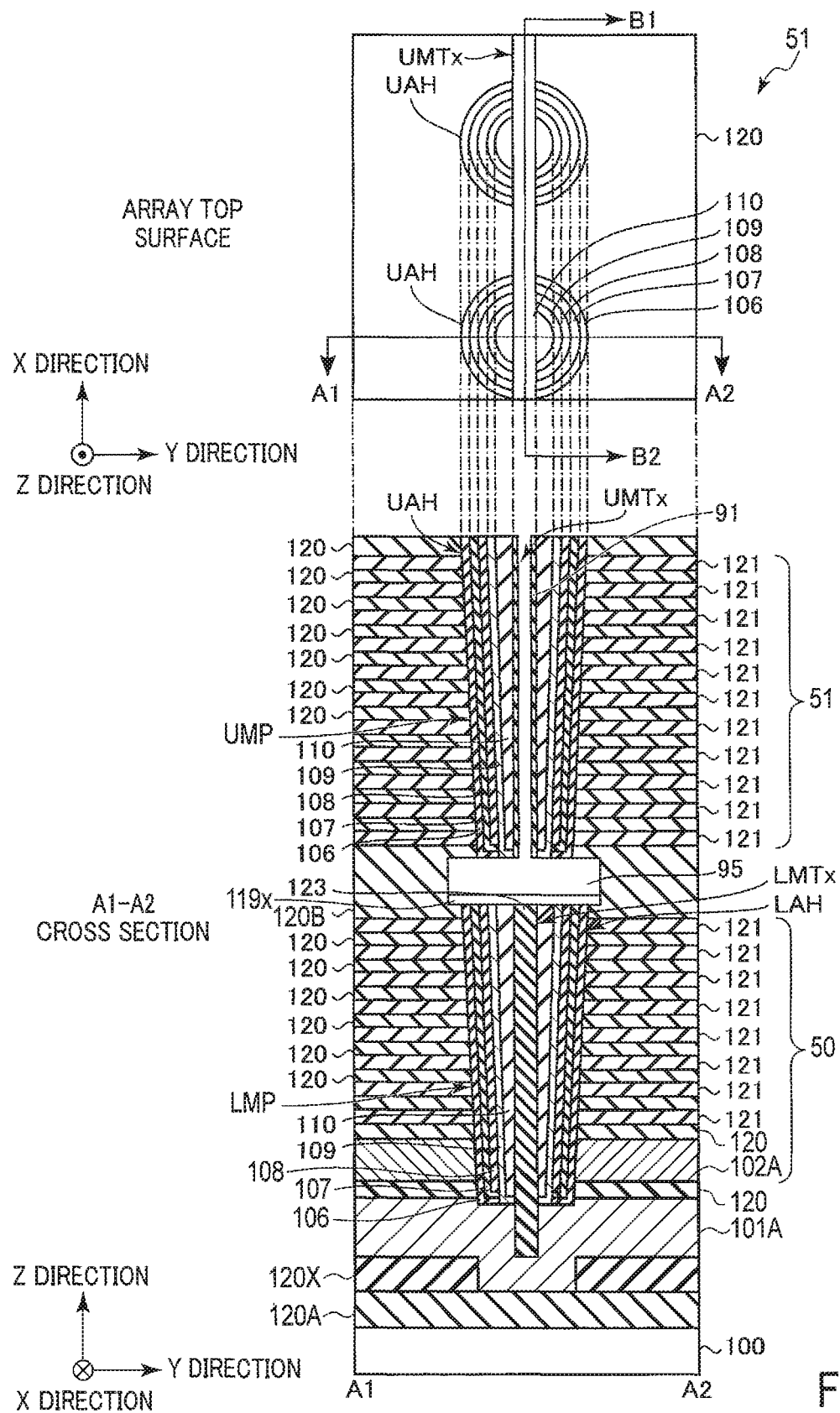
Figure 43:
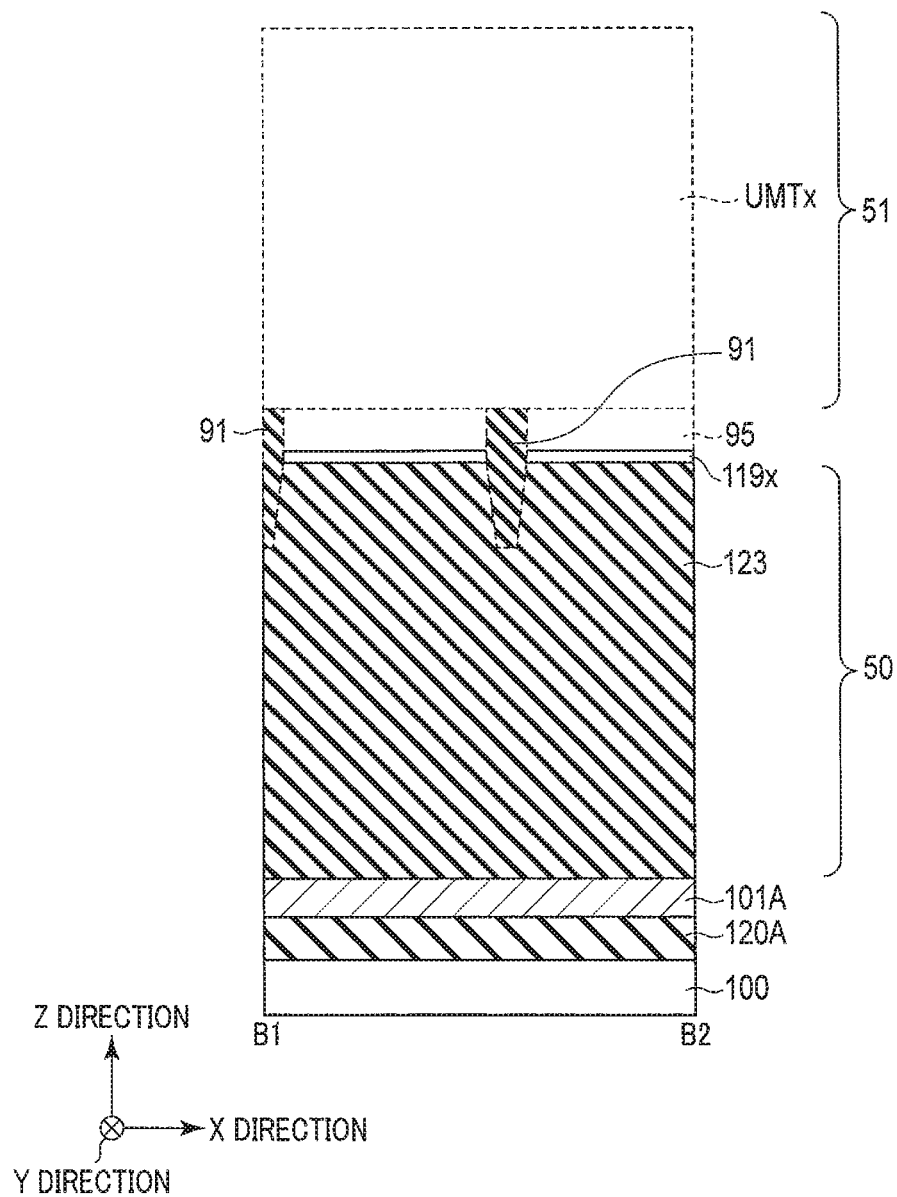

As is illustrated in FIG. 42 and FIG. 43, the sacrifice layer between the stacked memory pillars LMP and UMP is selectively removed by etching via the trench UMTx. Thereby, in the region from which the sacrifice layer was removed, an air gap 95 is formed in the region between the multilayer body 50 and multilayer body 51.

Figure 44:
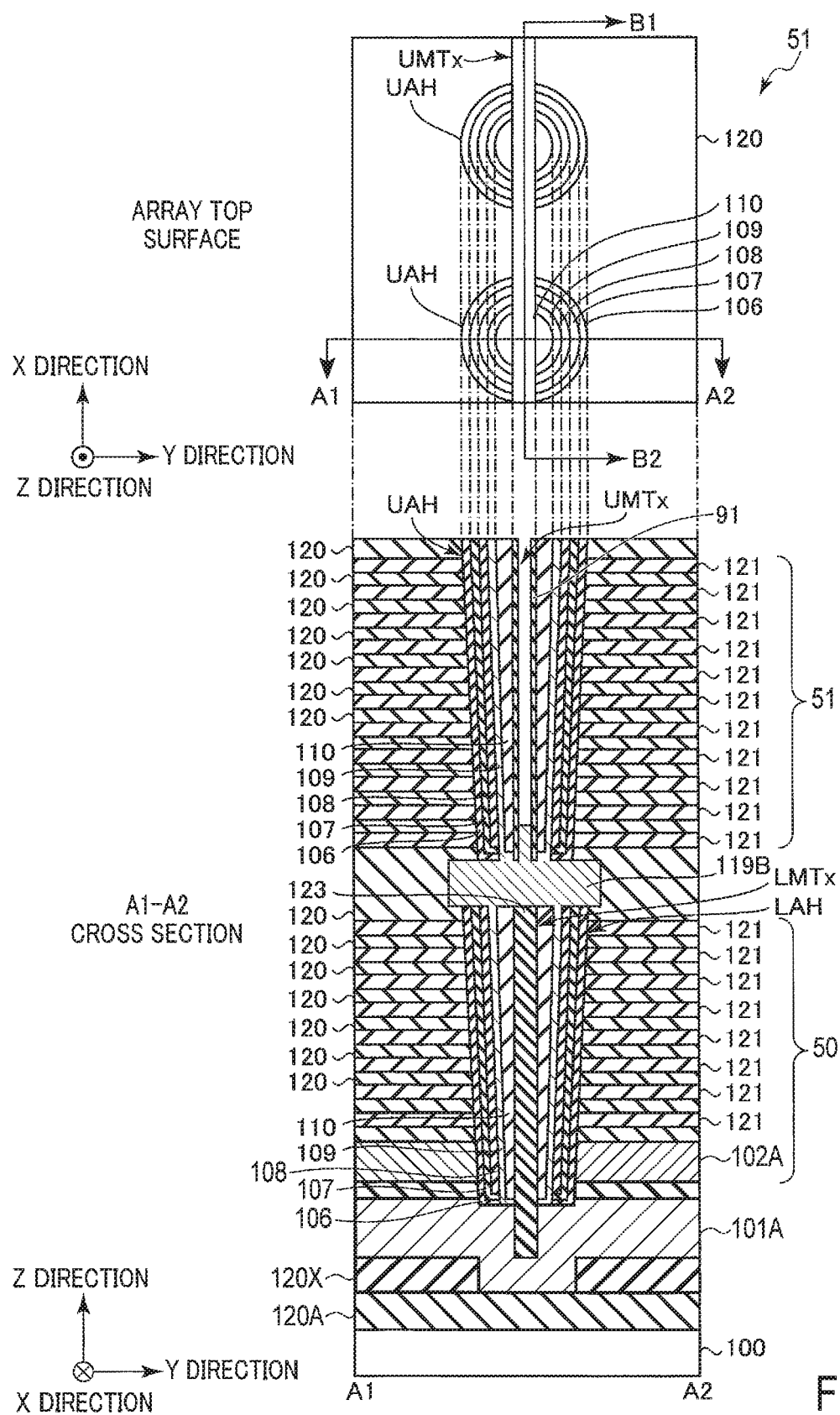
Figure 45:
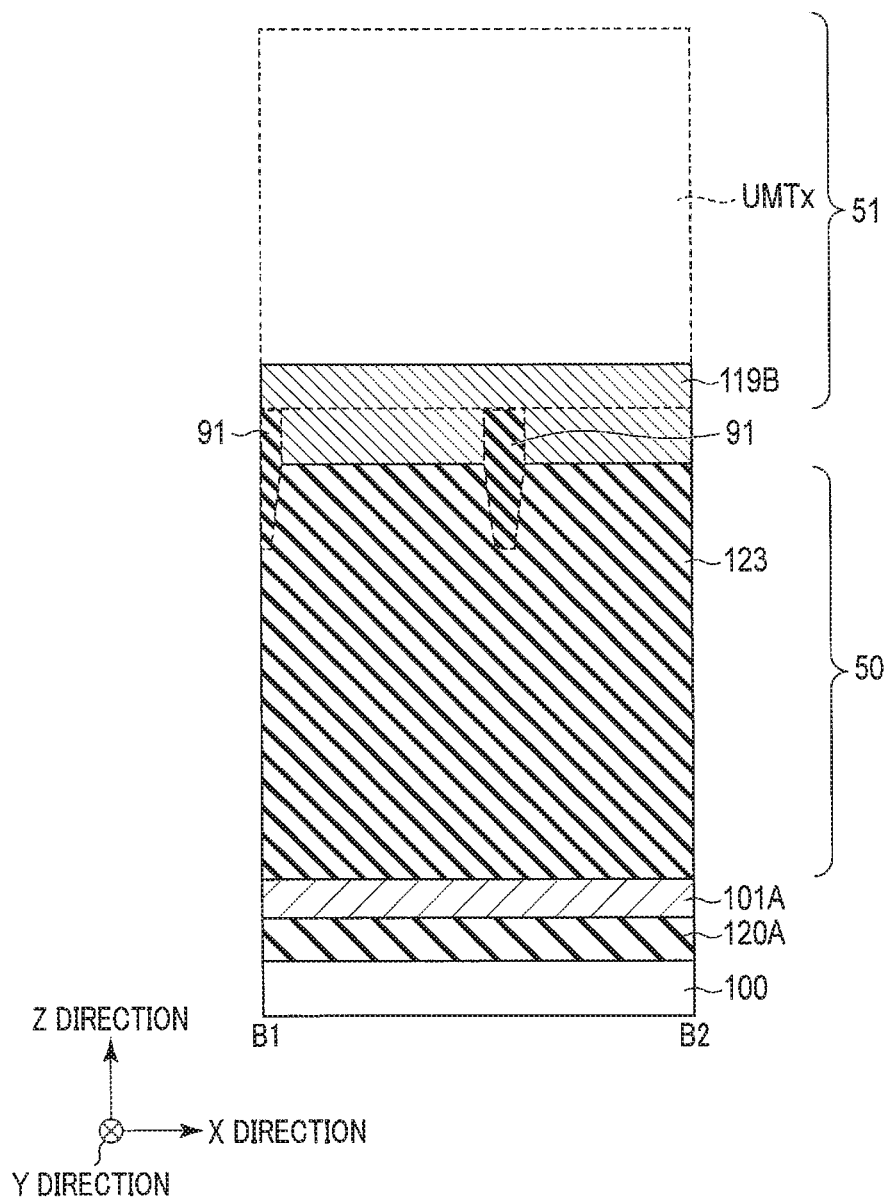

As illustrated in FIG. 44 and FIG. 45, a conductive layer 119B is formed in the air gap 95 by selective CVD. The conductive layer 119B is formed by being grown from the conductive layer 119x and semiconductor layer 109 as starting points. For example, the conductive layer 119B covers the top surface of the insulation layer 91.

Thereafter, etch-back on the conductive layer 119B is performed.

Figure 46:
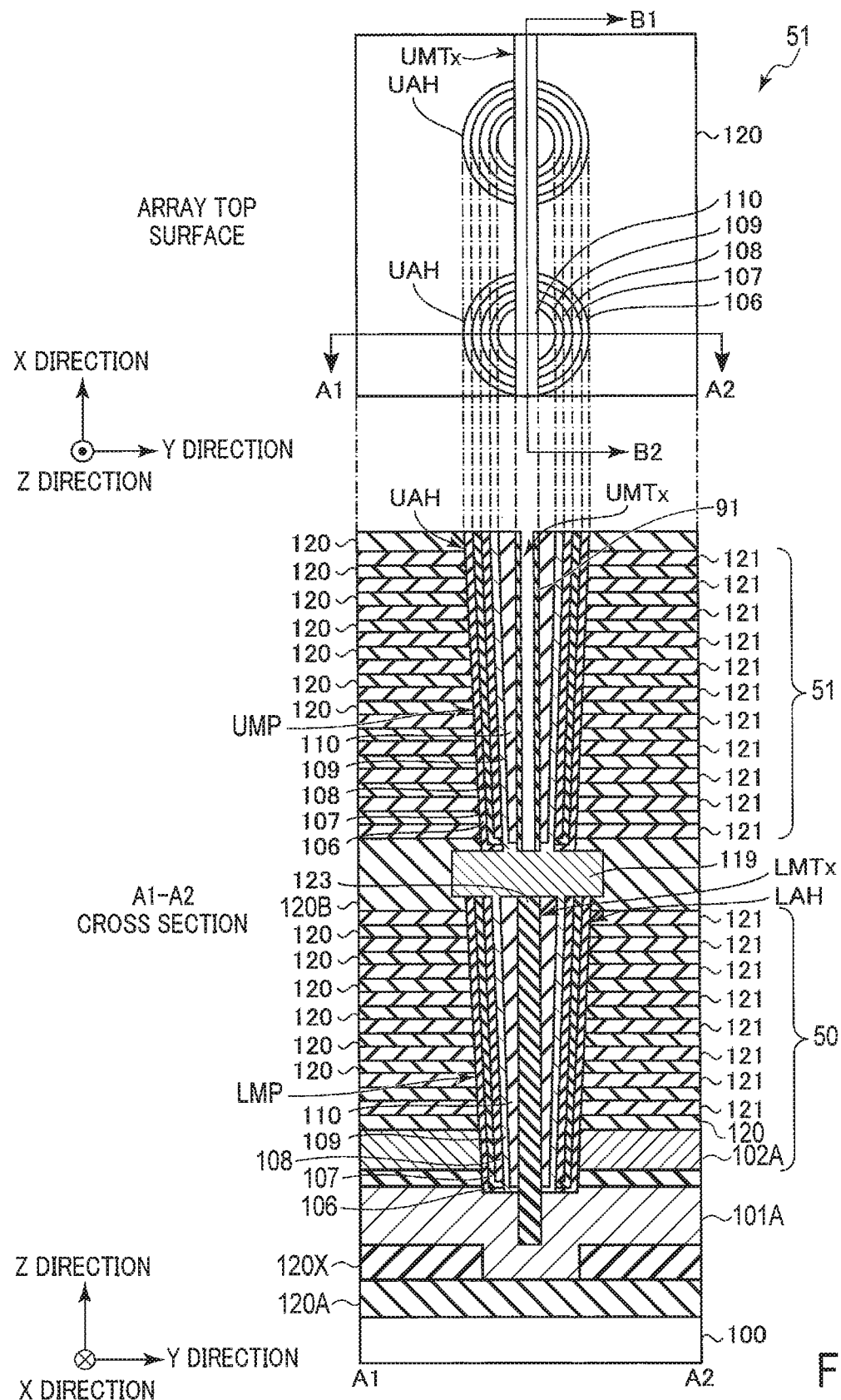
Figure 47:
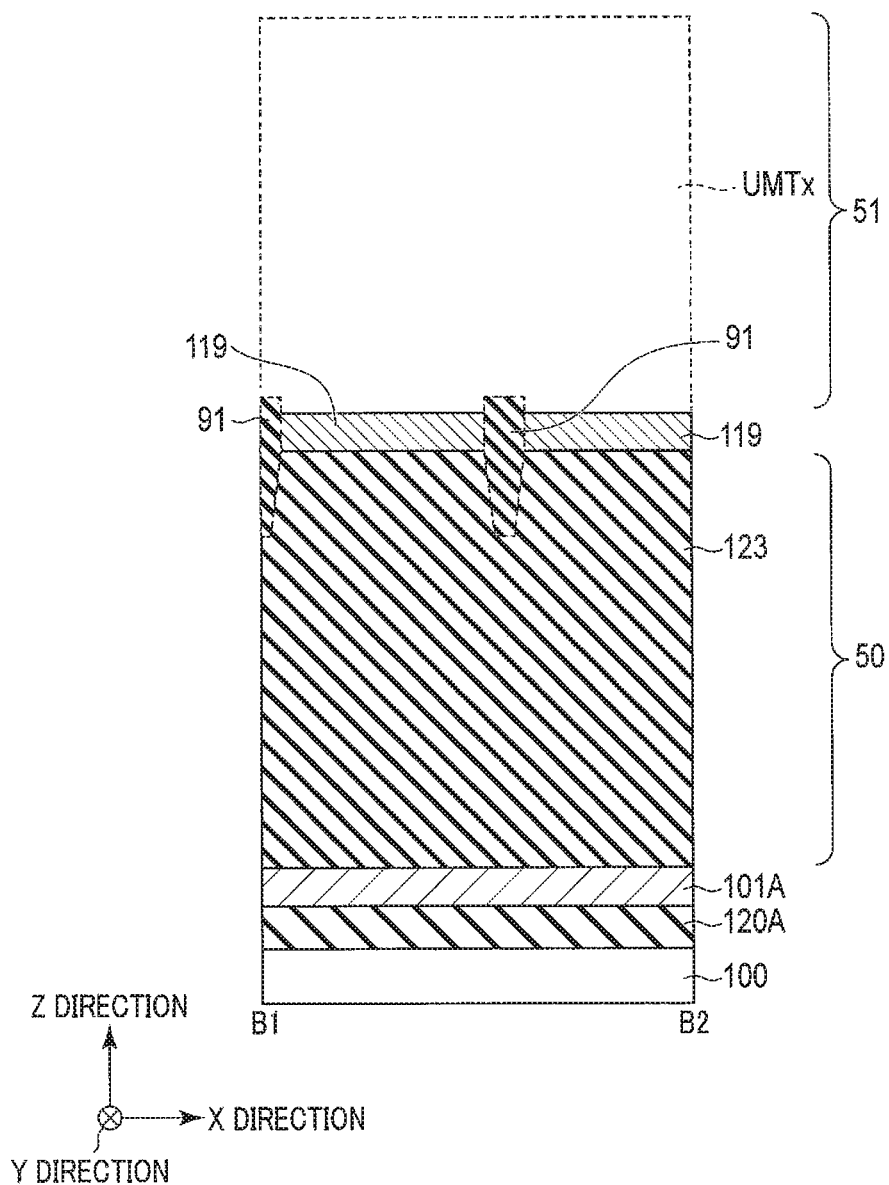

As illustrated in FIG. 46 and FIG. 47, the top surface of the conductive layer 119 is retreated to the substrate 100 side by etch-back.

As a result, the position of the top surface of the conductive layer 119 in the Z direction is set on the substrate side, relative to the position of the top surface of the insulation layer 91 in the Z direction.

By the etch-back on the conductive layer 119, short-circuit between the memory pillars UMP arranged in the X direction can be prevented.

An insulation layer 123 is buried in the trench UMTx. The spacer layer 200 in the trench UMTx may be removed before the insulation layer 123 is formed. However, the spacer layer 200 may be left in the trench UMTx (on the side surface of the memory pillar UMP).

Thereafter, like the first embodiment, the interconnects 102, 103 and 104 are formed in the multilayer body 50, 51 by backfill.

The conductive layer 113 formed on the memory pillar UMP. The contacts and bit lines are successively formed.

By the above fabrication steps, the semiconductor memory of the present embodiment is formed.

As described above, the semiconductor memory of the third embodiment and the manufacturing method thereof have the same advantageous effects as in the first embodiment.

(4) Others

The semiconductor memories of the embodiments and the manufacturing methods thereof are not limited to the structures and fabrication steps described in the first to third embodiments, and various modifications may be made as needed.

For example, in the third embodiment, the removal of the sacrifice layer 111 in the connection region between the lower-layer memory pillar and the upper-layer memory pillar and the formation of the conductive layer 119 may be performed at a timing between the formation of the upper-layer memory hole UMH and the formation of the memory pillar UMP.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory comprising:
   a substrate;
   a first member extending in a first direction perpendicular to a surface of the substrate, and including a first semiconductor layer;
   a first interconnect extending in a second direction parallel to the surface of the substrate;
   a second interconnect extending in the second direction and neighboring the first interconnect in a third direction which crosses the first direction and the second direction and is parallel to the surface of the substrate;
   a first memory cell storing information between the first interconnect and the first member;
   a second memory cell storing information between the second interconnect and the first member;
   a second member extending in the first direction and being provided above the first member in the first direction, the second member including a second semiconductor layer;
   a third interconnect provided above the first interconnect in the first direction, the third interconnect extending in the second direction;
   a fourth interconnect extending in the second direction and neighboring the third interconnect in the third direction;
   a third memory cell storing information between the third interconnect and the second member;
   a fourth memory cell storing information between the fourth interconnect and the second member; and
   a third semiconductor layer provided between the first member and the second member, the third semiconductor layer being continuous with the first semiconductor layer and the second semiconductor layer.

2. The semiconductor memory according to claim 1, wherein the third semiconductor layer includes an air gap.

3. The semiconductor memory according to claim 1, wherein the third semiconductor layer includes a seam.

4. The semiconductor memory according to claim 1, wherein the third semiconductor layer includes a first portion, a second portion, and a third portion provided between the first portion and the second portion in the third direction, and
   a dimension of the first portion in the second direction is greater than a dimension of the third portion in the second direction.

5. The semiconductor memory according to claim 1, wherein a dimension of the third semiconductor layer in the second direction is larger than a dimension of the first member in the second direction.

6. The semiconductor memory according to claim 1, wherein a dimension of the third semiconductor layer in the third direction is larger than a dimension of the first member in the third direction.

7. The semiconductor memory according to claim 1, wherein the first member includes a first core layer provided between the first interconnect and the second interconnect,
the second member includes a second core layer provided between the third interconnect and the fourth interconnect,
a top surface of the first core layer is put in contact with the third semiconductor layer, and
the second semiconductor layer is provided between a bottom surface of the second core layer and the third semiconductor layer.

8. The semiconductor memory according to claim 7, wherein
the first member includes:
a first insulating layer between the first interconnect and the first core layer,
a first charge storage layer between the first interconnect and the first insulating layer,
a second insulating layer between the first interconnect and the first charge storage layer,
a third insulating layer between the second interconnect and the first core layer,
a second charge storage layer between the second interconnect and the third insulating layer, and
a fourth insulating layer between the second interconnect and the second charge storage layer,
the second member includes:
a fifth insulating layer between the third interconnect and the second core layer,
a third charge storage layer between the third interconnect and the fifth insulating layer,
a sixth insulating layer between the third interconnect and the third charge storage layer,
a seventh insulating layer between the fourth interconnect and the second core layer,
a fourth charge storage layer between the fourth interconnect and the seventh insulating layer, and
an eighth insulating layer between the fourth interconnect and the fourth charge storage layer.

9. The semiconductor memory according to claim 1, wherein each of the first member and the second member has a rectangular plan-view shape.

10. The semiconductor memory according to claim 1, wherein each of the first member and the second member has a plan-view shape including an arcuate shape.

11. The semiconductor memory according to claim 1, wherein the third semiconductor layer includes an amorphous layer on the first member, and a crystalline layer on the amorphous layer.

12. The semiconductor memory according to claim 1, further comprising:
a third member extending in the first direction, being adjacent to the first member, and provided between the first interconnect and the second interconnect, the third member including a fourth semiconductor layer;
a fifth memory cell storing information between the first interconnect and the third member;
a sixth memory cell storing information between the second interconnect and the third member;
a fourth member extending in the first direction, provided above the third member, and provided between the third interconnect and the fourth interconnect, the fourth member including a fifth semiconductor layer;
a seventh memory cell storing information between the third interconnect and the fourth member;
an eighth memory cell storing information between the fourth interconnect and the fourth member;
a sixth semiconductor layer provided between the third member and the fourth member, the sixth semiconductor layer being continuous with the fourth semiconductor layer and the fifth semiconductor layer, the sixth semiconductor layer being isolated from the third semiconductor layer;
a first insulator provided between the first member and the third member; and
a second insulator provided between the second member and the fourth member.

13. The semiconductor memory according to claim 12, wherein the first member includes a first core layer provided between the first interconnect and the second interconnect,
the second member includes a second core layer provided between the third interconnect and the fourth interconnect,
the third member includes a third core layer provided between the first interconnect and the second interconnect,
the fourth member includes a fourth core layer provided between the third interconnect and the fourth interconnect,
the first core layer and the third core layer are contact with the first insulator in the second direction, and
the second core layer and the fourth core layer are contact with the second insulator in the second direction.

14. The semiconductor memory according to claim 12, wherein the first member includes a first core layer provided between the first interconnect and the second interconnect,
the second member includes a second core layer provided between the third interconnect and the fourth interconnect,
the third member includes a third core layer provided between the first interconnect and the second interconnect,
the fourth member includes a fourth core layer provided between the third interconnect and the fourth interconnect,
the first core layer is connected to the third core layer through a first groove in the first insulator, and
the second core layer is connected to the fourth core layer through a second groove in the second insulator.

15. The semiconductor memory according to claim 1, wherein at least one of the third semiconductor layer and the sixth semiconductor layer includes an air gap.

16. The semiconductor memory according to claim 1, wherein at least one of the third semiconductor layer and the sixth semiconductor layer include includes a seam.

17. The semiconductor memory according to claim 1, wherein at least one of the third semiconductor layer and the sixth semiconductor layer includes a first portion, a second portion, and a third portion provided between the first portion and the second portion in the third direction, and
a dimension of the first portion in the second direction is greater than a dimension of the third portion in the second direction.

18. The semiconductor memory according to claim 1, wherein at least one of the first member, the second member, the second member, and the fourth member has a rectangular plan-view shape.

19. The semiconductor memory according to claim 1, wherein at least one of the first member, the second member, the second member, and the fourth member has a plan-view shape including an arcuate shape.

20. The semiconductor memory according to claim 1, wherein a third semiconductor layer is seamlessly connected to at least one of the first semiconductor layer and the second semiconductor layer.

* * * * *